US009538675B2

United States Patent
Le Gette et al.

(10) Patent No.: US 9,538,675 B2
(45) Date of Patent: *Jan. 3, 2017

(54) HOLDER FOR ELECTRONIC DEVICE WITH SUPPORT

(71) Applicant: Zero Chroma, LLC, Sykesville, MD (US)

(72) Inventors: Brian E. Le Gette, Severna Park, MD (US); David Reeb, Sykesville, MD (US)

(73) Assignee: ZERO CHROMA, LLC., Sykesville, MD (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/627,848

(22) Filed: Feb. 20, 2015

(65) Prior Publication Data
US 2015/0163936 A1  Jun. 11, 2015

Related U.S. Application Data

(63) Continuation of application No. 13/345,345, filed on Jan. 6, 2012, now Pat. No. 8,960,634, which is a
(Continued)

(51) Int. Cl.
*A47B 97/04* (2006.01)
*H05K 5/03* (2006.01)
(Continued)

(52) U.S. Cl.
CPC ............ *H05K 5/03* (2013.01); *B65H 75/4476* (2013.01); *F16M 11/04* (2013.01); *F16M 11/041* (2013.01);
(Continued)

(58) Field of Classification Search
CPC ..... F16M 11/00; F16M 11/10; F16M 11/2021; F16M 13/04; H05K 5/03; A45F 5/02; A45F 2200/0516
See application file for complete search history.

(56) References Cited

U.S. PATENT DOCUMENTS

| 730,261 A | 6/1903 | Hartely |
| 908,170 A | 12/1908 | Van Der Boom |
(Continued)

FOREIGN PATENT DOCUMENTS

| JP | 2002-341966 | 11/2002 |
| KR | 10-2008-0000102 | 1/2008 |
(Continued)

OTHER PUBLICATIONS

Office Action dated Jul. 29, 2014 issued in corresponding U.S. Appl. No. 13/745,693.
(Continued)

*Primary Examiner* — Amy Sterling
(74) *Attorney, Agent, or Firm* — Oblon, McClelland, Maier & Neustadt, L.L.P.

(57) ABSTRACT

Cases or holders for cell phones, personal digital assistants, portable video/music players, electronic books, electronic tablets and other handheld and/or free-standing display devices, as well as the devices themselves are disclosed. In different embodiments, a versatile protective holder that can allow placement on any surface for hands-free viewing, with full adjustment of viewing angle in landscape and/or portrait orientations; directional sound reflecting and baffling; easier cleaning and viewing of the device's screen; easier grasping by the user; wearing of the device using a belt clip or arm or waist band; as well as attachment to an automobile, bicycle, or other vehicle are disclosed.

25 Claims, 73 Drawing Sheets

Related U.S. Application Data continuation-in-part of application No. PCT/US2011/031918, filed on Apr. 11, 2011, which is a continuation-in-part of application No. 12/758,377, filed on Apr. 12, 2010, now Pat. No. 8,382,059, which is a continuation-in-part of application No. 12/556,182, filed on Sep. 9, 2009, now abandoned.

(60) Provisional application No. 61/191,454, filed on Sep. 9, 2008.

(51) Int. Cl.

| | | |
|---|---|---|
| *F16M 11/04* | (2006.01) | |
| *F16M 11/10* | (2006.01) | |
| *F16M 13/00* | (2006.01) | |
| *F16M 13/04* | (2006.01) | |
| *B65H 75/44* | (2006.01) | |
| *H05K 5/02* | (2006.01) | |
| *A45F 5/02* | (2006.01) | |

(52) U.S. Cl.
CPC ............ *F16M 11/10* (2013.01); *F16M 11/105* (2013.01); *F16M 13/00* (2013.01); *F16M 13/04* (2013.01); *H05K 5/0234* (2013.01); *A45F 5/02* (2013.01); *A45F 2200/0516* (2013.01); *B65H 2701/3919* (2013.01)

(56) References Cited

U.S. PATENT DOCUMENTS

| | | | |
|---|---|---|---|
| 943,367 | A | 12/1909 | Oldenbusch |
| 1,001,403 | A | 8/1911 | Hipwell et al. |
| 1,359,662 | A | 11/1920 | Blyth |
| 2,007,535 | A | 8/1934 | Kapnek |
| 1,993,947 | A | 3/1935 | Rosenberg et al. |
| D128,172 | S | 4/1941 | Morgan |
| 2,456,720 | A | 12/1948 | Miles |
| 2,459,576 | A | 1/1949 | Nichols |
| 4,001,893 | A | 1/1977 | Yamamoto |
| 4,299,344 | A | 11/1981 | Yamashita et al. |
| D290,555 | S | 6/1987 | Beaupre |
| 4,878,237 | A | 10/1989 | Cianflone |
| D307,677 | S | 5/1990 | Tontarelli |
| 5,253,292 | A | 10/1993 | Fluder et al. |
| 5,329,712 | A | 7/1994 | Keller |
| 5,366,197 | A | 11/1994 | Westland |
| 5,383,091 | A | 1/1995 | Snell |
| 5,517,683 | A | 5/1996 | Collett et al. |
| 5,682,182 | A | 10/1997 | Tsubosaka |
| 5,711,013 | A | 1/1998 | Collett et al. |
| 5,732,928 | A | 3/1998 | Chang |
| 5,746,410 | A | 5/1998 | Hung |
| 5,778,062 | A | 7/1998 | Vanmoor |
| 5,933,996 | A | 8/1999 | Chang |
| 6,491,194 | B2 | 12/2002 | Marvin |
| 6,651,943 | B2 | 11/2003 | Cho et al. |
| 6,665,550 | B1 | 12/2003 | Muller |
| 6,729,518 | B2 | 5/2004 | Badillo et al. |
| 6,971,622 | B2 | 12/2005 | Ziegler et al. |
| 7,001,088 | B2 | 2/2006 | Hui-hu |
| 7,042,713 | B2 | 5/2006 | Nicolosi |
| 7,092,680 | B2 | 8/2006 | Lee et al. |
| 7,104,516 | B2 | 9/2006 | Uto et al. |
| 7,107,084 | B2 | 9/2006 | Duarte et al. |
| 7,149,080 | B2 | 12/2006 | Jackson, Jr. |
| 7,172,067 | B2 | 2/2007 | Gruetzmacher et al. |
| 7,197,140 | B2 | 3/2007 | Asaro |
| 7,197,346 | B2 | 3/2007 | Eromaki et al. |
| 7,203,533 | B1 | 4/2007 | Tischler |
| 7,232,098 | B2 | 6/2007 | Rawlings et al. |
| D564,754 | S | 3/2008 | Tages et al. |
| 7,363,068 | B2 | 4/2008 | Ku |
| 7,366,314 | B2 | 4/2008 | Corley et al. |
| 7,369,882 | B2 | 5/2008 | Hwang et al. |
| 7,391,606 | B2 | 6/2008 | Chen et al. |
| 7,415,108 | B2 | 8/2008 | Toh |
| 7,422,379 | B2 | 9/2008 | Agevik et al. |
| 7,449,650 | B2 | 11/2008 | Richardson et al. |
| D582,149 | S | 12/2008 | Tan |
| D594,225 | S | 6/2009 | Leung et al. |
| 7,546,153 | B2 | 6/2009 | Kang |
| 7,566,877 | B2 | 7/2009 | Bhatt |
| D597,321 | S | 8/2009 | Frankel et al. |
| D602,259 | S | 10/2009 | Finnegan |
| D609,018 | S | 2/2010 | Tzeng et al. |
| D613,510 | S | 4/2010 | Tzeng et al. |
| 7,702,297 | B2 | 4/2010 | Wu |
| 7,735,644 | B2 | 6/2010 | Sirichai et al. |
| 7,744,055 | B2 | 6/2010 | Zeng et al. |
| 7,770,864 | B2 | 8/2010 | Phifer et al. |
| 7,836,623 | B2 | 11/2010 | Wang et al. |
| 7,975,970 | B2 | 7/2011 | Hu |
| 7,986,515 | B2 | 7/2011 | Numata et al. |
| 8,023,256 | B2 | 9/2011 | Walker et al. |
| 8,118,274 | B2 | 2/2012 | McClure |
| 8,152,113 | B2 | 4/2012 | Chen et al. |
| 8,162,283 | B1 | 4/2012 | Royz et al. |
| D675,014 | S | 1/2013 | Adelman et al. |
| 8,382,059 | B2 | 2/2013 | Le Gette et al. |
| 2003/0236102 | A1 | 12/2003 | Kawai et al. |
| 2004/0233631 | A1 | 11/2004 | Lord |
| 2004/0259602 | A1 | 12/2004 | Zack |
| 2005/0264988 | A1 | 12/2005 | Nicolosi |
| 2006/0049327 | A1* | 3/2006 | Chen ..................... F16M 11/00 248/371 |
| 2006/0194625 | A1 | 8/2006 | Davis et al. |
| 2007/0023559 | A1 | 2/2007 | Scapillato et al. |
| 2007/0062089 | A1 | 3/2007 | Homer et al. |
| 2007/0184781 | A1 | 8/2007 | Huskinson |
| 2008/0006745 | A1 | 1/2008 | Chong et al. |
| 2008/0035823 | A1 | 2/2008 | Rossini |
| 2008/0096620 | A1 | 4/2008 | Lee et al. |
| 2008/0156836 | A1 | 7/2008 | Wadsworth et al. |
| 2009/0017883 | A1 | 1/2009 | Lin |
| 2009/0057053 | A1 | 3/2009 | Hsieh et al. |
| 2010/0072334 | A1 | 3/2010 | Le Gette et al. |
| 2011/0025176 | A1 | 2/2011 | McClure et al. |
| 2012/0199501 | A1 | 8/2012 | Le Gette et al. |
| 2012/0275094 | A1 | 11/2012 | Zhou et al. |
| 2013/0134291 | A1 | 5/2013 | Le Gette et al. |

FOREIGN PATENT DOCUMENTS

| | | |
|---|---|---|
| KR | 10-2008-0023562 | 3/2008 |
| KR | 10-2008-0037399 | 4/2008 |
| WO | 2010/030663 A3 | 3/2010 |
| WO | 2011/130157 A3 | 10/2011 |

OTHER PUBLICATIONS

U.S. Appl. No. 29/435,155, filed Oct. 19, 2012, Le Gette et al.
U.S. Appl. No. 13/745,693, filed Jan. 18, 2013, Le Gette et al.
Office Action dispatched Aug. 7, 2012 in Korean Patent Application No. 10-2011-7007415.
Korean Office Action issued Nov. 1, 2012, in Korean Application No. 200980119922.1, and English translation.
Restriction Requirement dated Jan. 6, 2012, in U.S. Appl. No. 12/556,182.
Restriction Requirement dated Jul. 12, 2012, in U.S. Appl. No. 12/758,377.
Non-Final Office Action dated Aug. 13, 2012, in U.S. Appl. No. 12/556,182.
Non-Final Office Action dated Sep. 5, 2012, in U.S. Appl. No. 12/758,377.
International Preliminary Report on Patentability for PCT/US209/056358 dated Mar. 24, 2011.
International Search Report and Written Opinion for PCT/US2011/031918 dated Oct. 26, 2011.

(56) References Cited

OTHER PUBLICATIONS

"Speck See Thru Hard Shell Case and Holster for iPhone 1G," http://www.covercase.com/iphone/speck-seethru-hard-shell-case-and-holster-for-iph . . . , 2 pages, Printed Dec. 7, 2010.
"Leather Protective Snap-On Back Cover Case," http://www.igearusa.com/leprsnbacocoa2.html, 3 pages, Printed Dec. 7, 2010.
"Gorillamobile for iPod touch," http://jobv.com/store/gorillamobiel/touch, e pages, Printed Dec. 7, 2010.
"Scosche—The Necessary Accessory," http://www.scosche.com/products/sfID1/210/sfID2/21/productID/1629, 2 pages, Printed Dec. 7, 2010.
"SportShell Convertible for iPad," http://www.marware.com/products/iPad/SportShell-Convertible-for-iPad, 2 pages, Printed Dec. 7, 2010.
"Convertible Book Jacket for iPad," http://www.goincase.com/products/detail/cl57512R/6, 6 pages, Printed Dec. 7, 2010.
"Apple iPad Case," http://store.apple.com/us/product/MC361ZM/B?fnode+MTcOMjU@mjc&mco+MTc0Njk4ODM, 3 pages, Printed Dec. 7, 2010.
"Business Leather Padfolio case with Kickstand for Apple iPad (Blue)," http://www.hdaccessory.com/serlet/the-3373/Applie-iPad-W-dsh-Fi-WiFi/Detail, 3 pages, Printed Dec. 7, 2010.
"CaseCrown Canvas Vertical Flip Stand Case (Silver) for the Apple iPad WiFi/3G Model 16 GB, 32GB, 64GB," http://www.info4ipone,com/casecrown-canvas-vetical-flip-stand-case-silver-for-the-apple-ipad . . . 3 pages, Printed Dec. 7, 2010.
"Seat Buddy," http://www.theseatbuddv.com/, 1 page, Printed Dec. 7, 2010.
"Bandshell iPhone Case," http://www.bandshellcase.com/, 1 page, Printed Dec. 7, 2010.
"iChair, an Apple iPad Case that doubles as a Stand," www.technzene.com/gadgets/apple-ipad-case-ichair/ 5 pages, Posted Feb. 6, 2011, Printed Apr. 4, 2011.
"Macworld 2011 iPad Case and Stand Roundup," www.apple-iphone.net/uncateracterized/macworld-2011-ipad-case-and-stand-roundup.html, 11 pages, Posted Feb. 3, 2011, Printed Apr. 4, 2011.
Joby's iPad Case and stand Folds Like and Origami Puzzle, www.wired.com/gadgetlab/2011/01/jobys-ipad-case-and-stand-folds-like-and-origami-puzzle/, 6 pages, dated Jan. 4, 2011, Printed Apr. 4, 2011.
"The Handstand: An iPad Case . . . For Your Hand!," http://techcrunch.com/2010/12/22/the-handstand-an-ipad-case-for-your-hand/, 2 pages, dated Dec. 22, 2010, Printed Apr. 4, 2011.
"Belkin Grip 360° + Stand for iPad," www.belkin.com/IWCatProductPages.process?Product_ID=525954, 3 pages, Printed Apr. 4, 2011.
"Apple Planning Its Own IPad Stand/Case?," www.mactech.com/2011/02/03/apple-planning-its-own-ipad-standcase%E2%80%A8, 3 pages, Printed Apr. 4, 2011.
Nonfinal Office Action dated Feb. 25, 2013, in U.S. Appl. No. 29/435,155.

* cited by examiner

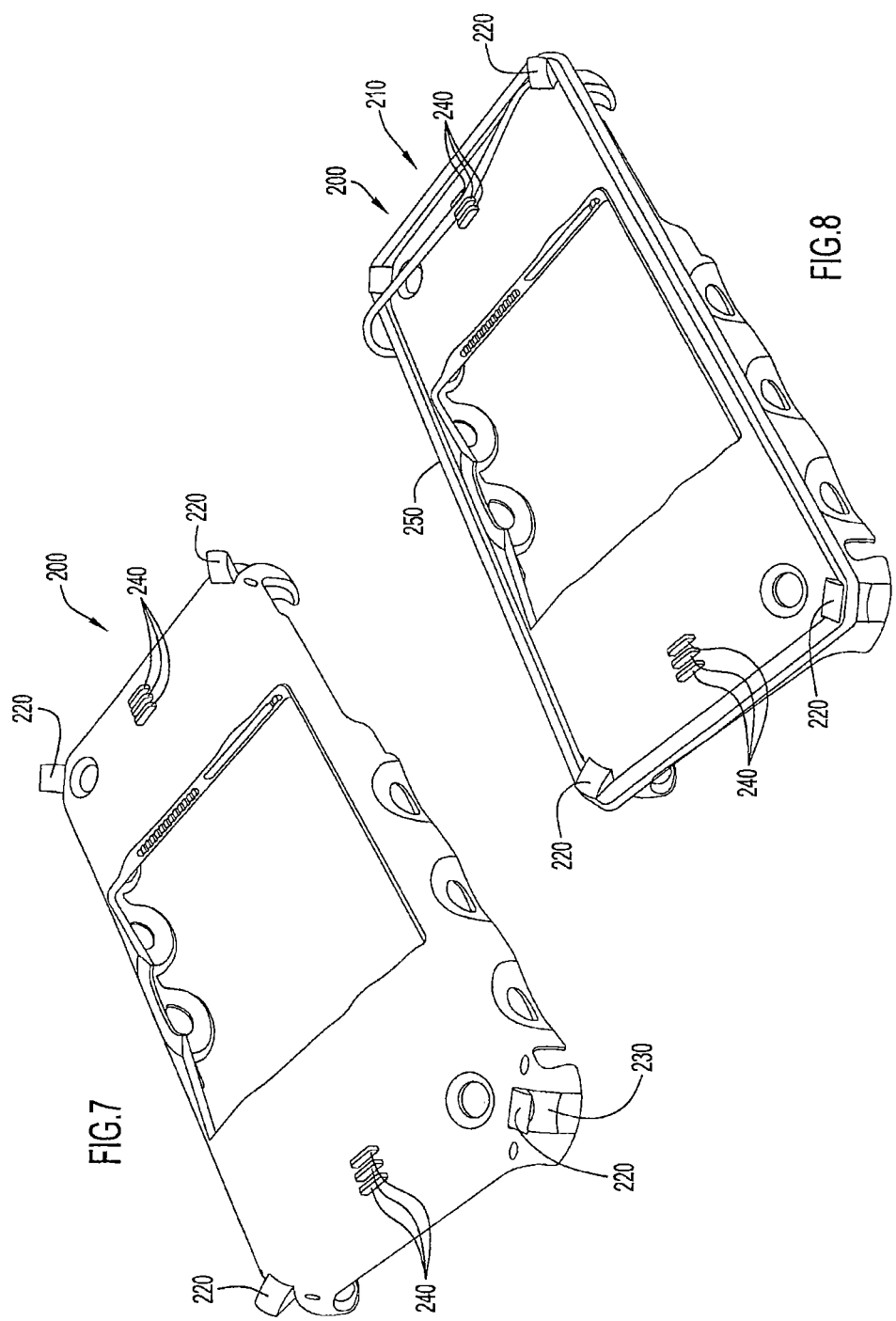

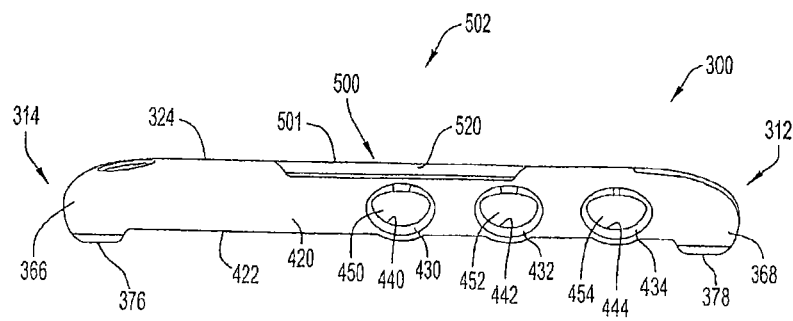
FIG.14
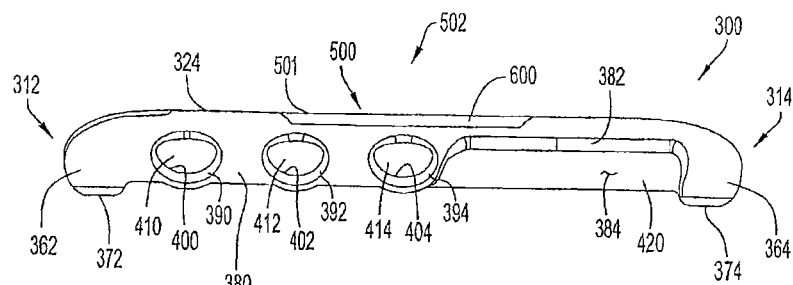
FIG.15
FIG.16

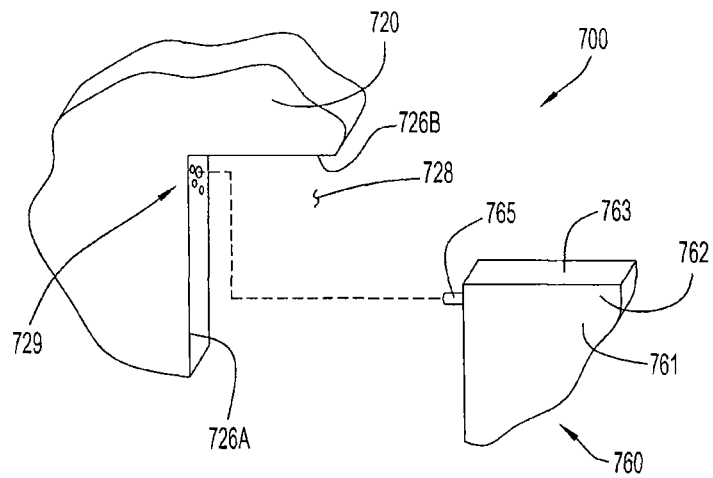
FIG.30A
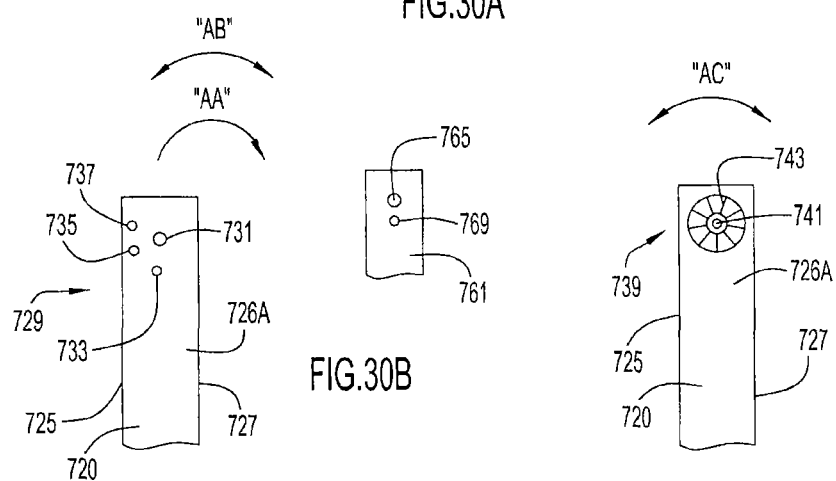
FIG.30B
FIG.30C
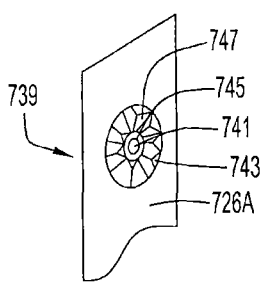
FIG.30D

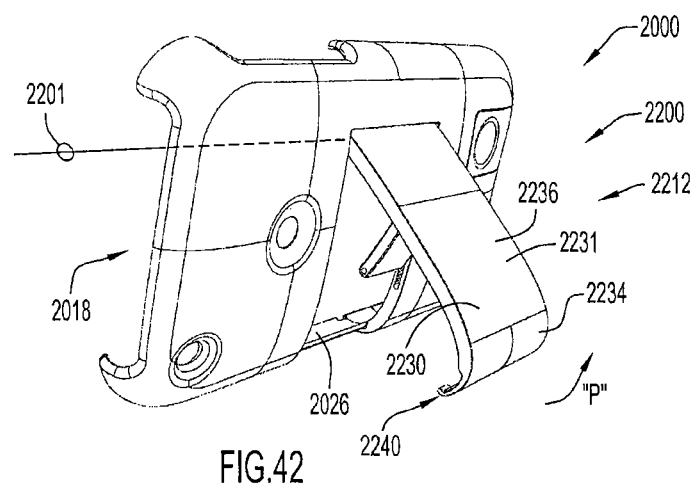
FIG.42
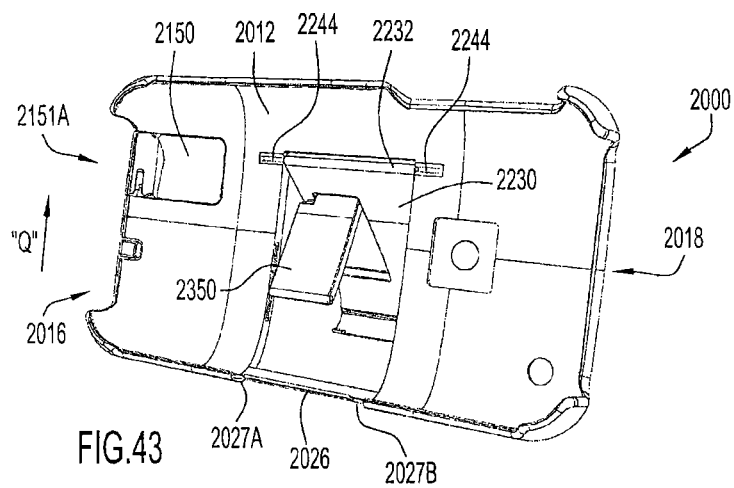
FIG.43
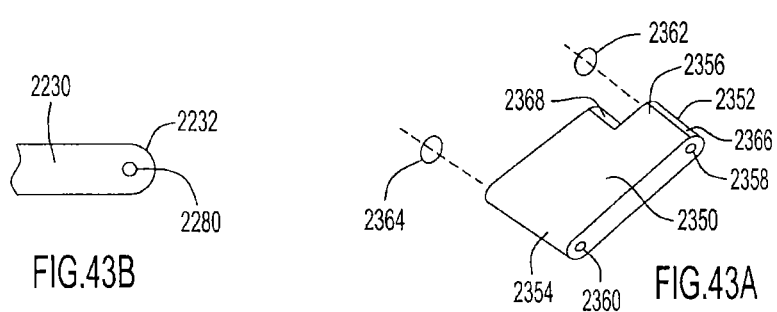
FIG.43B                    FIG.43A

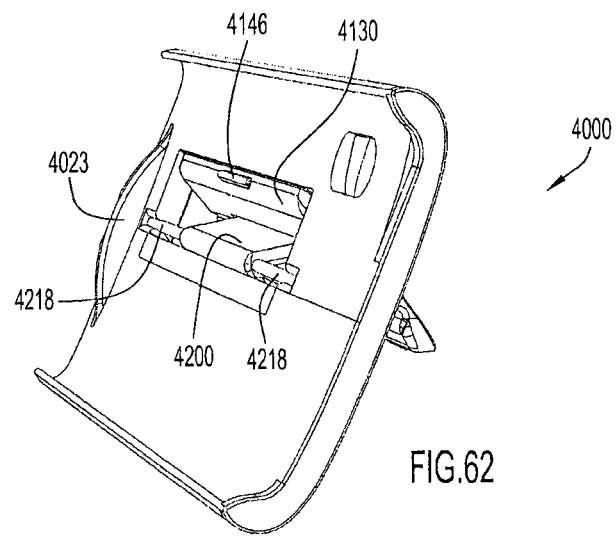
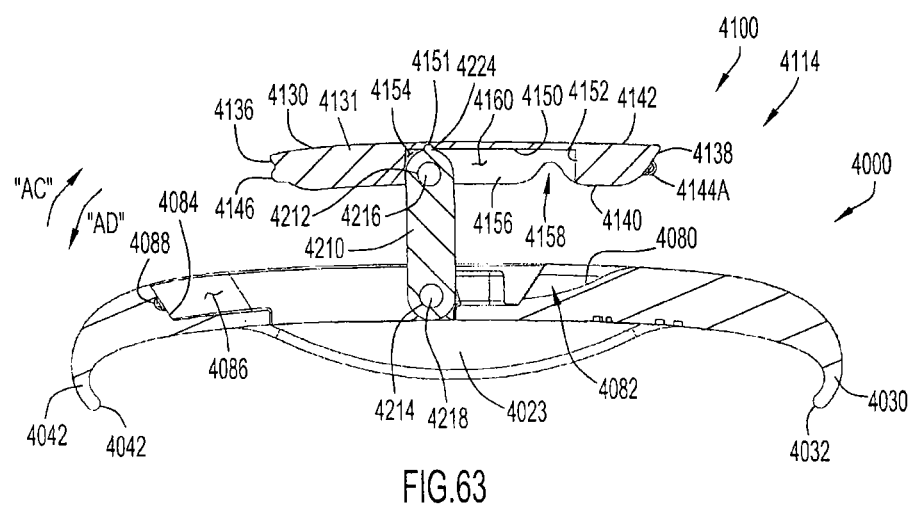

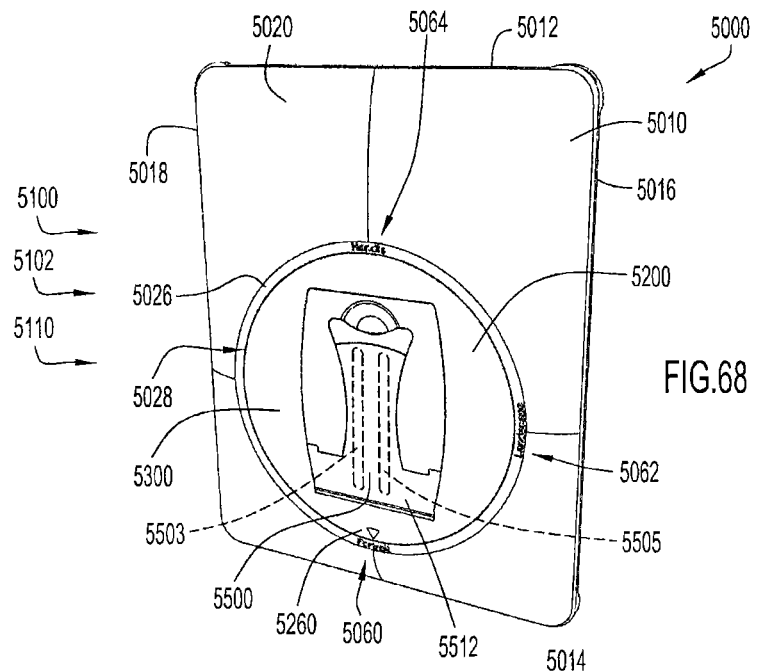
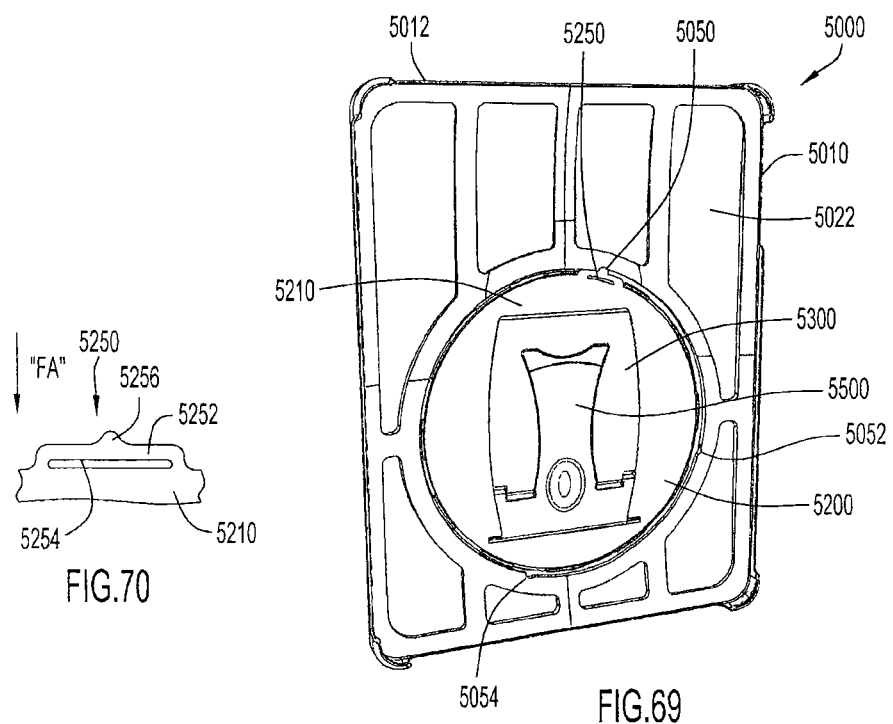
FIG.68
FIG.70
FIG.69

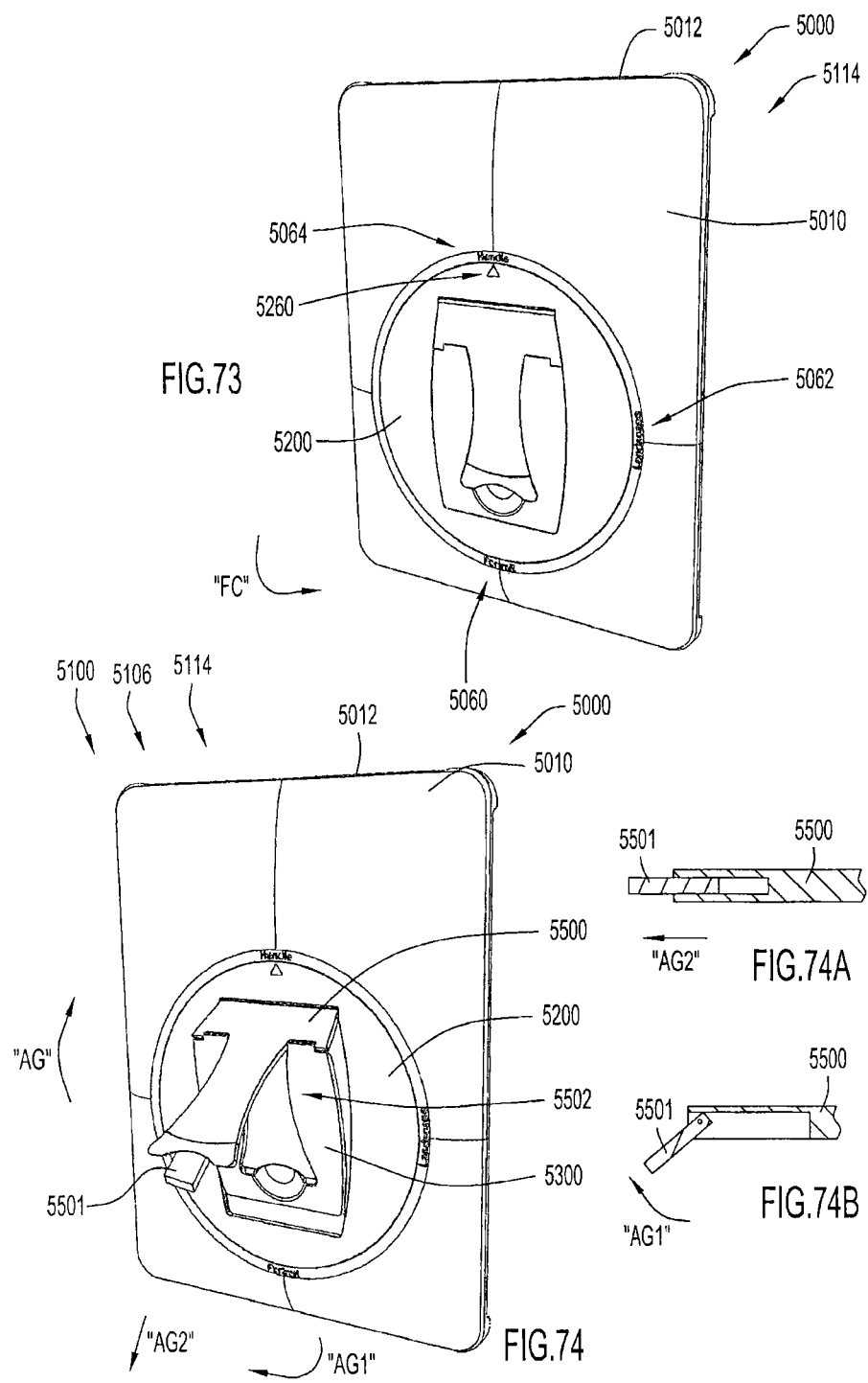

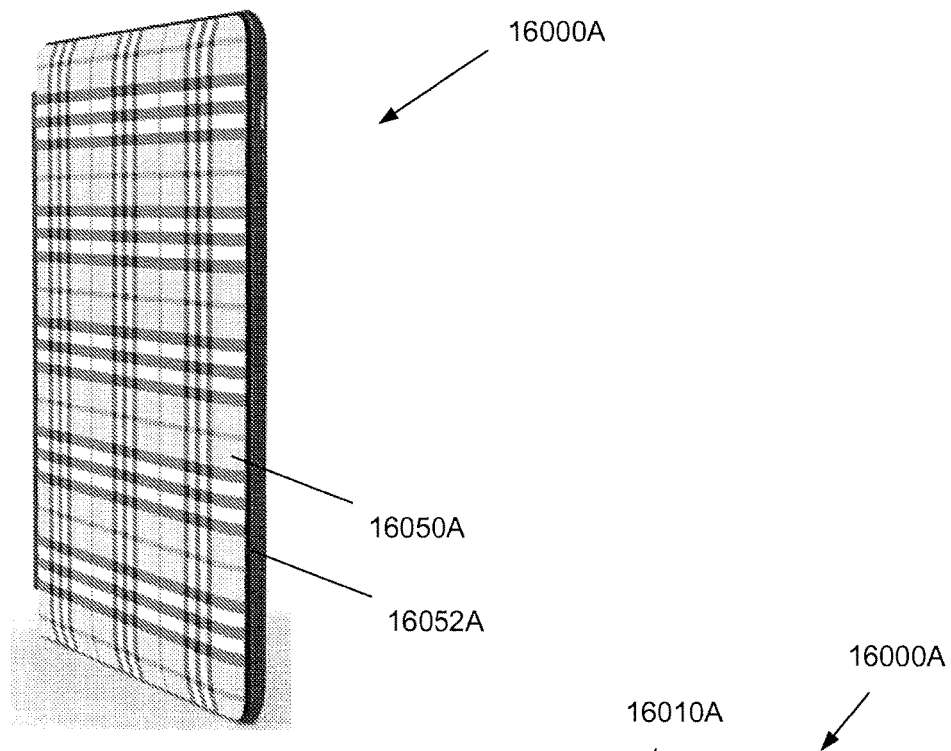
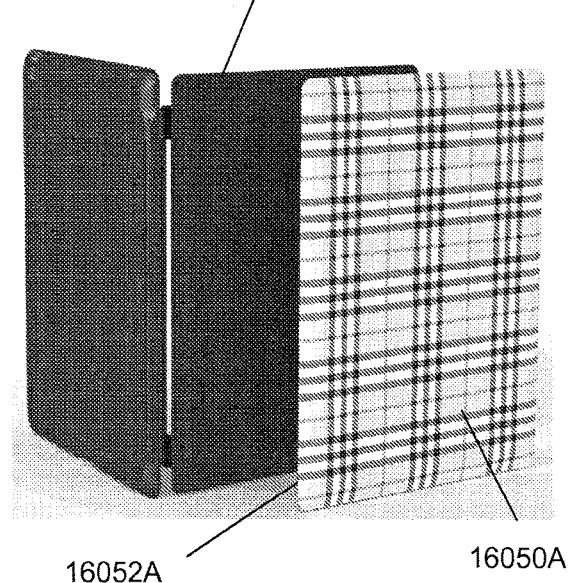
FIG. 89H
FIG. 89I

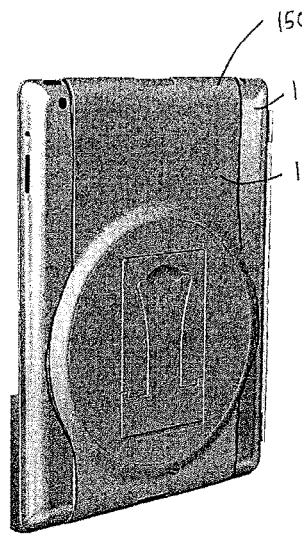
FIG. 109
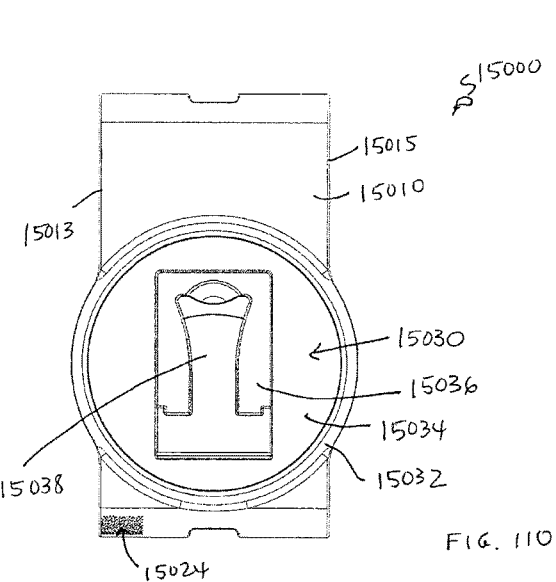
FIG. 110
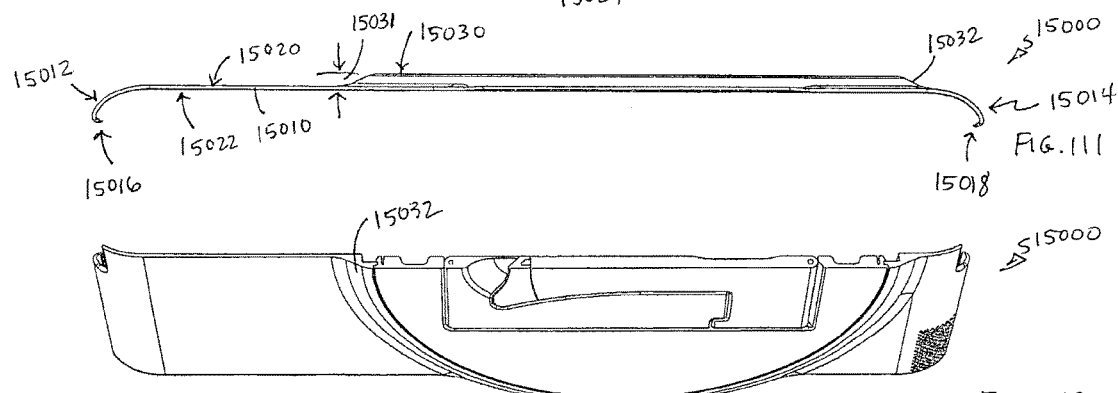
FIG. 111
FIG. 112
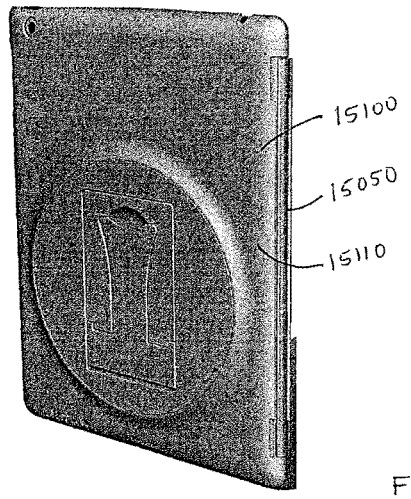
FIG. 113

HOLDER FOR ELECTRONIC DEVICE WITH SUPPORT

CROSS-REFERENCE TO RELATED APPLICATIONS

This application is a continuation of U.S. application Ser. No. 13/345,345, filed Jan. 6, 2012, which is a continuation-in-part of PCT Patent Application No. PCT/US11/31918, filed Apr. 11, 2011, entitled "Holder for Electronic Device with Support," which is a continuation-in-part of U.S. Non-Provisional patent application Ser. No. 12/758,377, filed Apr. 12, 2010, entitled "Holder for Electronic Device with Support," (now U.S. Pat. No. 8,382,059 issued on Feb. 26, 2013), which is a continuation-in-part of U.S. Non-Provisional patent application Ser. No. 12/556,182, filed Sep. 9, 2009, entitled "Holder for Electronic Device with Support," which claims priority to and the benefit of U.S. Provisional Patent Application No. 61/191,454, filed Sep. 9, 2008, entitled "Versatile Hard-Shell Holder for Mobile Phones, PDAs and Portable Music/Video Players." The entire disclosures of all of the above-identified patent applications are incorporated herein by reference in their entirety.

BACKGROUND OF THE INVENTION

The present invention relates to cases or holders for cell phones, personal digital assistants (PDAs), portable video/music players, electronic books, electronic tablets and other handheld and/or free-standing display devices, as well as the devices themselves. The present invention also relates to a versatile protective holder that can allow placement on any surface for hands-free viewing, with full adjustment of viewing angle in landscape and/or portrait orientations; directional sound reflecting and baffling; easier cleaning and viewing of the device's screen; easier grasping by the user; wearing of the device using a belt clip or arm or waist band; as well as attachment to an automobile, bicycle, or other vehicle.

In this new era of digital convergence, portable devices are increasingly being used for multiple tasks ranging from audio and video telephony to navigation to computing to electronic books to video and audio entertainment. For example, Apple's iPhone® mobile digital device is a fully functional mobile phone, GPS navigation device, internet, document and image browser, audio and video library, electronic book reader and streaming video terminal Apple also has a variety of iPod® portable video/music players and has recently introduced the new iPod Touch® mobile digital device which is the first-ever Wi-Fi iPod® that can download and play video in realtime on a 3.5-inch widescreen display, and the new Apple iPad® mobile digital device, which is a full size mobile computing and entertainment tablet with a 9.7 inch multi-touch screen. While some users prefer to carry such handheld devices in a shirt pocket, handbag or pants pocket, others prefer to clip the device to their belt. Regardless, there is often a desire to stand the device at an incline when watching video programming, reading a book, or viewing still images. Soon, these same devices will also be capable of two-way video conferencing. In order to serve all viewing and operating preferences and as well to protect their device, users sometimes purchase protective holders with detachable belt clips and/or viewing stands.

There are a variety of conventional hard-shell and soft-shell holders available for mobile phones, PDAs, e-readers and portable video/music players, but these have rather limited functionality. Although they generally succeed in protecting the mobile phone/PDA/tablet/e-reader/portable video/music player, they can detract from its portability, usability and/or aesthetic appearance, and fall short of the needs of the user in many other ways. The framework employed to restrain the PDA/cell phone/portable video/music player can make them poor choices for mobile usage, too big for storage on a person and partially block access to keys or screens. Moreover, the stand mechanisms currently in use often compel either landscape or portrait viewing. This limits versatility and usability. None of these protective cases have a built-in retractable stand that enables multi-angle viewing in more than one orientation.

For example, the iPhone®, iPad® and iPod Touch® mobile digital devices are smart terminals that automatically adjust their displays of still images to landscape or portrait viewing mode depending on the orientation of the device. On the other hand, when video is played back, these devices automatically rotate the display to landscape. While Belkin™ and other manufacturers produce a case for the iPhone® with a transformable belt clip or kickstand for video viewing, the belt clip/kickstand is bulky and prevents insertion into one's pocket. Moreover, the incline of the device cannot be adjusted. This problem becomes acute in certain situation such as on an airplane where placement of the device is limited to a tray over which the user is hunched, and the device is best viewed at a relatively flat incline to properly see the LCD screen. In addition, the case is a clamshell design that clamps over the iPhone® preventing it from being readily removed from the case.

It would be greatly advantageous to provide a more functional holder or support mechanism for any of the iPhone®, iPad®, iPod® mobile digital device lines, and other PDAs, mobile phones, electronic tablet computers, electronic books and portable video/music players. Such a holder could include one or more of the features of 1) resilient side grippers that clamp around the device to protect it without obscuring the display or controls; 2) all-around symmetric features that allow the device to be used in multiple orientations without compromising usability; 3) an adjustable kickstand or support that allows adjustment of the viewing angle within a broad range and/or landscape or portrait viewing; 4) an extremely low profile design to facilitate pocket insertion; 5) a detachable belt clip or clip for an arm band for wearing the device by a user; 6) directional sound deflector; 7) minimized screen blockage to enable easy one handed cleaning; 8) an automotive, bicycle or other vehicle attachment; 9) easy to hold finger depressions; 10) slim, low-profile design that adds minimal additional bulk; 11) headphone cord management; 12) arm strap attachment; and 13) an eye-catching aesthetic.

SUMMARY OF THE INVENTION

It is an object of the present invention to provide a more versatile protective case or holder especially suited for Apples' iPhone®, iPad® or iPod Touch® mobile digital devices, or any other portable device with a frontal LCD screen, organic light-emitting diodes (OLED) screen, touch-viewing screen, or any other type of viewing screen. In one embodiment, the case allows to provide a novel adjustable kickstand or support that allows adjustment of the viewing angle within a broad range, in either or both landscape or portrait viewing, and yet folds flush to the holder without added thickness. In one embodiment, the support doubles as a shoulder support when hands-free speaking on a cell phone.

It is another object to provide a protective holder as described above that employs resilient protective side grippers that clamp around the device without obscuring the display or controls at all, and also making it easier for the user to clean the display surface and other useable areas by wiping it against a shirt using only one hand.

It is another object to provide a protective holder as described above with novel multi-position directional sound reflector and noise baffle to improve speaker and microphone audio performance of the device contained in the protective holder.

It is another object to provide novel finger tip shaped depressions to enable easier grasping by the user.

It is another object to provide a connection on the holder that enables coupling to a belt clip for wearing on the belt or waist band.

It is another object to provide all the foregoing features and yet retain an extremely slim, low profile to facilitate pocket insertion, reduce bulk, and create an eye-catching aesthetic.

It is another object to provide an automotive, bicycle or other vehicle attachment means.

It is another object to provide a headphone cord wrapping and attachment mechanisms.

It is another object to provide a combination headphone cord wrapping, view stand and arm band attachment mechanism.

It is another object to provide a mechanism for aiming an electronic device at a user's face to enable that device's webcam to capture the user's image for video communication.

It is another object to provide a mechanism for screen protection.

In accordance with the foregoing objects, one embodiment of a protective case or holder for the iPhone®, iPod Touch®, other iPod® mobile digital devices, and other handheld cell phones and portable video/music players having a frontal LCD, OLED, touch screen or other display includes a form-fitting backplate with corner frames for cradling the device while leaving the entire frontal aspect unobstructed. The holder includes a series of contoured side grippers on each side of the backplate for clamping the device in place without obstructing the LCD screen (or access to it for cleaning or otherwise). The holder also includes a novel and multi-position fully-adjustable kickstand or support for upright hands-free viewing of the device at several angles in either or both landscape or portrait viewing, while also serving as a hands-free shoulder cradle for speaking into the phone. In one embodiment, the holder includes a detachable belt clip. The holder has an extreme slimline folded profile to facilitate pocket insertion, minimize bulk, and create an eye-catching aesthetic.

In addition, a sound reflector and noise shield/baffle is disclosed which improves the audio performance of a device contained in the protective holder. The noise shield slides outward to create a pocket at the bottom of phone. The pocket shields the device's microphone from surrounding noise, and it channels sound outward from the device's external speaker, bouncing it back towards the face of phone and making the external device's speaker or speakers sound louder from specific locations.

In one embodiment, a holder for a portable device includes a body including a first coupling member and a second coupling member, each of the coupling members extending from the body, the coupling members being configured to couple a portable device to the body; and a support movably coupled to the body, the support being movable between a retracted position and at least two extended positions relative to the body, the at least two extended positions including a first extended position and a second extended position, the support being disposed within the body in its retracted position, the support extending from the body in its extended positions, the support being engageable with a support surface to support the body at least two desired angles relative to the support surface.

In one embodiment, the body has an inner surface, an outer surface, and an opening extending from the inner surface to the outer surface, the support being disposed in the opening when the support is in its retracted position. The body has a thickness defined by the distance between the inner surface and the outer surface and the support has a thickness substantially the same as the thickness of the body when the support is in its retracted position.

In one embodiment, the body includes a positioning mechanism, the positioning mechanism defining a plurality of positions in which the support may be retained. In one embodiment, greater than three positions may be defined by the positioning mechanism. The positioning mechanism includes at least one slot and the support includes at least one pin or other similar engagement member, the at least one pin being slidably engaged with the at least one slot.

In one implementation, the body includes a plurality of corners and each of the first and second coupling members is located proximate to one of the corners. The body includes a third coupling member and a fourth coupling member, each of the third coupling member and the fourth coupling member being located proximate to one of the corners of the body. The body may also include a sound reflector/baffle slidably coupled thereto, the sound reflector being movable between a retracted position and a reflecting/baffling position.

In another implementation, a holder for a portable device includes a body including a first coupling member and a second coupling member, each of the coupling members extending from the body, the coupling members being configured to couple a portable device to the body; and a support movably coupled to the body, with a thickness substantially the same as the thickness of the body, the support being movable between a retracted position and at least two extended positions relative to the body, the support being disposed within the body in its retracted position, the support extending from the body in its extended positions, the support being engageable with a support surface to support the body in at least two desired angles relative to the support surface.

In one embodiment, the holder for a portable device includes a body including a first coupling member and a second coupling member, each of the coupling members extending from the body, the coupling members being configured to couple a portable device to the body; and a sound reflector coupled thereto, the sound reflector being movable between a retracted position and a reflecting position. In one implementation, the sound reflector is made or coated by a material that is more sonically reflective than the material of the body.

In one embodiment, a holder for a portable device includes a front surface, a rear surface and a side wall extending between the front surface and the rear surface includes a mounting portion configured to be coupled to the portable device with the front surface of the portable device exposed, the mounting portion covering at least part of the rear surface of the portable device and portions of the side wall of the portable device; and a support portion movably coupled to the mounting portion, the support portion being disposable in a retracted position and in at least two extended positions relative to the mounting portion, substantially all of the support portion being disposed within the body when the support portion is in its retracted position, and substantially all the support portion extending from the body when the support portion is in its extended position.

In one implementation, the support portion is disposed entirely within the mounting portion when the support portion is in its retracted position. The coverage of the side wall by the mounting portion is discontinuous. The support portion includes a first component having a first end and a second end and a second component having a first end and a second end, the first end of the first component is pivotally coupled to the mounting portion, the second end of the first component is pivotally coupled to the second component, and the first end of the first component is slidably coupled to the mounting portion.

In one implementation, the first component includes a substantially planar portion configured to engage a support surface. The orientation of each of the first component and the second component varies when the support portion moves from its retracted position to its extended position. The angle between the first component and the second component varies when the support portion moves from its retracted position to its extended position.

In another embodiment, a holder for a portable device includes a front surface, a rear surface, a side wall extending between the front surface and the rear surface, and a first coupling member and a second coupling member, each of the coupling members extending from the base, the coupling members being configured to extend along the side wall of the portable device, the first coupling member being configured to cover a first corner of the portable device, the second coupling member being configured to cover a second corner of the portable device, each of the coupling members having a length such that the front surface of the portable device is not covered by either of the coupling members when the holder is coupled to the portable device; and a support movably coupled to the base, the support being movable between a retracted position and at least two extended positions relative to the base, the support being engageable with a support surface to support the base and the portable device at desired angles relative to the support surface.

In one implementation, the first corner of the portable device is covered by the first coupling member and the second corner of the portable device is covered by the second coupling member. The portable device includes a third corner and a fourth corner, and the base includes a third coupling member that covers the third corner and a fourth coupling member that covers the fourth corner, each of the third coupling member and the fourth coupling member has a length such that the front surface of the portable device is not covered by either of the third or fourth coupling members when the holder is coupled to the portable device. The support extends from the base in its extended position and is disposed within the base in its retracted position.

In one embodiment, a method of manufacturing a holder for an electronic device is disclosed. The holder includes a body and a support having a first support component and a second support component coupled to the first support component, the support being movable between a retracted position and at least two extended positions relative to the body, the support being disposed within the body in its retracted position and extending from the body in its extended positions, the first support component including a first connector and the second support component including a second connector. The method includes the steps of: forming the body with a first coupling member and a second coupling member, each of the coupling members extending from the body and collectively being configured to couple the body to the electronic device, the body including a notch formed therein and a slot formed therein; coupling the first support component to the body by engaging the first connector with the slot; and coupling the second support component to the body by engaging the second connector with the notch.

In one implementation, the connection between the first connector and the slot is a slidable connection and the connection between the second connector and the notch is a pivotable connection. The slot can be a first slot and the body includes a second slot opposite to the first slot, with the step of coupling the first support component including engaging the first connector with the second slot. In addition, the notch can be a first notch and the body includes a second notch opposite to the first notch, with the step of coupling the second support component including engaging the second connector with the second notch. In one embodiment, the first connector has a first end and a second end, the first end of the first connector being inserted into the first slot before the second end of the first connector is inserted into the second slot.

In another embodiment, a method of adjusting a holder for an electronic device is disclosed. The holder includes a body configured to be coupled to the electronic device, the holder including a support movable between a retracted position and at least two extended positions relative to the body, the support being disposed within the body in its retracted position and extending from the body in its extended positions, the first support component including a first connector coupled to the body and the second support component including a second connector coupled to the body. The method includes the steps of: moving the first connector along the body from a retracted position to an extended position, the first support component being disposed in a retracted position when the first connector is in its retracted position and in an extended position when the first connector is in its extended position; and moving the second support component about the second connector relative to the body from a retracted position to an extended position.

In one implementation, the step of moving the first connector along the body from a retracted position to an extended position includes sliding the first connector along the body. The body includes at least one slot and the step of moving the first connector includes moving the first connector along the at least one slot. In on embodiment, the second connector is pivotally coupled to the body and the step of moving the second support component includes rotating the second support component about the second connector. In one embodiment, the extended position is a first extended position and the method includes moving the first connector along the body from the first extended position to a second extended position different than the first extended position. The second support component can be rotated about the second connector simultaneously with the movement of the first connector between its retracted position and either of its first extended position and its second extended position.

BRIEF DESCRIPTION OF THE DRAWINGS

Other objects, features, and advantages of the present invention will become more apparent from the following detailed description of the different embodiments and certain modifications thereof when taken together with the accompanying drawings in which:

FIG. 7 illustrates a perspective view of an alternative embodiment of a holder with an optional built-in cord management feature.

FIG. 8 illustrates a perspective view of the holder illustrated in FIG. 7 with a cord coupled thereto.

FIG. 14 illustrates a side view of the holder illustrated in FIG. 9.

FIG. 15 illustrates another side view of the holder illustrated in FIG. 9.

FIG. 16 illustrates a cross-sectional view of the holder illustrated in FIG. 11 taken along the line "16-16."

FIG. 30A illustrates a partial perspective view of some components of the holder illustrated in FIG. 30.

FIG. 30B illustrates a view of a surface of the holder illustrated in FIG. 30.

FIG. 30C illustrates a view of an alternative embodiment of a surface of the holder illustrated in FIG. 30.

FIG. 30D illustrates a perspective view of the surface illustrated in FIG. 30C.

FIG. 42 illustrates an outer perspective view of the holder illustrated in FIG. 41A in a deployed configuration.

FIG. 43 illustrates an inner perspective view of the holder illustrated in FIG. 42.

FIG. 43A illustrates a close-up perspective view of a component of the holder illustrated in FIG. 41A.

FIG. 43B illustrates a close-up side view of a component of the holder illustrated in FIG. 41A.

FIG. 62 illustrates another perspective view of the holder illustrated in FIG. 60.

FIG. 63 illustrates a cross-sectional side view of the holder illustrated in FIG. 59A with its support portion in another deployed configuration.

FIG. 68 illustrates a rear perspective view of another embodiment of a holder with its support in one orientation according to the invention.

FIG. 69 illustrates a front perspective view of the holder illustrated in FIG. 68.

FIG. 70 illustrates a close-up view of a projecting portion of the base of the holder illustrated in FIG. 68.

FIG. 73 illustrates a rear perspective view of the holder illustrated in FIG. 68 with its support in another orientation.

FIG. 74 illustrates a rear perspective view of the holder illustrated in FIG. 73 with its support in a deployed configuration.

FIGS. 74A and 74B illustrate partial cross-sectional views of different embodiments of a cord management member for the support arm.

FIGS. 89H-89I illustrate different views of another embodiment of a holder according to the invention.

FIG. 93 illustrates a perspective view of the holder illustrated in FIG. 91 with its cover in a deployed position.

FIGS. 94-96 illustrate side perspective views of the holder illustrated in FIG. 91 with its support portion engaging the cover at different locations.

FIGS. 97 and 98 illustrate front perspective views of the holder illustrated in FIG. 91 with an electronic device located on the holder in a portrait orientation and in a landscape orientation, respectively.

FIGS. 99-103 illustrate a top view, opposite end views, a side view, and a bottom view of the holder illustrated in FIG. 91 in a collapsed configuration, respectively.

FIGS. 104 and 105 illustrate perspective views of another embodiment of a holder according to the invention in a closed configuration and in a deployed configuration, respectively.

FIGS. 106 and 107 illustrate a rear perspective view and a side view of another embodiment of a holder according to the invention, respectively.

FIG. 108 illustrates a rear perspective view of another embodiment of a holder according to the invention.

FIGS. 109-111 illustrate a rear perspective view, a rear view, and a side view of another embodiment of a holder according to the invention.

FIG. 112 illustrates a cross-sectional view of the holder of FIG. 109.

FIG. 113 illustrates a rear perspective view of another holder according to the invention.

FIGS. 114-117 illustrate an alternative embodiment of a holder according to the present invention.

Like reference numerals have been used to identify like elements throughout this disclosure.

DETAILED DESCRIPTION OF THE INVENTION

Figure 1:
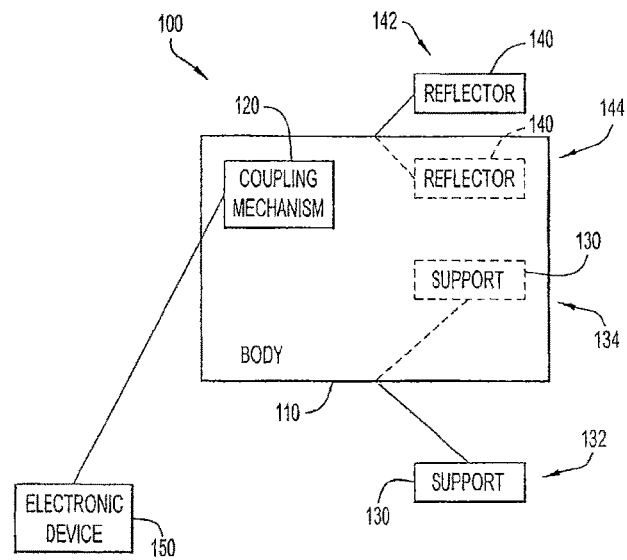
FIG. 1 is a schematic diagram of an embodiment of a holder or case according to the invention.

The term "electronic device" is used to include any type of electronic device, including those identified above as examples of electronic devices with which the holder can be used. The terms "support" and "support portion" may be used interchangeably herein along with the term "support assembly" to refer to a structure that can be used to prop up or stand up the holder and an electronic device coupled to the holder relative to a support surface. The terms "case" and "holder" may be used interchangeably herein to refer to a structure that can be coupled to an electronic device and facilitate the transportation, use or support of the electronic device and in addition, provide protection for the electronic device. The term "pin" is used to include any type of protrusion that can be used to engage a slot, including a metal, plastic or other pin, as well as a simple bump of material that juts out from one component of a holder to engage with another component part of the holder. The term "connector" can be used interchangeably with the term "pin." As used herein, the term "pin" includes a single connector or a set of corresponding connectors that can be used to couple one component to another component. The term "LCD" is used to include any type of display or screen of the device, including an OLED screen.

The terms "cord management system" and "cord management mechanism" are used interchangeably herein to refer to a member or component that can be used or engaged by a user to manage the position of a cord connected to an electronic device. The term "orientation" is used here to refer to a particular orientation of a case or holder relative to a support surface or a point of view of a user. The orientation of the case or holder is determined in large part by the way in which the support or support portion coupled to the base is located relative to the case. Thus, the term "orientation" is also used herein with reference to the orientation of the support relative to the body, which in turn relates to the support surface as well.

Reference is made herein to the concept of an "upside down" configuration or orientation and a "right side up" configuration or orientation. It is to be understood that those orientations are inverted relative to each other and are from the viewer or user's point of view of the particular electronic device. Notably, many current electronic devices can determine the particular orientation of the device and use their functionality to change the image on the device so that it is in a properly viewable orientation for the viewer or user of the device, regardless of how the device is manipulated or positioned. Thus, the "upside down" and "right side up" orientations relate to the position of the case or holder and the electronic device coupled thereto. The "right side up" orientation can be used to refer to the orientation of the electronic device and its case when the image displayed thereon is in a proper viewing orientation for the viewer. The viewer can rotate the electronic device 180 degrees so that the lower edge of the device is now the upper edge of the device, which can be referred to alternatively as "inverting" the device. This new position is the "upside down" orientation, regardless of what change is made to the displayed image by the electronic device. The "upside down" and "right side up" orientations can be referred to alternatively as "180 degree orientations" as well.

The term "disposed within" is used herein to refer to the position of the components of the support or support portion of a case relative to the body of the case. As set forth below, the case or holder has a thickness and an outer surface. The case is coupled to the holder and it is desirable that the support portion of the case not interfere with or otherwise prevent an electronic device from being coupled to the holder. In addition, it is also desirable to minimize the likelihood that the support portion of the case protrudes outwardly from the case when the support portion is in its retracted position. By not protruding outwardly, the case has a generally smooth outer surface and the support portion does not add to the width or overall size of the case when the support portion is in its retracted position. To be "disposed within" the thickness or profile of the case body, a support portion with an outer surface has its outer surface matching with and/or being the same general profile as the outer surface of the case body. In this arrangement, the outer surface of the support portion and the outer surface of the case body form a continuous surface. In addition, the term "substantially disposed within" is also used herein. This term relates to the extent that the support portion is located within the thickness or the profile of the case body. The "substantially disposed within" is intended to encompass the variation in which the outer surface of the support portion extends slightly beyond the outer surface of the case body, such as by a fraction of an inch (in one embodiment, 1/16" of an inch or in another embodiment, 1/8" of an inch). Notably, even though the support portion outer surface may extend outward slightly more that the case body outer surface, the support portion outer surface may be tapered such that the outer surfaces still form a continuous surface. Nevertheless, nearly all or essentially all of the support portion is located within the thickness or profile of the case body when the support portion is "substantially disposed within" relative to the case body.

Referring to FIG. 1, an embodiment of a holder or case for an electronic device according to the invention is illustrated. In this embodiment, the holder 100 includes a body or body portion 110 that has a coupling member or mechanism 120. The coupling mechanism 120 can be used to couple the body 110 to an electronic device 150. The body 110 can be configured to provide protection to at least part of the electronic device 150. In different embodiments, the coupling mechanism 120 includes one or more coupling members that engage the electronic device 150. In one implementation, the coupling mechanism 120 may include two coupling members that engage different portions of the electronic device 150. In another implementation, the coupling mechanism 120 may include four coupling members that engage different portions, such as the corners, of the electronic device 150.

In this embodiment, the coupling mechanism 120 is integrally formed with the body 110 of the holder 100. However, in alternative embodiments, the coupling mechanism 120 is formed separately from the body 110 and subsequently coupled or connected thereto.

As shown in FIG. 1, the holder 100 includes a support 130 that is coupled to the body 110. The support 130 is engageable with a support surface, such as a table, counter, tray, desk, etc., and is configured to support the body 110 and the holder 100 via the support surface when the electronic device 150 is coupled to the body 110. The support 130 is movable relative to the body 110 and disposable in several different positions relative to the body 110. The support 130 may be slidable and/or pivotable relative to the body 110.

The support 130 can be placed in an extended position 132 in which the support 130 extends outwardly from the body 110 and is engageable with a support surface. The support 130 can also be placed in a retracted position 134 in which the support 130 is disposed within the body 110 (shown in phantom). The body 110 has a thickness and a profile in which the support 130 is contained or located when the support 130 is in its retracted position 134. The support 130 in its retracted position 134 has a collapsed thickness that is the same or substantially the same as the thickness of the body 110.

For example, in one embodiment, the body 110 has an opening formed therein. The support 130 is dimensioned to fit within the opening of the body 110 when the support 130 is in its retracted position 134. By disposing the support 130 within the body 110 or the profile of the body 110, the support 130 does not extend from the body 110 in its retracted position 134. Accordingly, a smooth and non-obtrusive profile for the body 110 is achieved. In the event that the body 110 has a curved configuration, the support 130 has a similarly curved configuration. In an alternative embodiment, substantially all of the support 130 is placed within the body 110 and only a very minor portion extends therefrom.

In one embodiment, the holder 100 includes a sound or audio reflector 140 coupled to the body 110. In different embodiments, the holder 100 may not include the reflector 140. Referring to the embodiment illustrated in FIG. 1, the reflector 140 is coupled to and movable relative to the body 110. The reflector 140 is shaped or configured so that audible output from the electronic device 150 is reflected off of a surface of the reflector 140 and in a direction desired by the user. In many implementations, the electronic device 150 includes a speaker or transducer proximate to its rear surface along which the body 110 of the holder 100 is placed. Typically, the user is located on the front of the device 150 when viewing the screen of the device 150. Accordingly, it is desirable that the audible output of the device 150 be reflected toward the front of the device 150 toward the user.

The reflector 140 is located proximate to the location of the speaker on the electronic device 150. The reflector 140 forms a part of the body 110 and is movable between an extended position 142 in which audible outputs are reflected off the reflector 140 and a retracted position 144 within the body 110 of the holder 100. In its retracted position 144, the reflector 140 is positioned within a recess or opening formed in the body 110 and disposed within the body 110.

In one embodiment, the body 110, the coupling mechanism 120, the support 130, and the reflector 140 can be formed of a molded plastic material. In one embodiment, each of the support 130 and the reflector 140 is slidably coupled to the body 110. In other embodiments, one or both of the support 130 and the reflector 140 is pivotally coupled to the body 110.

As described above, the invention includes a versatile hard case for cell phones such as the iPhone®, portable video/music players such as the iPod Touch® or other iPods®, and other handheld cell phones and portable video/music players. In one embodiment, the case allows wearing of the device on a belt clip as well as placement on any surface for hands-free viewing, with full adjustment of viewing angle in landscape orientation as well as viewing in portrait orientation with a more limited degree of angular adjustment. The hard case is especially suited for any handheld device with a frontal LCD, OLED, or other type of display including a touch-viewing screen.

Figure 2:
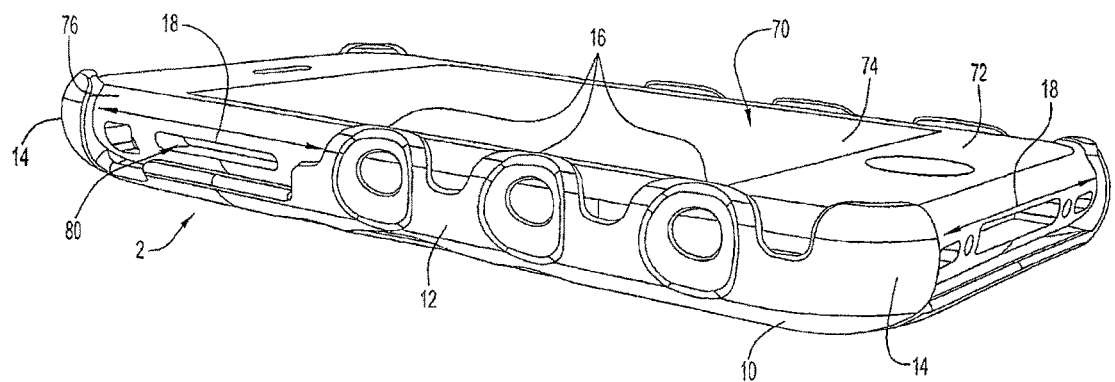
FIG. 2 is a perspective view of the hard case for the iPhone®, iPod Touch®, other iPods®, other handheld cell phones, electronic books, electronic tablet computers and other portable video/music players according to one embodiment of the present invention.

FIG. 2 is a perspective view of the hard case 2 according to one embodiment of the present invention. The hard case 2 is illustrated as being mounted to an electronic device 70 that has a front surface 72 with a display or display screen 74 and a side wall or portion 76 that extends around the perimeter of the front surface 72. The electronic device 70 includes a rear surface (not shown in FIG. 2) opposite the front surface 72. The electronic device 70 includes one or more ports 80 that facilitate the connection of the electronic device 70 to other components.

The hard case 2 includes a molded form-fitting backplate 10 with moderately raised upwardly curving edges 12 and four more pronounced and corner-positioned clamps 14 that furl over for cradling the device 70 at the corners of the device 70. The edges 12 are interrupted as necessary by apertures 18 to provide access to input/output ports, power keys and other controls side mounted on the device 70, such as port 80. While the specific configuration of the apertures 18 may vary depending on the device 70 with which the hard case 2 will be used, in one embodiment, the apertures 18 are duplicated in minor-image fashion on both sides to allow insertion and use of the device 70 in either 180-degree rotated orientations.

Similarly, mirror-image apertures may be provided for device camera lenses. In addition to corner clamps 14, an offset series of grippers 16 is positioned along each side of backplate 10, likewise in minor image fashion. Each gripper 16 comprises an upwardly furled oval flange defined by a central aperture. The grippers 16 may be integrally molded and impart a resilient sidelong bias against the device 70, working in conjunction with the corner-positioned clamps 14 to securely seat the device 70 and clamp it in place within the backplate 10. It is important that the grippers 16 and clamps 14 extend up to but not in advance of the device LCD 74 so as not to obstruct viewing and/or touch screen access, and also to allow the user to wipe the LCD 74 clean with a cloth or against a shirtsleeve.

Figure 3:
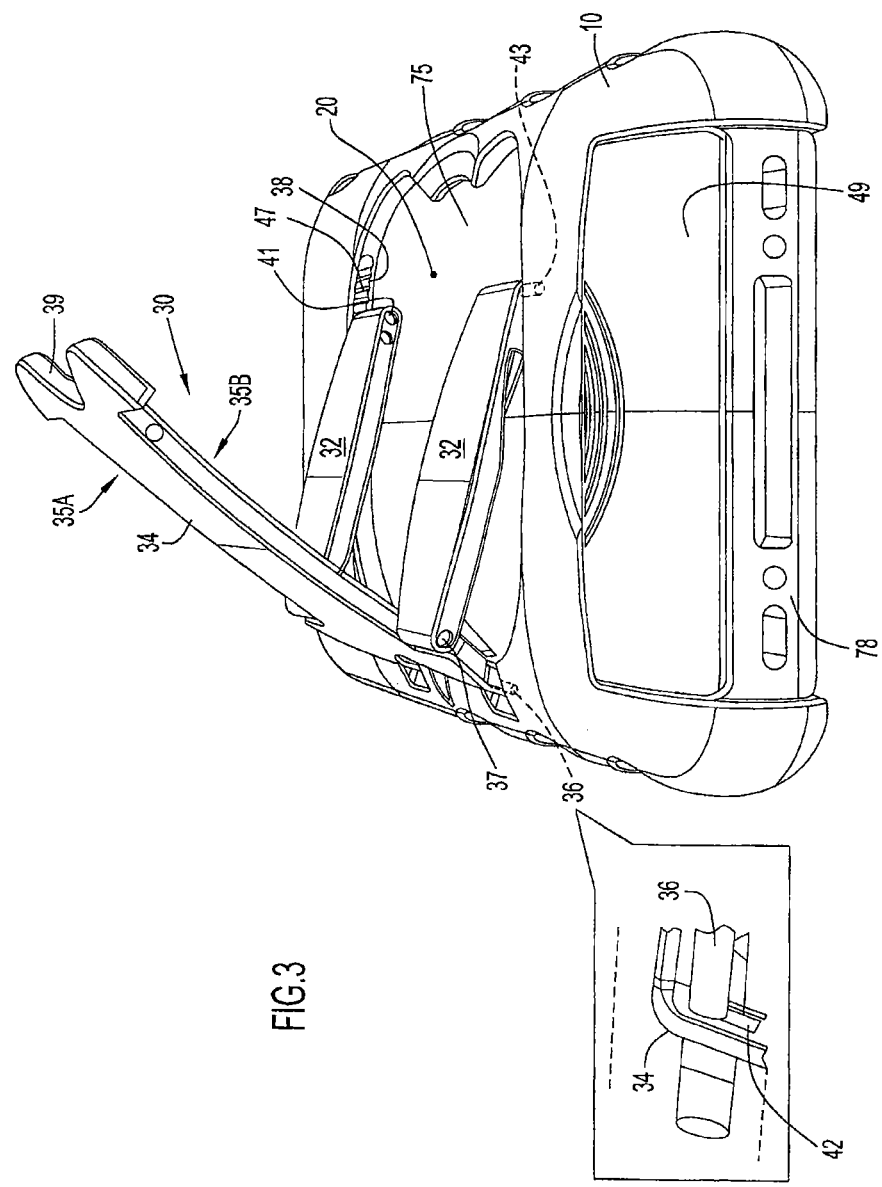
FIG. 3 is an end view of the case illustrated in FIG. 2 with its support in a deployed configuration.

Referring to FIG. 3, a rear perspective view of the case 2 and the electronic device 70. The electronic device 70 has a rear surface 75 and an end 78 as shown. A major central portion of the backplate 10 is defined by a rear aperture 20, here rectangular, that seats a folding kickstand assembly or support 30. In other embodiments, the size and configuration of the aperture 20 can vary.

The kickstand assembly or support 30 is a novel and fully-adjustable mechanism for upright hands-free viewing of the device 70 at any angle as well as landscape or portrait viewing, while also serving as a hands-free shoulder cradle for speaking into a cell phone contained therein. In FIG. 3, the support 30 is illustrated in a deployed or extended position or configuration relative to the case 2. The kickstand assembly or support 30 further comprises a stand member 34 formed in the shape of an I (with opposing sidelong notches 35A and 35B) and pivoted at one end to the backplate 10. The support 30 also includes opposing reinforcing struts 32 that fit within the sidelong notches 35A and 35B and thereby fold flat with the stand member 34 when the support 30 is placed in its retracted position. In the retracted position, the stand member 34 and struts 32 fit together flush within the aperture 20 of the backplate 10.

The stand member 34 is pivotally coupled to the backplate 10 on one side of the rear aperture 20 by a first pivot pin 36 that traverses the stand member 34. The pin 36 enters notches 42 formed in the backplate 10 on opposing sides of aperture 20. The reinforcing struts 32 are pivotally coupled to the stand member 34 on opposing sides by a second pivot pin 37 that traverses the stand member 34, protruding outward into the sidelong notches on opposing sides of stand member 34 to anchor the reinforcing struts 32 therein. The other ends of reinforcing struts 32 are slidably anchored in channels 38 formed in the backplate 10 on opposing sides of aperture 20 by pivot pins 41, 43 that traverse the respective struts 32, entering the slots or channels 38 formed in the backplate 10 on opposing sides of its aperture 20. This way, the stand member 34 when folded inward seats within the aperture 20 in the backplate 10 and draws the reinforcing struts 32 down into the backplate aperture 10 for an entirely flush-folded slimline configuration.

In another embodiment, now shown, reinforcing struts 32 can be pinched together to allow pins 41 and 42 to disengage and slide with respect to the serrated notches 47. The serrated notches 47 can be on both sides of channels 38, one side of channel 38 or located so that only the exposed distal ends of pins 41 and 42 engage with the serrated notches 47.

Figure 4:
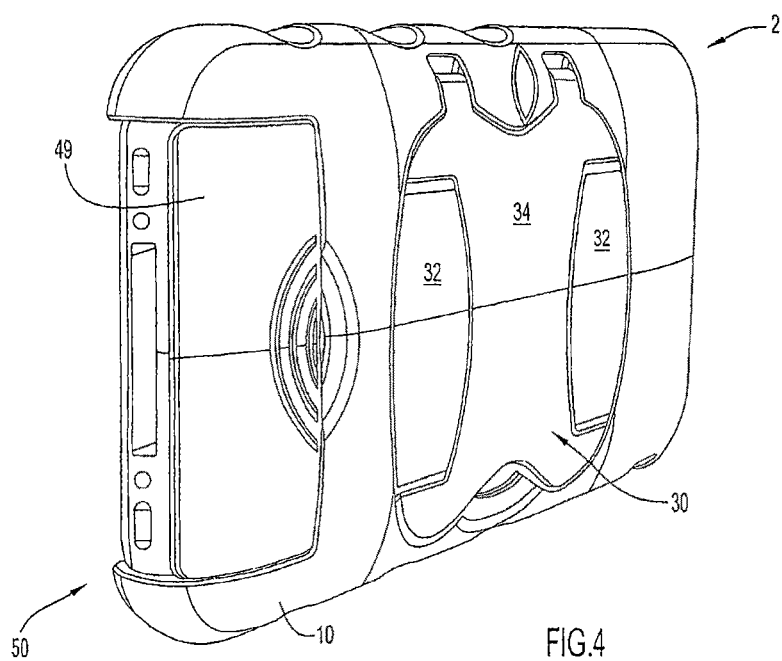
FIG. 4 is an end view of the case illustrated in FIG. 2 with its support in a retracted configuration.

Referring to FIG. 4, a flush-folded slimline configuration of the case 2 is illustrated. As shown, the components of the kickstand assembly or support 30 (including the struts 32 and the stand member 34) are disposed within the aperture 20 of the backplate 10 and within the profile of the backplate 10.

Conversely, when the stand member 34 is unfolded outward it angles away from the backplate 10 and draws the reinforcing struts 32 outward, thereby serving as a structurally sound kickstand for inclined hands-free viewing. The desired angle can be adjusted and fixed by the user. These opposing slots or channels 38 are internally indexed with a series of serrated notches 47 (see FIG. 3) to provide an indexed sliding motion for pins 41, 43. Thus, when the stand member 34 is unfolded outward, it draws the reinforcing struts 32 outward, and the opposing channels 38 provide an indexed adjustment feature that selectively locks the pins 41, 43 and hence the angle of the stand member 34 at any desired angle along the entire length of the opposing channels 38. The user can set the viewing angle of the device 70 as desired.

Figure 3A:
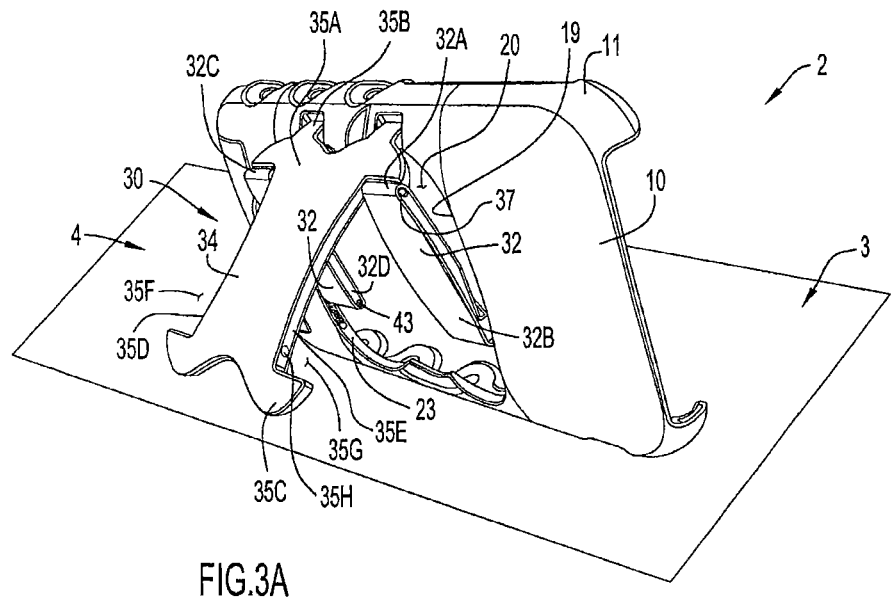
FIG. 3A illustrates a rear perspective view of the holder illustrated in FIG. 3 with its support in a deployed configuration.
Figure 3B:
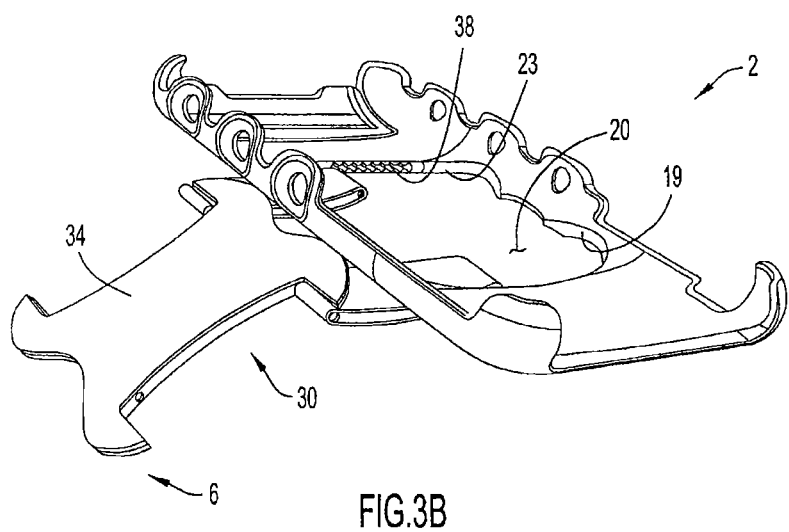
FIG. 3B illustrates a rear perspective view of the holder illustrated in FIG. 3 with its support in another deployed configuration.

Referring to FIGS. 3A and 3B, the holder 2 is illustrated with its support 30 in deployed configurations. The base plate 10 includes an edge 19 that defines the opening 20 through the plate 10. The body 10 includes a coupling mechanism 11 that includes several wall portions that are configured to engage an electronic device. The edge 19 includes opposite side walls (only side wall 23 is shown). Side wall 23 includes the slot or channel 38 formed therein. The opposite side wall includes a corresponding slot.

The support 30 can be placed in a retracted configuration (see FIG. 4) and in extended positions 4 (see FIG. 3A) and 6 (see FIG. 3B). The support 30 includes a support component 34 that has a body 35A that has an end 35B pivotally coupled to the body 10 by one or more pins (not shown). The body 35A also includes an end 35C that is used to contact a support surface 3 as shown. The body 35A includes side walls 35D and 35E that define notches 35F and 35G. Located along side wall 35D is a locking mechanism 35H, which can be a projection or a recess.

The struts 32 of the support 30 can be referred to alternatively as support components. One strut includes ends 32A and 32B that are coupled to the support component 34 and the body 10 by pins 37 and 43, respectively. Similarly, the other strut 32 includes ends 32C and 32D that are coupled to the support component 34 and the body 10 by pins 37 and 41, respectively.

If a user decides that he or she prefers to wear the device on their belt rather than in a pocket, the stand member 34 may be formed with a central recess configured for latching a belt clip (not shown) in place, so that the belt clip can be externally attached when the stand member 34 and reinforcing plates or struts 32 are fully folded inward (both seated flush within the aperture 20 in the backplate 10). This allows the flush-folded case 2 to be worn on the belt.

Referring to FIG. 3, note that the bottom of the stand member 34 is formed with an arch 39 designed to conform to the shoulder of a user. This allows the case 2 to be used as a hands-free shoulder support when using the device as a cell phone. The arch 39 conforms to the user's shoulder, and allows the device to be cradled between the head and shoulder when speaking.

As seen in the lower inset of FIG. 3, notches 42 are formed in the stand member 34 on opposing sides for ingress and receipt of pivot pin 36. These notches 42 are specially-formed quick-release notches having a keyslot cross-section with a forwardly protruding notch. This facilitates assembly of the pin 36 into notch or slot 42 inasmuch as the pin 36 can be angled into the notch 42 more easily and snapped in place. It also avoids breakage of the kickstand assembly or support 30 since upon severe shock the kickstand 30 will simply dislodge at the pin 36 (rather than breaking), and can then be reassembled.

It should now be apparent that the above-described hard case 2 is highly versatile inasmuch as the side grippers 16 clamp around the device without obscuring the display or controls, the case 2 allows the device to be inserted in either 180 orientations without compromising usability, and the adjustable kickstand or support 30 allows adjustment of the viewing angle within a broad range, as well as landscape or portrait viewing. When standing on end the kickstand assembly or support 30 protrudes rearwardly enough to still support the device at an incline.

Given the angular adjustment shown in FIG. 3 the hard case 2 can be supported at an 80 degree (offset from horizontal) viewing angle, presenting the user with a perfect frontal perpendicular view of the LCD 74. If, on the other hand, the user is seated on an airplane and is peering down to the device 70 seated on an airline tray from above, the kickstand assembly 30 can be readjusted to provide a more appropriate viewing angle, such as a 20 degree (offset from horizontal) viewing angle. Despite this versatility, the hard case 2 can be folded flat into an extremely low profile to facilitate pocket insertion, or for use with a detachable belt clip for wearing.

Figure 5:
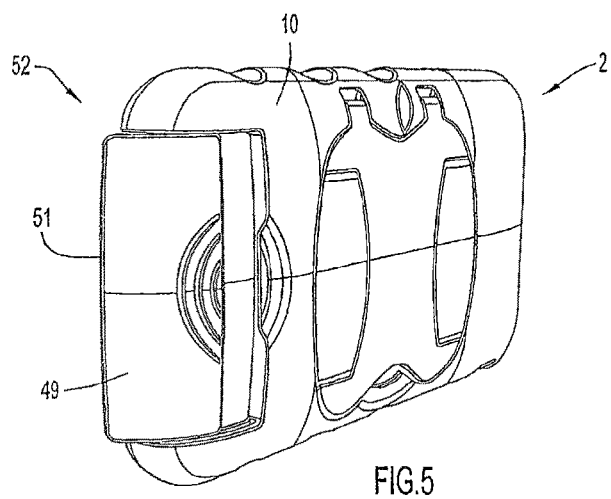
FIG. 5 is a rear perspective view of the case illustrated in FIG. 4 with its sound reflector extended.

Referring to FIG. 3, the case 2 includes a slide-panel or noise shield 49 that is movably coupled to the backplate 10 of the case 2. FIG. 4 is a side perspective view, and FIG. 5 is a top, perspective view, of the back of the hard case 2 illustrating a slide-panel 49 that serves as a noise shield. Since both the microphone and the speaker for an iPhone® mobile digital device, and other electronic devices, are located on bottom of phone or device, it can be difficult for these phones to pick up the user's voice, yet easy to pick up room noise. This is especially true when using the external speaker of an iPhone® mobile digital device, and the sound tends to seem low unless the user holds the bottom of the phone directly at the user. The noise shield 49 is a sliding panel that extends endwise outward from the bottom of phone. In one embodiment, the noise shield 49 extends about one-half inch (½"). The noise shield or panel 49 is curved to conform to the contour of the bottom end of the hard case 2. In this embodiment the panel slides between a retracted position and an extended position. In other embodiments, this movement could be accomplished by twisting, flipping, pivoting, or bending the slide-panel 49 between one position and the other. Further, there could be multiple extended positions.

Thus, in its closed position the iPhone® mobile digital device will function normally and can even be docked. To open, the noise shield 49 slides outward in an arc creating a pocket from the bottom of phone about one-half inch (½"). The pocket channels sound, in one sense to reduce ambient room noise by shielding the microphone from surrounding noise. In addition, the pocket deflects sound outward from the iPhone's external speaker, bouncing it back towards the front face of phone instead of straight out the bottom of phone. This makes the external speaker sound appear louder, while also deflecting the user's own voice back into the microphone. In alternative embodiments, the shield or panel 49 extends a distance different than one-half inch from the device 70 and case 2.

Figure 6:
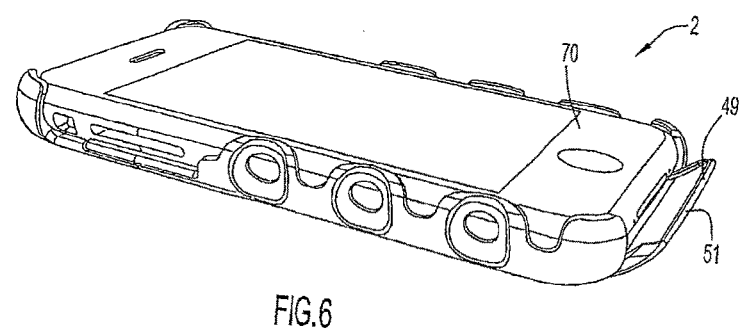
FIG. 6 illustrates a front perspective view of the case illustrated in FIG. 5 with an electronic device coupled thereto.

Referring to FIG. 4, the shield or panel 49 is disposed in its retracted position 50 relative to the backplate 10. Referring to FIGS. 5 and 6, the shield or panel 49 is disposed in an extended or reflecting position 52 relative to the backplate 10. In this position, an outer edge or end 51 of the panel 49 extends beyond the end of the case 2.

Referring to FIGS. 7 and 8, an alternative embodiment of a case is illustrated. FIGS. 7 and 8 are views of an alternative embodiment of a hard case 200 similar to the foregoing case 2 but with an optional built-in cord management feature. As shown in FIG. 7, the cord management feature or mechanism 210 includes four outwardly-pivoting corner tabs 220 installed into apertures 230 in each of the four corners of the hard case 200. Each of the apertures 230 is formed in a corner of the hard case 200 and simply conforms to the body of each corresponding tab 220, thereby providing a flush seating. Each of the tabs 220 conforms outwardly to the contours of the hard case 200 so as to provide a seamless aesthetic when folded. Each tab includes opposing coaxial pins (which may be integrally molded) that pivotally attach inside corresponding holes in the apertures 230. This way, a user can on demand flip the tabs 220 outward from a stowed/flush position to a deployed position (as shown), whereupon they collectively serve as a cord storage reel as shown in FIG. 8.

Standard audio output cords or power cords can be conveniently wound to avoid clutter. Furthermore, channeled ribs 240 may be provided as shown at the top center and/or bottom center (other at other locations) of the hard case 200 to channel the cord 250 and releasably secure it in place by a press-fit. As an alternative to the foregoing, cord management can also be obtained by pre-forming a recessed channel that runs about the edges of the hard case 200, thereby allowing a cord to be wrapped inside. Note that this same channel in the manner of a picture frame might be hinged at one point (e.g., at one corner) and also serve the purpose of an adjustable kickstand.

Figure 9:
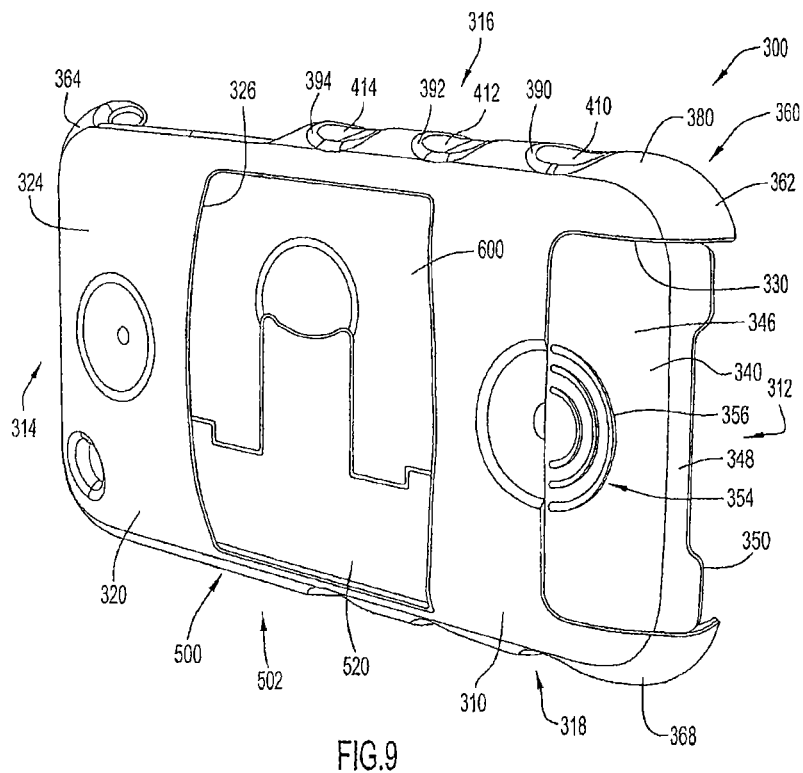
FIG. 9 illustrates rear perspective view of an alternative embodiment of a holder.
Figure 10:
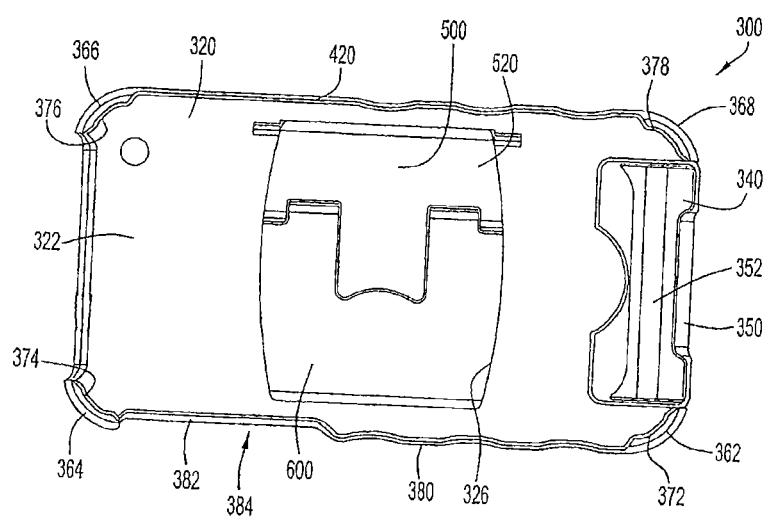
FIG. 10 illustrates a front view of the holder illustrated in FIG. 9.
Figure 11:
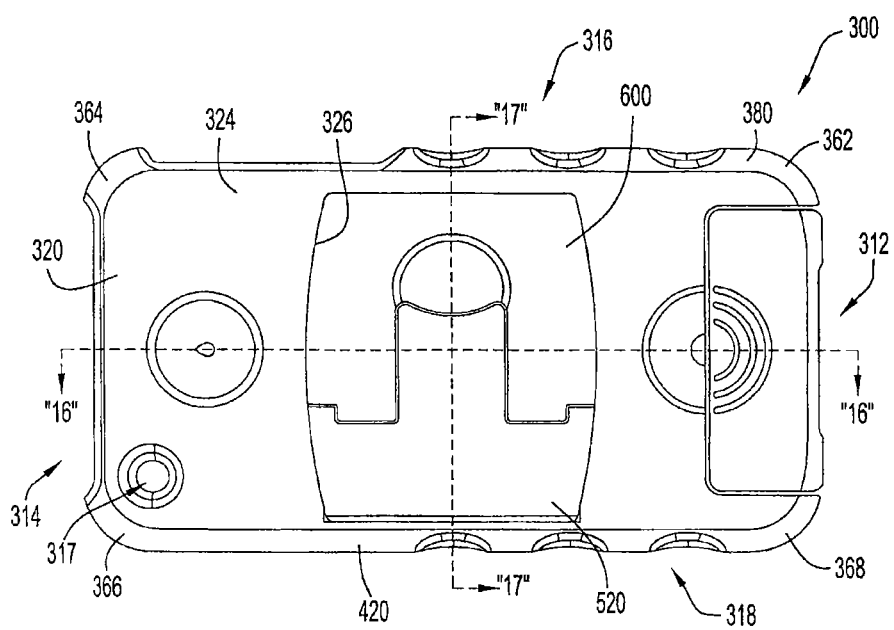
FIG. 11 illustrates a rear view of the holder illustrated in FIG. 9.

Referring to FIGS. 9-17, an alternative embodiment of a case or holder is illustrated. Referring to FIGS. 9-11, a rear perspective view of the case or holder 300, a front view of the case, and a rear view of the case, respectively, are illustrated. In this embodiment, the holder 300 includes a body or base 310 that is molded using a plastic material. In an alternative embodiment, the base 310 of the holder 300 can be formed of metal or a combination of materials that could include fabric, or rubber. The body or base 310 can be referred to alternatively as a mounting portion. The body 310 has opposite ends 312 and 314 and opposite sides 316 and 318. The body 310 includes a rear plate or base plate 320 that has an inner surface 322 (see FIG. 10) and an outer or rear surface 324 (see FIGS. 9 and 11). The inner surface 322 and the outer surface 324 of the plate 320 define a thickness therebetween. As shown in FIG. 11, the plate 320 includes an opening 317 formed therethrough that is aligned with a camera eye or opening on the electronic device coupled to the holder 300.

Figure 18:
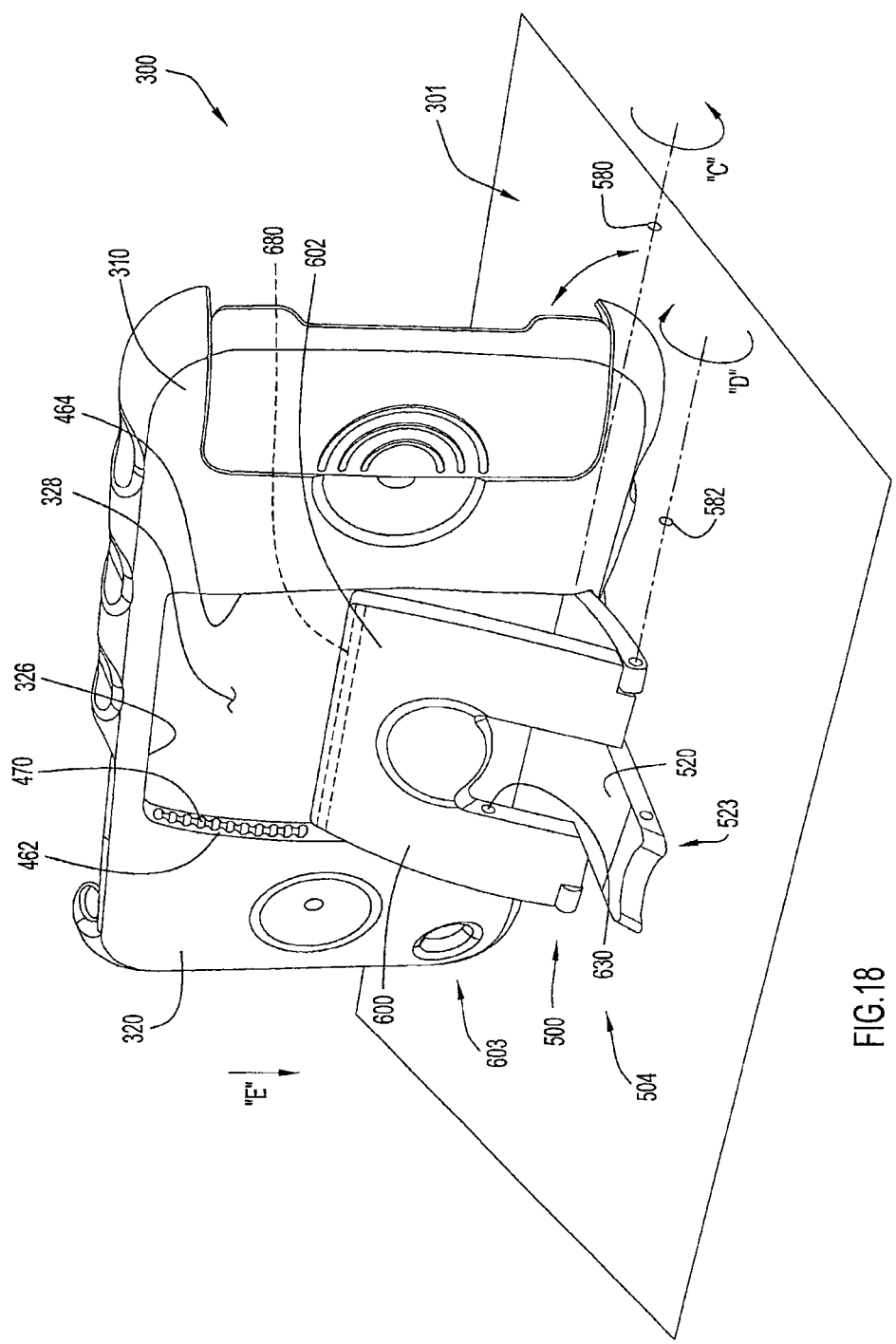
FIG. 18 illustrates a rear perspective view of the holder illustrated in FIG. 9 with its support in a deployed configuration.

The plate 320 includes an edge 326 that defines an opening 328 (see FIG. 18). In this embodiment, the opening 328 is substantially centrally located on the plate 320. However, in other embodiments, the opening 328 may be offset along the plate 320 and may have a different shape or configuration than opening 328. The plate also includes an edge 330 that defines a recess 332 (see FIG. 9). The edge 330 and recess 332 are located proximate to end 312 of case 300.

As shown in FIG. 9, the case 300 includes a sound reflector 340 slidably coupled to the body 310. The reflector 340 is configured to be inserted into the recess 332 defined by edge 330. The reflector 340 includes a body portion 346 and a curved portion 348 with a distal end or edge 350. A series of grooves or ridges 356 form an engagement area 354 that can be engaged by a user's finger to move the reflector 340 relative to the body 310. Each of the opposite sides and the end of the body portion 346 includes a groove or slot formed therein that facilitates the sliding of the body portion 346 along the side walls forming the edge 330 that defines the recess 332. The friction fit of the reflector 340 in the recess 332 enables a user to position the reflector 340 in a desired position and have the reflector 340 remain in that position.

The sound reflector 340 includes a surface that is used to reflect audible outputs. In one embodiment, the sound reflector 340 is made of a material that has a higher density than the material of the rest of the holder 300. The higher density of the material increases the intensity at which sound is reflected off of the reflector 340. In an alternative embodiment, the sound reflector 340 includes a surface with a piece or layer of material coupled thereto that has a higher density (and improved reflecting properties) than the rest of the sound reflector 340. The additional piece of material can be adhered to or molded with the inner surface of the sound reflector 340. Thus, by changing the material of the sound reflector 340 relative to the holder 300 or by using a piece of material, such as metal, coupled to the sound reflector 340, the reflecting properties and characteristics of the sound reflector 340 are improved. In other words, the material used on the reflector 340 is more sonically reflective than the material of the body 310.

The case 300 also includes a coupling mechanism 360 that can be used to couple the case 300 to an electronic device. The coupling mechanism 360 is a releasable coupling mechanism so that a user can easily remove the case 300 from the electronic device when desired. The coupling mechanism 360 includes at least one coupling member. In this embodiment, the coupling mechanism 360 includes coupling members 362, 364, 366, and 368, each of which is located near a corner of the case 300 and a corner of the electronic device.

Referring to FIGS. 9 and 15, the coupling mechanism 360 includes a side wall 380 that is integrally formed with the base plate 320. In this embodiment, the side wall 380 includes several gripping members that facilitate the gripping of the case 300 by a user. The gripping members include openings 410, 412, and 414 that are defined by edges 400, 402, and 404, respectively, and surrounded by tapered surfaces 390, 392, and 394, respectively (see FIG. 15 for greater detail). The openings and tapered surfaces are sized to be engaged by a user's fingers. In other embodiments, the side wall 380 may include fewer or more openings or the side wall 380 may be formed with no such openings at all. As shown in FIG. 15, the side wall 380 also includes an edge 382 that defines an aperture or notch 384 that facilitates access to one or more ports or features of an electronic device coupled to the case 300.

Referring to FIGS. 10 and 14, the coupling mechanism 360 includes a side wall 420 that is integrally formed with the base plate 320. In this embodiment, the side wall 420 extends between coupling members or corner portions 366 and 368 along the length of plate 320. As shown in FIG. 14, the side wall 420 includes an edge 422 and several openings 450, 452, and 454 that are defined by edges 440, 442, and 444, respectively, and surrounded by tapered surfaces 430, 432, and 434, respectively. The openings and tapered surfaces are configured to be engaged by one or more fingers of a user. In different embodiments, the quantity of openings formed in the side wall 420 can vary.

Referring to FIGS. 9-11, the holder 300 includes a support or support portion 500 coupled to the body 310. The support 500 can be referred to alternatively as a stand or kickstand assembly. The support 500 is configured to be used to support the body 310 at one or more orientations relative to a support surface 301 (as shown in FIG. 18). The support 500 includes two support components 520 and 600. As discussed in detail below, support component 520 is coupled to the body 310 and to support component 600 and the support component 600 is coupled to the body 310 and to support component 520. The support 500 is illustrated in a retracted or collapsed configuration 502 in FIGS. 9-11.

As shown in FIG. 10, the components 520 and 600 are visible and accessible from the inner side of the case 300. When the support components 520 and 600 are moved to their collapsed or retracted positions, the support components 520 and 600 are substantially coextensive with the opening 328 in the plate 320 of the body 310. The support components 520 and 600 are sized and configured to collectively mate with the opening 328.

Figures 12, 13:
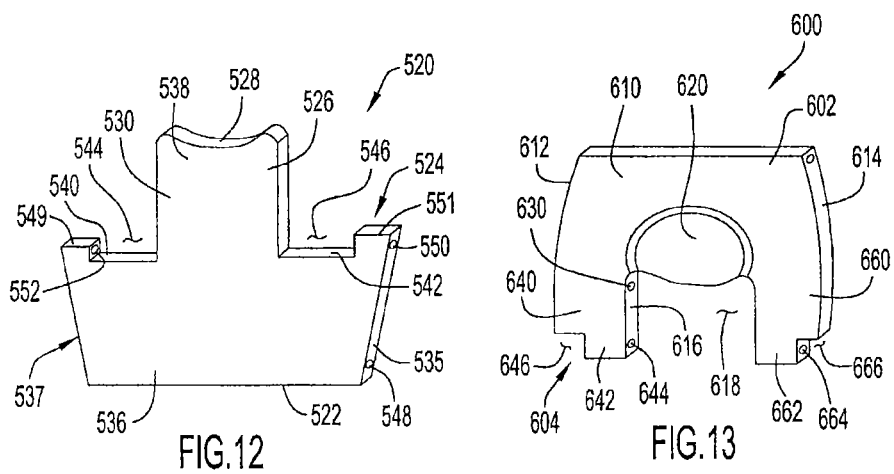
FIG. 12 illustrates a perspective view of a support component of the holder illustrated in FIG. 9.
FIG. 13 illustrates a perspective view of another support component of the holder illustrated in FIG. 9.

Referring to FIG. 12, a perspective view of an embodiment of support component 520 is illustrated. In this embodiment, the support component 520 includes a base portion 536 and an extension 538 integrally formed with the base 536. The support component 520 includes opposite ends or end portions 522 and 526 and an intermediate end or end portion 524. Ends 522 and 524 correspond to the ends of the base portion 536. The base portion 536 and extension 538 include an outer surface 530 that engages a support surface when the holder 300 is in use. The outer surface 530 forms a contact surface or area that engages a support surface and is used for support. In one embodiment, the outer surface 530 can be substantially planar. In another embodiment, the outer surface 530 can have a curved configuration. The base portion 536 and extension 538 include an inner surface 532 opposite to the outer surface 530 (see FIG. 17).

As shown, the support component 520 includes edges 540 and 542 that define notches or recesses 544 and 546, respectively. The base portion 536 includes side walls 537 and 535 and mounting portions 549 and 551 that include openings 552 and 550 therethrough, respectively, through which couplers, such as pins, are inserted to couple support component 520 and support component 600. The base portion 536 also includes an opening 548 extending therethrough proximate to end 522 through which a pin or coupler can be inserted to couple the support component 520 to the body 310 of the case 300.

The extension 538 also includes an engagement portion 528 proximate to end 526. The engagement portion 528 includes a tapered portion that facilitates engagement of the support component 520 by a user, as described below. In other embodiments, the particular configuration of support component 520 can vary.

Referring to FIG. 13, a perspective view of an embodiment of support component 600 is illustrated. In this embodiment, the support component 600 includes a body 610 with side edges 612 and 614 and an inner edge 616 that defines a recess 618. An engagement surface 620 is formed in the body 610 to facilitate access to the engagement portion 528 of support component 520 by a user to move the support 500 from its retracted configuration to an extended configuration. The body 610 includes an inner surface 622 and an outer surface 624 opposite to the inner surface 622 (see FIG. 17) that define a thickness therebetween.

The support component 600 includes an extension 640 with an end portion 642 with an opening 644 therethrough. The end portion 642 also includes a notch 646. Along the inner surface of the extension 640 is a locking member 630 that is engaged with a corresponding locking member on support component 520 as discussed below. The support component 600 includes another extension 660 with an end portion 662 with an opening 664 therethrough. The end portion 662 also includes a notch 666 and a locking member (not shown). Couplers, such as pins, can be inserted through the openings 644 and 664 to couple support component 600 to support component 520. As discussed in greater detail below, the body 610 has an end 602 slidably coupled to the body 310 of the holder 300 and an end 604 that is pivotally coupled to support component 520.

Referring to FIGS. 14 and 15, the support 500 is illustrated in its retracted position or configuration 502. The support 500 has an outer surface 501 that together with the outer surface 324 of the body 310 forms a substantially continuous outer surface for the holder 300. Support component 520 is illustrated in FIG. 14 and support component 600 is illustrated in FIG. 15. As shown, coupling member 366 has a length that extends to an outer edge 376. The coupling member 366 has a curved configuration that curves around an edge of an electronic device. The edge 376 is located proximate to the front surface of the electronic device, but does not cover any of the front surface. As a result, the coupling member 366 provides protection for the electronic device by being located in the corner area, which is the portion of the electronic device that has the highest incidence of contacting a surface or object when the electronic device is dropped. In addition, because the edge 376 extends slightly above the plane of the front surface of the electronic device, protection is provided to the electronic device in the event that the front surface of the electronic device is oriented downwardly when dropped. Since the edge 376 does not cover the front surface of the electronic device, a user has full access to the front surface and can easily wipe the front surface clean. Coupling members 362, 364, and 368 are similarly configured to coupling member 366 and have edges 372, 374, and 378, respectively, that are configured the same as edge 376.

Figure 17:
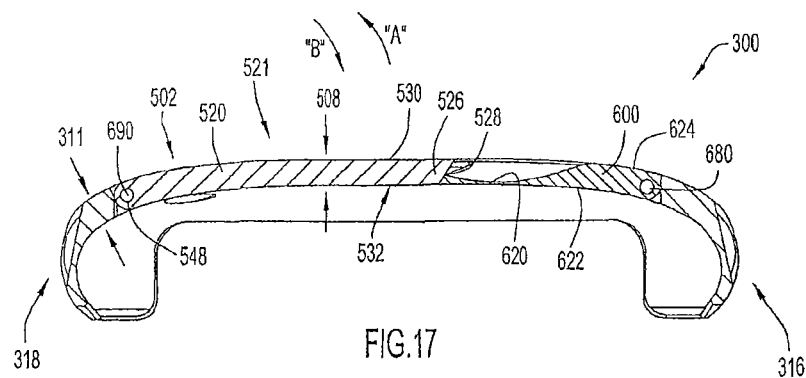
FIG. 17 illustrates a cross-sectional view of the holder illustrated in FIG. 11 taken along the line "17-17."

Referring to FIGS. 16 and 17, cross-sectional views of the holder 300 taken along the respective lines illustrated in FIG. 11 are shown. In FIG. 16, a length-wise cross-sectional view of the holder 300 is taken from end 312 to end 314. In FIG. 17, a side-to-side cross-sectional view of the holder 300 is taken from side 316 to side 318.

As shown in FIG. 16, the support 500 is disposed within the body 310 of the holder 300. In particular, the support 500 is disposed within the opening 328 defined by edge 326 in the plate 320 of body 310. The support 500 includes the extensions 640 and 660 of support component 600 and extension 530 of support component 520 which are all located within the profile of the body 310 of the holder 300 and in particular, within the opening 328. The outer surface 501 of the support 500 and its components is substantially continuous with the outer surface 324 of the body 310 and collectively, the surfaces 501 and 324 form a continuous or substantially continuous outer surface of the holder 300.

Referring to FIG. 17, a different view of the components of the support 500 is illustrated. The support component 520 has a thickness 508 that is defined by the inner surface 532 and the outer surface 530 of the support component 520. The body 310 has a thickness 311. The support component 520 is coupled to the plate 320 or body 310 by a pin 690 that is inserted through opening 548. The pin 690 allows the support component 520 to move or pivot relative to the body 310. Accordingly, the pin 690 defines an axis of rotation for the support component 520.

In FIG. 17, the proximity of the engagement surface 620 of support component 600 to engagement portion 528 of support component 520 is illustrated. The engagement surface 620 is recessed or has a concave configuration to allow a portion of a finger of a user to contact and engage portion 528 to move support component 520 along the direction of arrow "A" about pin 690 to an extended position. When the support 500 is to be collapsed, the support component 520 can be moved along the direction of arrow "B" about pin 690 to its retracted position 502 shown in FIG. 17. Support component 600 is coupled to the body 310 by a pin 680 that extends through an opening in the support component 600 and engaged with a slot in the body 310, as discussed below.

Referring to FIGS. 18-26, the holder 300 is illustrated in a deployed or use configuration. In this configuration, the support 500 of the holder 300 is placed in an extended configuration 504. As shown in FIG. 18, each of the support components 520 and 600 has moved relative to the body 310 from the configuration illustrated in FIGS. 9-17. In FIG. 18, the support component 520 is shown in an extended position 523. The support component 520 is moved from its retracted position 521 (see FIG. 17) around axis 580 defined by pin 690 along the direction of arrow "C" to its extended position 523. When the support component 520 is in this position, the outer surface 530 of the support component 520 engages a support surface 301 to prop up and support the body 310 of the holder 300 and any electronic device coupled to the holder 300. The range of motion of the support component 520 around axis 580 can vary.

As the support component 520 pivots about axis 580, the pivoting connection between the support components 520 and 600 results in support component 600 moving about axis 582 along the direction of arrow "D" relative to support component 520. Axis 582 is defined by the pins that couple the support components 520 and 600 together. In an alternate embodiment, axis 582 could be defined by a living hinge that would mate support components 520 and 600 together.

Figure 19:
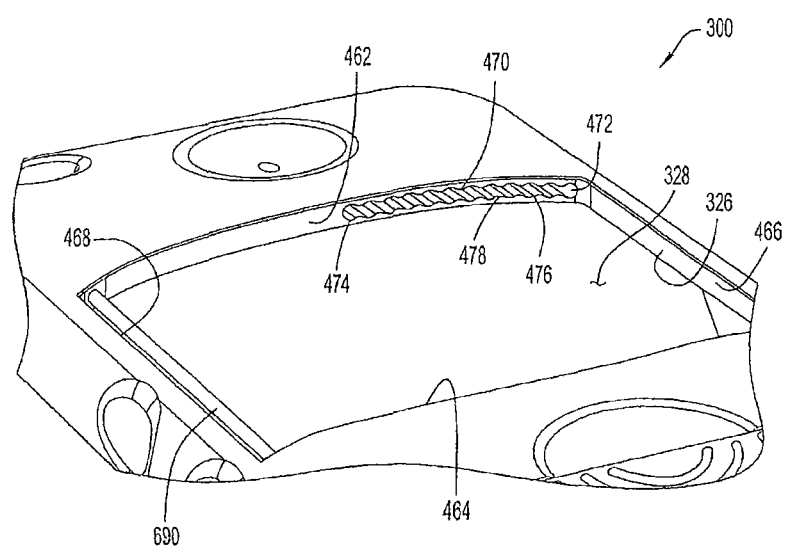
FIG. 19 illustrates a close-up view of some of the components of the holder illustrated in FIGS. 9 and 18.

Referring to FIGS. 18 and 19, the edge 326 that defines opening 328 includes several side walls 462, 464, 466, and 468 that define the opening 328. The body 310 of the holder 300 includes a positioning mechanism that includes slots formed in side walls of the body 310. As shown, side wall 462 includes a slot 470 with ends 472 and 474 and a surface 476 extending between the ends 472 and 474 defining the upper and lower sides of the slot 470. Referring to FIG. 19, the surface 476 includes several projections or ridges 478 formed on the upper and lower portions of the surface 476. Similarly, side wall 464 includes a slot (not shown) with opposite ends and several projections or ridges formed therealong. Each of the projections or ridges 478 defines a position for pin 690 and as a result, defines a position for the support 500. As shown, more than three positions for the support 500 are defined by the quantity of the ridges 478. Referring back to FIG. 18, the end 602 of support component 600 is slidably coupled to the plate 320 via pin 680 that engages slot 470 on side wall 462 and the corresponding slot on side wall 464. The pin 680 engages the projections 478 which help retain the pin 680 in a particular location along the slot 470 along with the friction between the pin 680 and the surfaces of the slot 470. Also shown in FIG. 19 is the pin 690 that pivotally couples or mounts support component 520 to the body 310.

Referring to FIG. 18, as support component 520 rotates along the direction of arrow "C," end 602 of support component 600 moves toward an extended position 603 along the direction of arrow "E" which is determined by the direction and configuration of the slots in the side walls 462 and 464. In one embodiment, the slots in the side walls 462 and 464 have a slightly curved configuration. The curved configuration of the slots changes the frictional force that is applied to the pin 680. The varying force and the projections in the slots enable support components 520 and 600 to be retained in a variety of positions relative to the body 310, thereby enabling the support or support stand to support the holder 300 at different angles and orientations relative to a support surface.

Figure 20:
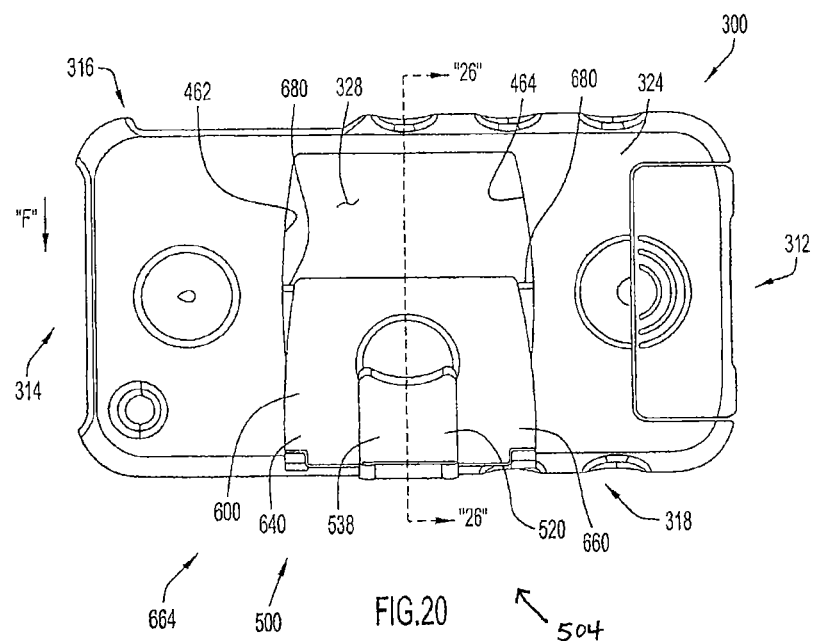
FIG. 20 illustrates a rear view of the holder illustrated in FIG. 18.
Figure 21:
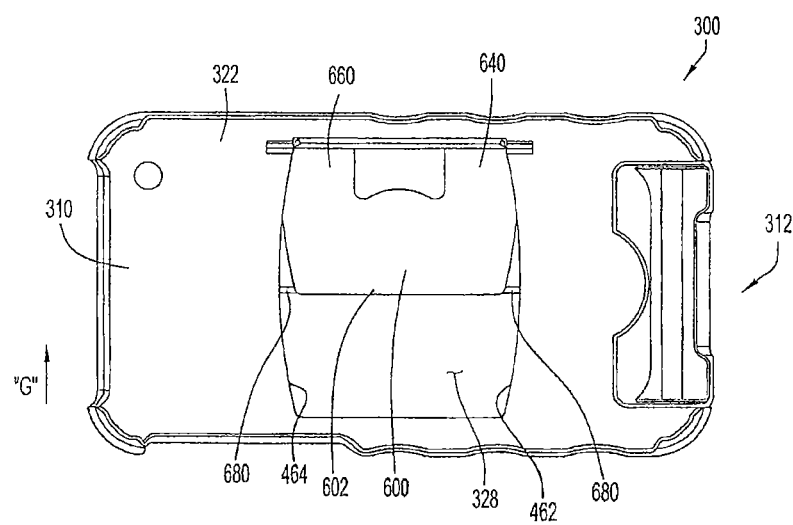
FIG. 21 illustrates a front view of the holder illustrated in FIG. 18.
Figure 22:
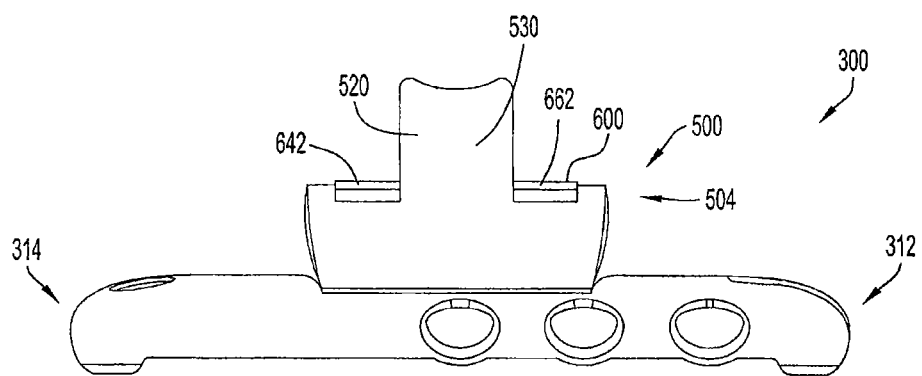
FIG. 22 illustrates a side view of the holder illustrated in FIG. 18.
Figure 23:
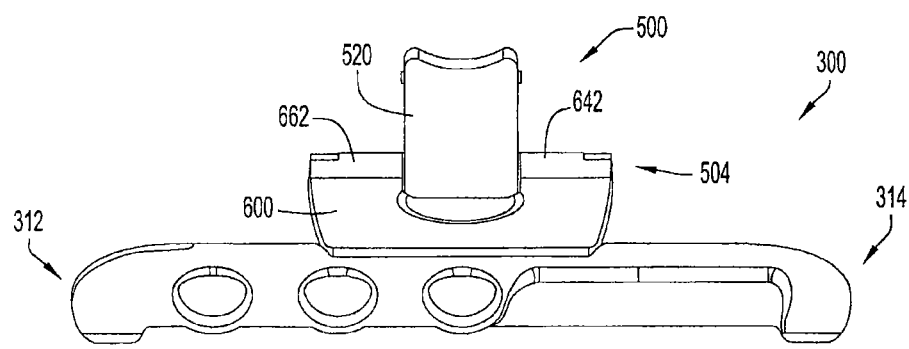
FIG. 23 illustrates another side view of the holder illustrated in FIG. 18.

Referring to FIGS. 20 and 21, rear and front views of the holder 300 with the support 500 in its extended configuration 504 are illustrated, respectively. The pin 680 that engages the side walls 462 and 464 is shown and has been moved along the direction of arrow "F" in FIG. 20 and the direction of arrow "G" in FIG. 21. When the support components 520 and 600 move to their positions associated with extended configuration 504, a portion of the opening 328 is exposed as shown. Referring to FIGS. 22 and 23, left and right side view of the holder 300 with the support 500 in its extended configuration 504 are illustrated.

Figure 24:
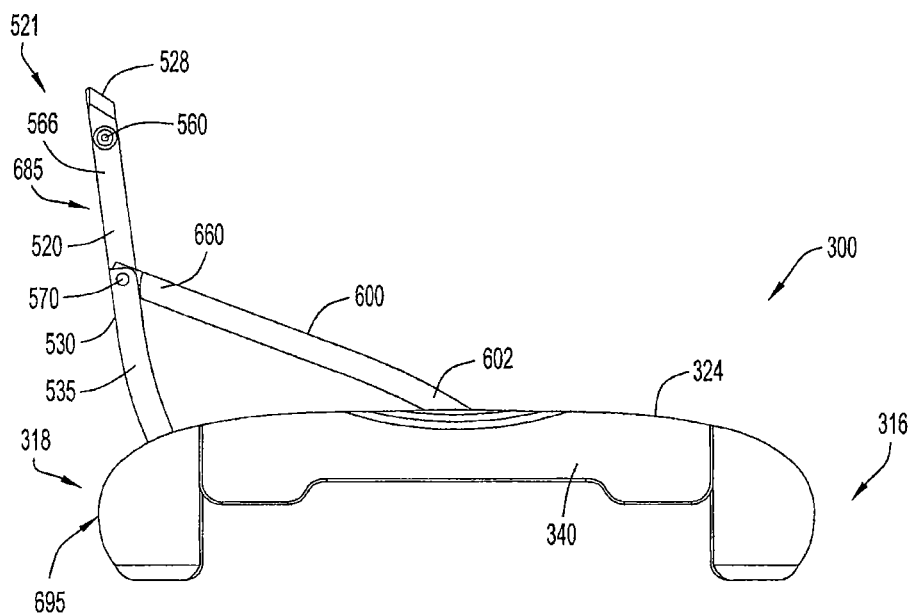
FIG. 24 illustrates an end view of the holder illustrated in FIG. 18.
Figure 25:
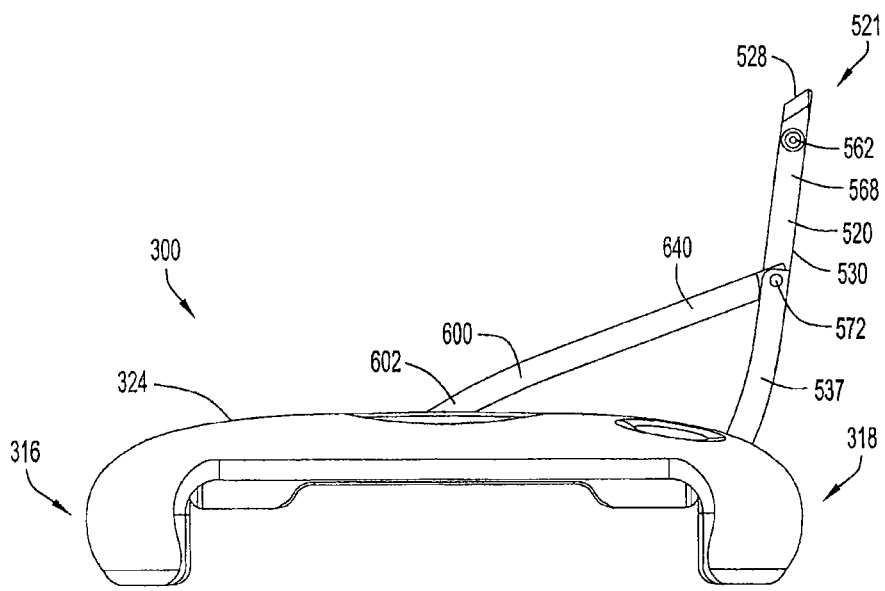
FIG. 25 illustrates another end view of the holder illustrated in FIG. 18.

Referring to FIGS. 24 and 25, opposite end views of the holder 300 with the support 500 in its extended configuration 504 are illustrated. As shown in FIGS. 24 and 25, the support component 520 includes opposite side walls 535 and 537 for base portion 536 and opposite side walls 566 and 568 for extension 538. The side walls 566 and 568 include locking members 560 and 562, respectively. In this embodiment, each locking member 560 and 562 is a recess formed in the corresponding side wall 566 or 568. Each of the recesses 560 and 562 is configured to receive a corresponding projection on support component 600 when the support components 520 and 600 are placed in their retracted positions. As shown in FIG. 24, the support component 520 is placed in its extended position 521. The support component 600 is coupled to support component 520 by pins 570 and 572. The outer surface 530 forms a contact area or surface 685 that contacts a support surface along with contact area or surface 695.

Referring back to FIG. 18, support component 600 includes a locking member 630 that engages with locking member 562 on support component 520 and an opposite locking member (not shown) that engages with locking member 560 on support component 520. The locking members on support component 600 are projections that engage the recesses 560 and 562. In an alternative embodiment, the structure and the configurations of the locking members on the support components 520 and 600 can be reversed so that support component 520 includes projections and support component 600 includes corresponding recesses.

Figure 26:
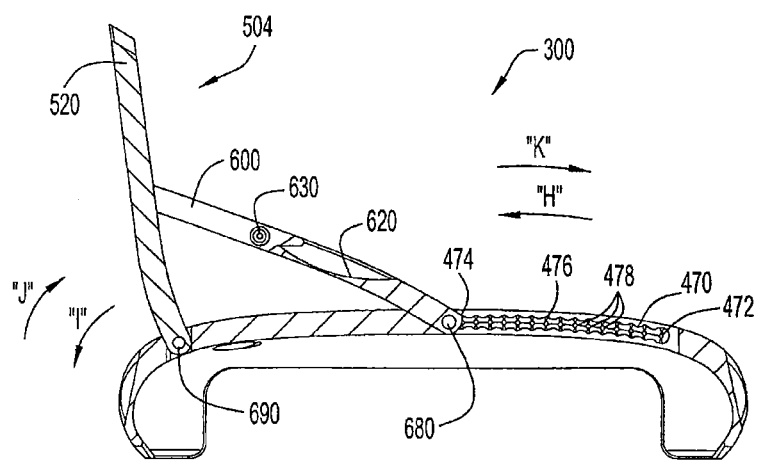
FIG. 26 illustrates a cross-sectional end view of the holder illustrated in FIG. 20 taken along the line "26-26."

Referring to FIG. 26, a cross-sectional view of the holder 300 with the support 500 in its extended configuration 504 shown in FIG. 20 is illustrated. In this view, the details of slot 470 are illustrated. Slot 470 has opposite ends 472 and 474 and a surface 476 extending therealong. The surface 476 includes several projections or ridges 478 disposed along the surface 476. The pin 680 is moved along the slot 470 along the direction of arrow "H" as shown. At the same time, support component 520 moves about pin 690 along the direction of arrow "I." In this view, locking member 630, in this embodiment a projection, on support component 600 is illustrated. To collapse the support 500, support component 520 is moved along the direction of arrow "J" about pin 690 and pin 680 moves along slot 470 along the direction of arrow "K."

Figure 26A:
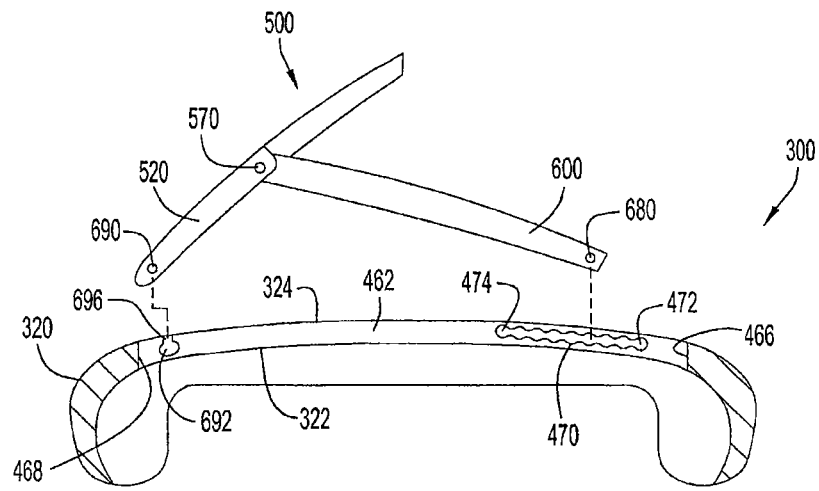
FIG. 26A illustrates a partial cross-sectional end view of the holder illustrated in FIG. 20.
Figure 26B:
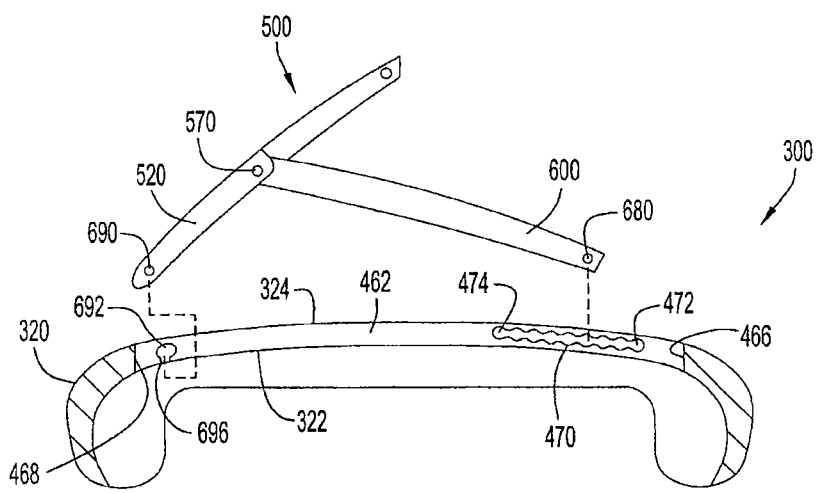
FIG. 26B illustrates a partial cross-sectional end view of an alternative embodiment of the holder illustrated in FIG. 20.
Figure 26C:
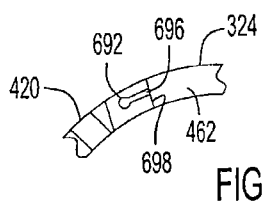
FIG. 26C illustrates a partial cross-sectional end view of a portion of an alternative embodiment of the holder illustrated in FIG. 20.

Referring to FIGS. 26A-26C, several different embodiments of a base plate 320 are illustrated and the assembly of the support 500 to the holder 300 is described. Referring to FIG. 26A, the base plate 320 of the holder 300 including side walls 462, 466, and 468 defining opening 328 is illustrated.

As previously described, side wall 462 includes a slot 470 with opposite ends 472 and 474. The side wall opposite side wall 462 includes a similar slot formed therein. Proximate to side wall 468, side wall 462 includes an opening 696 that leads to a notch or receptacle 692. The width of the opening 696 is smaller than the width of the notch 692. In the embodiment, illustrated in FIG. 26A, the opening 696 leading to notch 692 is located on the outer surface 324 of the base plate 320. The side wall 468 opposite to side wall 462 has a similarly configured opening and notch arrangement that is used in the same manner as opening 696 and notch 692.

When the support 300 illustrated in FIG. 26A is to be assembled, support components 520 and 600 are coupled together and moved proximate to the opening 328 in the base plate 320. Initially, the pin 680 (or if more than one, the pins 680) coupled to support component 600 is connected to the base plate 320 and in particular, to the slots 470 in the base plate 320. One end of the pin 680 coupled to support component 600 is inserted into the slot 470. The support component 600 is moved at an angle relative to the base plate 320 so that the opposite end of the pin 680 can be inserted into the slot 470 formed in the opposite side wall 468. After support component 600 is slidably coupled to the base plate 320, support component 520 is then coupled to the base plate 320.

As previously described, support component 520 includes a pin 690 that is coupled thereto. In one embodiment, the pin 690 extends outwardly from opposite sides of the support component 520. The pin 690 can be inserted or snapped into the opening 696, which is sized slightly smaller than the diameter of the pin 690, and then moved into the notch 692. The pin 690 is retained in the notch 692 due to the smaller width of the opening 696. However, if sufficient force is applied to the support 500, the pin 690 can be dislodged and separated from the base plate 320 by moving through the opening 696 without damaging the base plate 320. Similarly, the opposite end of the pin 690 is inserted or snapped into an opening corresponding to opening 696 and moved to a notch corresponding to notch 692 formed in side wall 468.

Thus, when the support components 520 and 600 are coupled to the base plate 320, the connection between the connector or pin 680 is a slidable connection along the slot 470. As a result, the second support component 600 is slidable along the base plate 320 with some rotational movement about pin 680 as well as the connector 680 slides along the body 310. In addition, the connection between the connector or pin 690 is a pivotable connection. The first support component 520 rotates about the connector or pin 690 simultaneously as the connector 680 slides in the slot 470.

Referring to FIG. 26B, the coupling of the support components 520 and 600 to the base plate 320 is similar to that illustrated in FIG. 26A except that the opening 696 and notch 692 are oriented so that the opening 696 is located along the inner surface or face 322. In this embodiment, pin 690 can be moved proximate to the inner surface 322 and inserted or snapped into place in the notch 692. Alternatively, as shown in FIG. 26C, a separate wall 698 can be formed along a portion of the side wall 462. In this embodiment, the opening 696 and notch 692 are oriented so that the opening 696 is located along that wall 698. In this coupling implementation, the pin 690 is moved proximate to wall 698 and inserted into the opening 696 and the notch 692.

In each of the embodiments illustrated in FIGS. 26A-26C, the support component 600 is initially coupled to the base plate 320 via the slots 470 and the support component 520 is subsequently coupled to the base plate 320 via notches 692.

Figure 29:
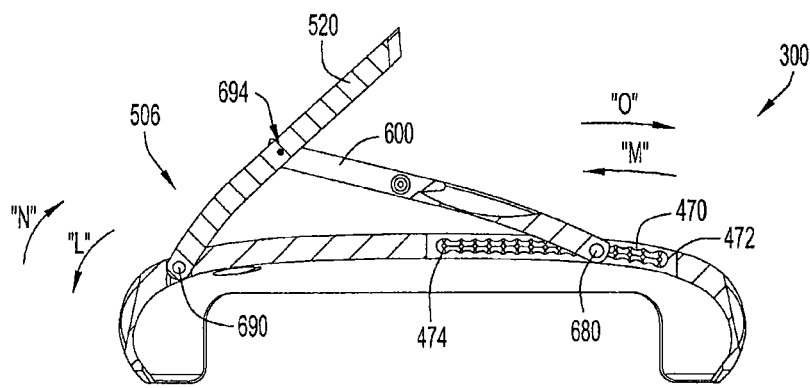
FIG. 29 illustrates a cross-sectional end view of the holder illustrated in FIG. 27 taken along the line "29-29."
Figure 27:
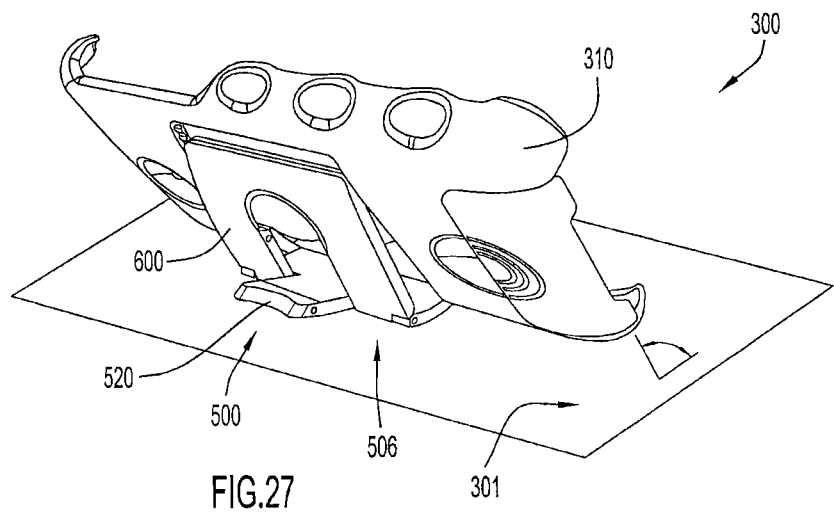
FIG. 27 illustrates a rear perspective view of the holder illustrated in FIG. 9 with its support in another deployed configuration.
Figure 28:
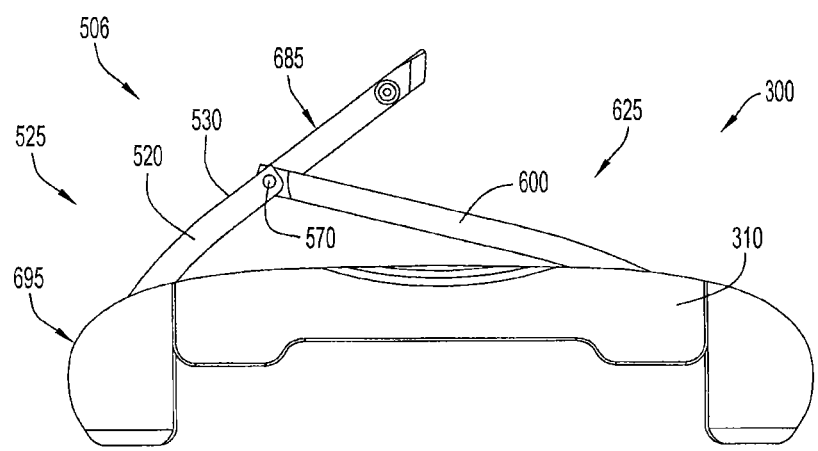
FIG. 28 illustrates an end view of the holder illustrated in FIG. 27.

Referring to FIGS. 27-29, the holder 300 is illustrated in a different deployed or use configuration. In this configuration, the support 500 of the holder 300 is placed in an extended configuration 506. Compared to extended configuration 504 illustrated in FIG. 18, the support 500 is positioned so that it extends outwardly less than extended configuration 506 and as a result, the angle between front surface of the electronic device on holder 300 and the support surface 301 is different.

As shown in FIG. 27, each of the support components 520 and 600 has moved relative to the body 310. The support component 520 is shown in an extended position 525 and support component 600 is shown in an extended position 625 (see FIG. 28). When the support 500 is in this extended configuration 506, the contact areas or surfaces 685 and 695 (see FIG. 28) are positioned to engage the support surface 301 at a different angle than in extended configuration 504. Referring to FIG. 29, the support component 520 is moved from its retracted position 521 around axis 580 defined by pin 690 along the direction of arrow "L" to its extended position 525.

Referring to FIG. 29, a cross-sectional view of the holder 300 with its support 500 in its extended configuration 506 shown in FIG. 27 is illustrated. The pin 680 moves along the slot 470 along the direction of arrow "M" when the support component 520 moves along the direction of arrow "L." To collapse the support 500, support component 520 is moved along the direction of arrow "N" about pin 690 and pin 680 moves along slot 470 along the direction of arrow "O." Axis 694 in FIG. 29 is the axis about which support components 520 and 600 move relative to each other.

Figure 30:
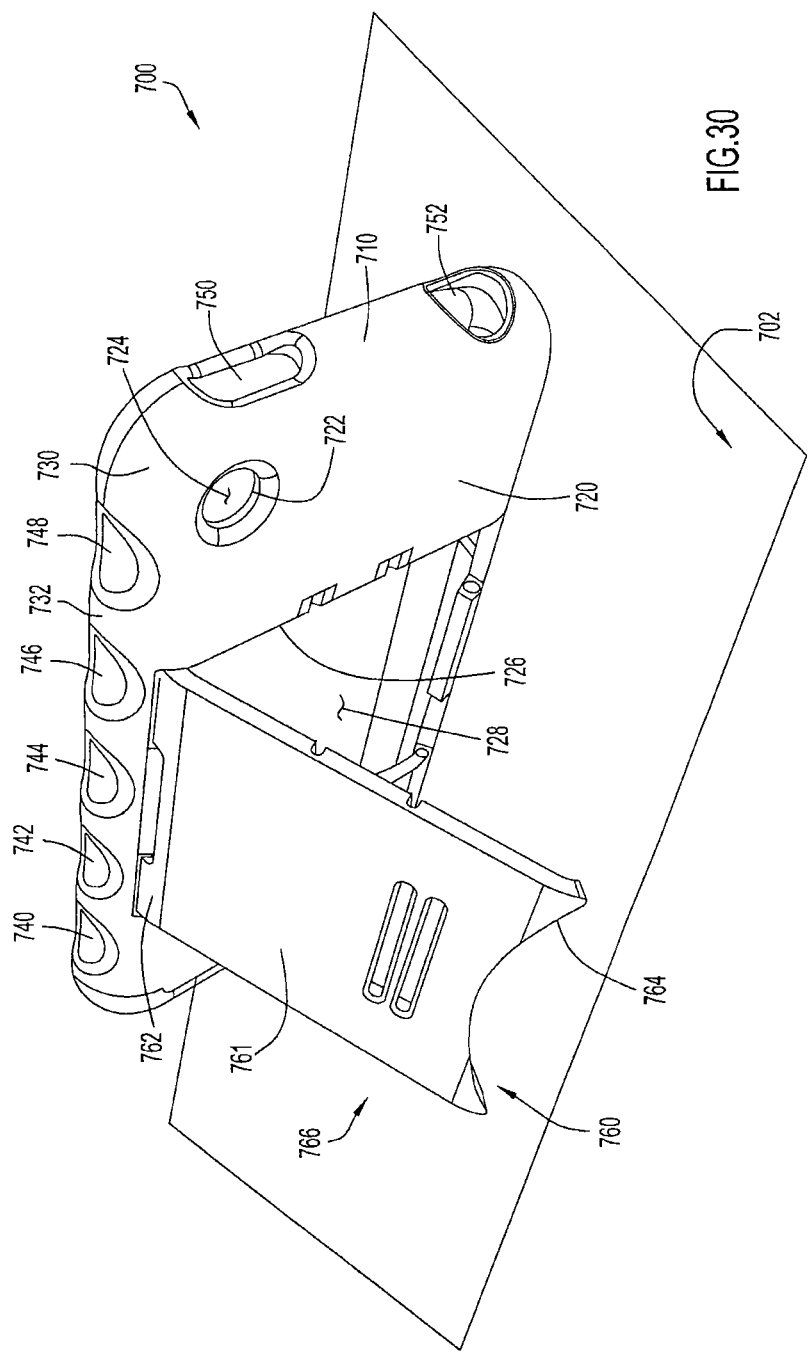
FIG. 30 illustrates a rear perspective view of an alternative embodiment of a holder.

Referring to FIG. 30, an alternative embodiment of a holder is illustrated. In this embodiment, the holder 700 includes a body 710 that includes a base plate or back plate 720 with an edge 722 defining an opening 724. The opening 724 can be positioned so that when an electronic device is coupled to the holder 700, the camera eye of the electronic device is aligned with the opening 724. The plate 720 also includes an edge 726 that defines an opening 728.

In this embodiment, the body 710 includes a coupling mechanism 730 that includes a wall 732 that extends around a portion of an electronic device. The wall 732 includes several openings 740, 742, 744, 746, and 748 that facilitate the gripping of the holder 700 by a user. In addition, the wall 732 includes several other openings (such as openings 750 and 752) that allow access to ports on the electronic device.

The holder 700 includes a support or support portion 760 that is used to support the body 710 relative to a support surface 702. The support portion 760 includes a support component 761 with a mounted end 762 and a distal or free end 764. The mounted end 762 is coupled to the body 710 to pivotally mount the support component 761 to the body 710. The support portion 760 is illustrated in a deployed configuration 766 in FIG. 30. When the support component 761 is moved to its retracted position, the support component 761 is disposed within the body 710 and in particular, within the opening 728.

Referring to FIGS. 30A and 30B, some components of an alternative embodiment of the holder 700 illustrated in FIG. 30 are illustrated. Only a portion of the support 760 is illustrated for ease of reference. The support 760 includes a support component 761 with an end 762 and an end surface 763. In this embodiment, extending from a side wall of the support component 761 is a pin or projection 765 that is formed separately and coupled to the support component 761 by being inserted into a hole or opening on the side of the support component 761. A similar pin or projection (not shown) extends from the opposite side of the support component 761. In an alternative embodiment, the pin 765 may extend through the support component 761 through an opening extending from side-to-side. In another embodiment, each of the pins 765 is integrally molded with the support component 761.

The base plate 720 includes several edge portions that define the opening 728 with only edge portions 726A and 726B illustrated for ease of reference in FIG. 30A. Edge portion 726A includes a positioning mechanism 729 as shown. The positioning mechanism 729 can be used to hold and retain the support component 761 in multiple different extended positions relative to the base plate 720. For example, the support component 761 can be moved a little distance outwardly from the base plate 720 to prop the holder 700 and its associated electronic device at a more upright angle relative to a support surface. Alternatively, the support component 761 can be moved outwardly a farther distance to prop the holder 700 and its associated electronic device at a more reclined angle relative to a support surface.

Referring to FIG. 30B, a close-up view of edge portion 726A of the base plate 720 is illustrated. The base plate 720 includes a front or inner surface 727 and a rear or outer surface 725 between which the opening 728 extends. The edge portion 726A includes an opening 731 formed therein. The opening 731 is configured to receive the pin 765 and to allow the pin 765 to rotate, thereby rotatably supporting the support component 761.

The positioning mechanism 729 includes cooperating components on the base plate 720 and the support component 761 that facilitate the positioning of the support component 761 in several positions relative to the base plate 720. In one embodiment, the support component 761 includes a projection or nub that can engage one of several recesses formed on the base plate 720. In an alternative embodiment, the support component 761 includes a recess that can be engaged by one of several nubs or projections formed on the base plate 720.

Referring to FIG. 30B, the support component 761 includes a nub or projection 769 and the base plate 720 includes several recesses 733, 735, and 737 formed therein. The recesses 733, 735, and 737 are formed to receive the projection 769 and positively retain the projection 769 to hold the support component 761 in a particular extended position relative to the base plate 720. While three recesses 733, 735, and 737 are illustrated, any quantity of recesses may be formed on edge portion 726A.

When the pin 765 is inserted into opening 731, the support component 761 can be rotated about pin 765 along the direction of arrow "AA" to an extended position and along the direction of arrow "AB" to a retracted position. In this embodiment, recess 733 is located so that when nub 769 engages the recess 733, the support component 761 is retained in its retracted position relative to the base plate 720. The engagement of nub 769 with recess 735 maintains the support component 761 in an extended position and the engagement of nub 769 with recess 737 maintains the support component 761 in a greater extended position relative to the base plate 720.

Referring to FIGS. 30C and 30D, an alternative embodiment of a positioning mechanism is illustrated. Only a portion of the edge portion 726A in this embodiment is illustrated for ease of reference. The edge portion 726A of the base plate 720 includes a shoulder 745 that defines an opening 741 that is configured to receive a pin, such as pin 765, on the support component 761. When pin 765 is inserted into opening 741, the support component 761 is rotatably mounted to the base plate 720.

The edge portion 726A also includes a positioning mechanism 739. In this embodiment, the positioning mechanism 739 includes several notches or recesses 743 formed therein that between them form teeth 747. The notches 743 and teeth 747 extend around the perimeter of the shoulder 745. Similarly configured notches and teeth are formed on a side wall of the support component 761 and engageable with the notches 743 and teeth 747 on the edge portion 726A. As a result, when the support component 761 is rotated about pin 765 relative to the base plate 720, the teeth and notches on each of the support component 761 and the edge portion 726A engage each other and form a ratcheting mechanism that can be used to retain the support component 761 in a particular position relative to the base plate 720. In an alternative embodiment, the sets of notches and teeth do not extend all of the way around the shoulder 745.

Figure 31:
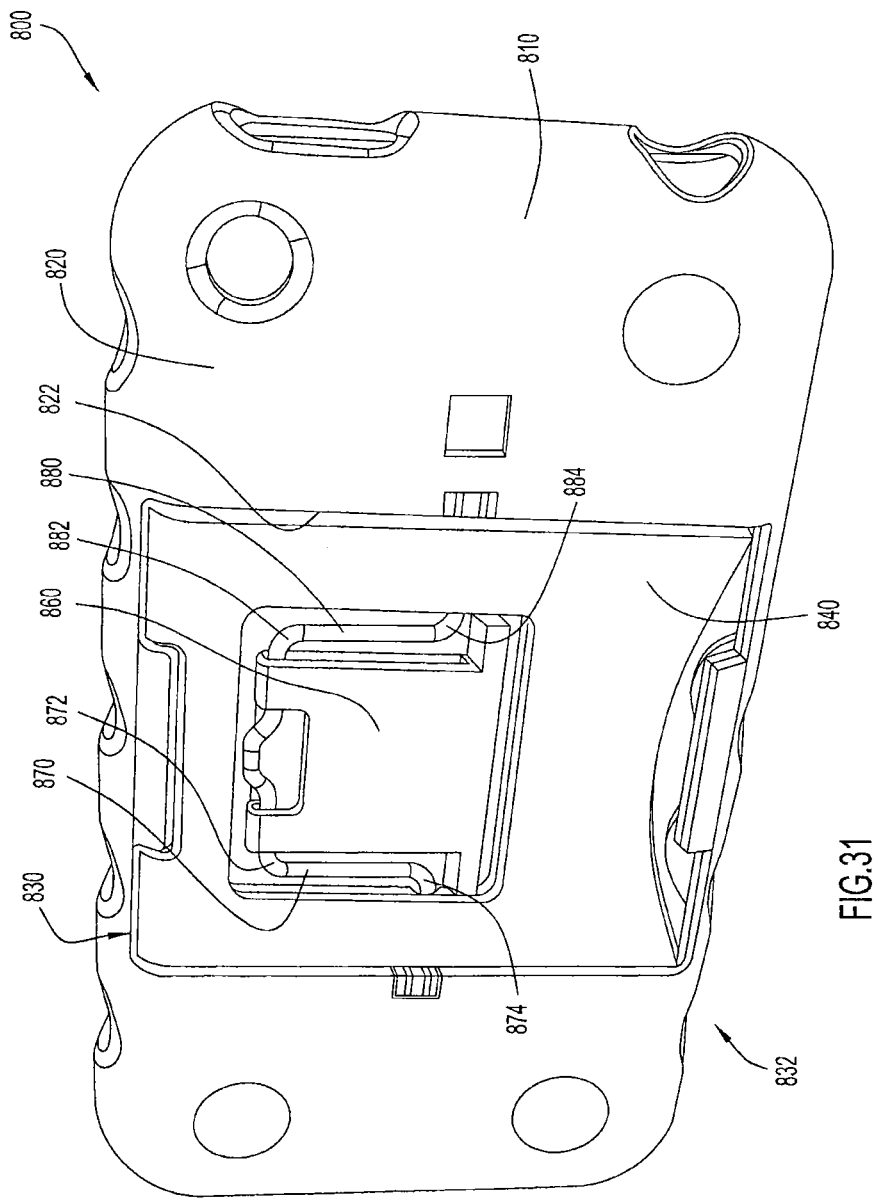
FIG. 31 illustrates a rear perspective view of an alternative embodiment of a holder with its support in a retracted configuration.
Figure 32:
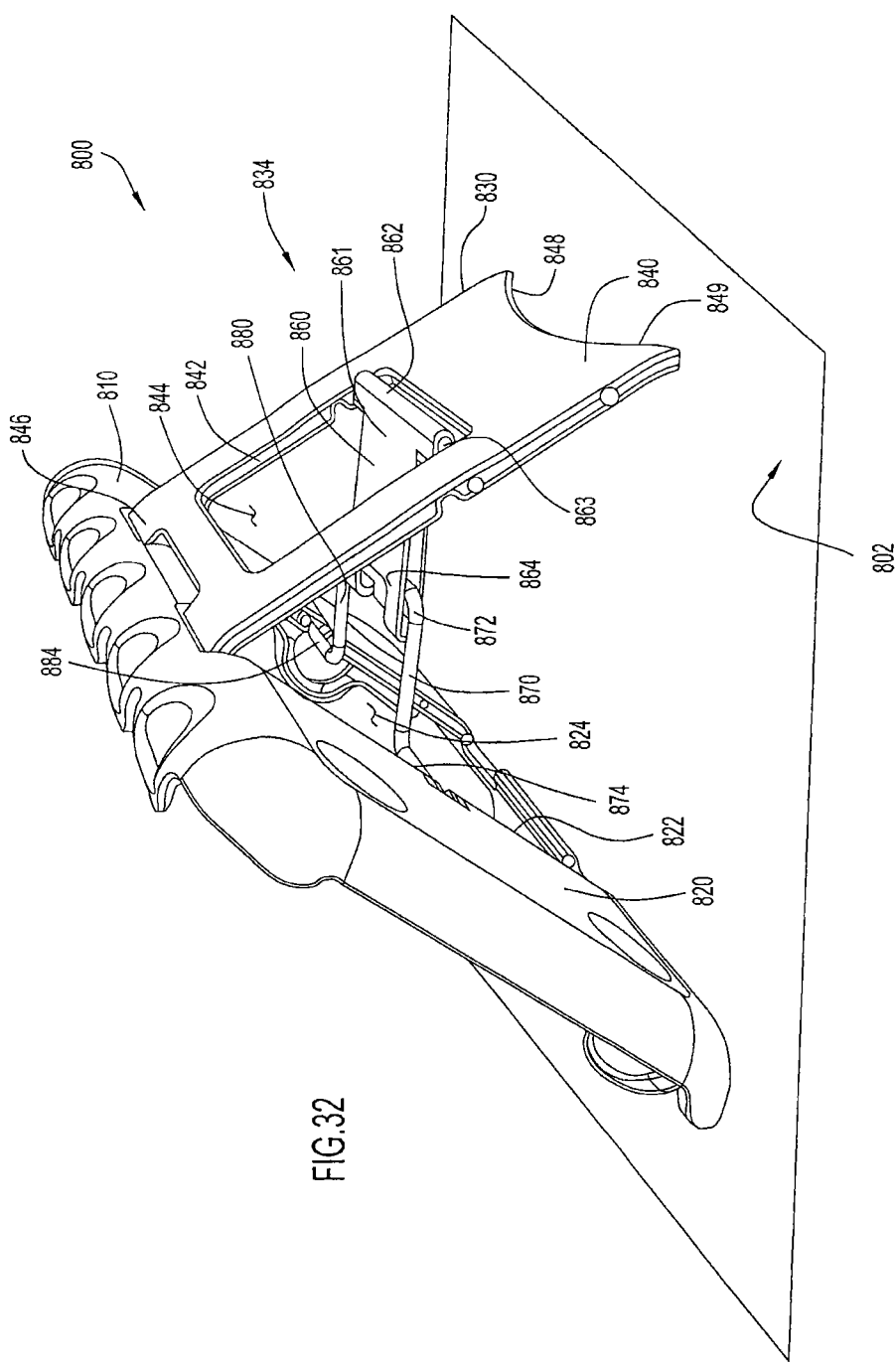
FIG. 32 illustrates a rear perspective view of the holder illustrated in FIG. 31 with its support in a deployed configuration.

Referring to FIGS. 31 and 32, an alternative embodiment of a holder is illustrated. In this embodiment, the holder 800 includes a body 810 that has a back plate 820 with an edge 822 that defines an opening 824 (see FIG. 32). The holder 810 includes a support or support portion 830 that can be placed in a retracted or collapsed configuration 832 and in an extended or deployed configuration 834. The support 830 can be used to support the holder 800 relative to a support surface 802.

In this embodiment, the support 830 includes a support component 840 and a linking component 860. The linking component can also be referred to as a support component. The support component 840 includes an edge 842 that defines an opening 844 that extends through the support component 840. The support component 840 includes a mounting end 846 that is coupled to the body 810 by a pin (not shown) and an opposite contact end 848 that is configured to engage a support surface 802. The contact end 848 includes a recessed portion 849 that has a curved configuration.

The linking component 860 includes a body 861 that has an end 862 that is pivotally coupled to the support component 840 by a pin 863. The other end 864 of the linking component 860 includes two arms 870 and 880 coupled thereto. Arm 870 has an end 872 that is pivotally coupled to the body 861 and an opposite end 874 that is pivotally coupled to the body 810 of the holder 810. Similarly, arm 880 includes ends 882 and 884. End 882 is coupled at one end to the body 861 and at its other end 884 to body 810 of the holder 800. The ends 874 and 884 of the arms 870 and 880 are pivotally coupled to the body 810 and the arms 870 and 880 pivot about their respective ends. When the linking component 860 is disposed in its substantially horizontal position illustrated in FIG. 32, the arms 870 and 880 are secured in place by grooves on the body 861 and the linking component 860 maintains the support component 840 in a particular position relative to the remainder of the body 810.

Figure 33:
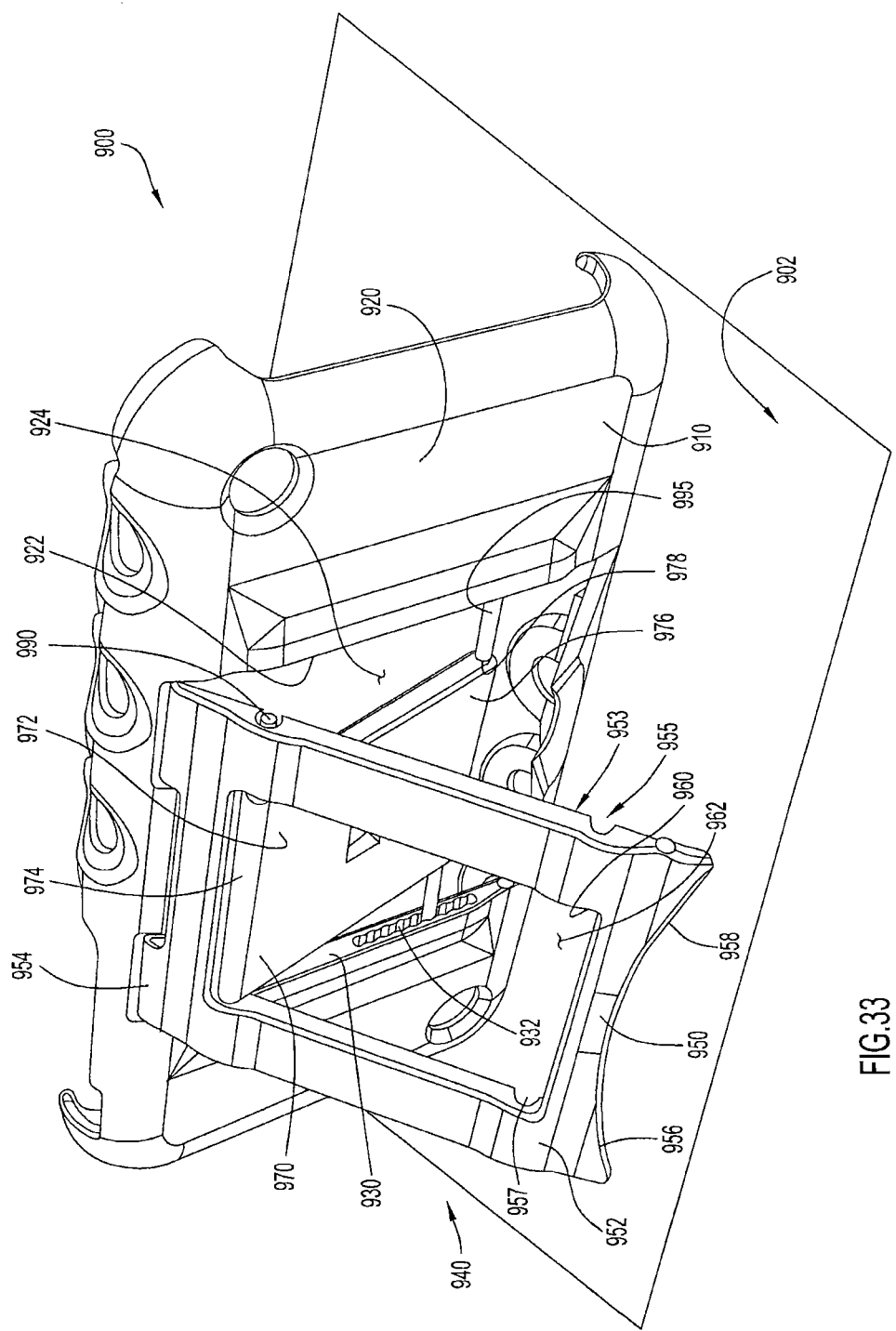
FIG. 33 illustrates a rear perspective view of an alternative embodiment of a holder with its support in a deployed configuration.

Referring to FIG. 33, an alternative embodiment of a holder is illustrated. In this embodiment, the holder 900 includes a body 910 with a plate 920 that has an edge 922 that defines an opening 924. The edge 922 includes a side wall 930 that has a slot 932 formed therein with projections. A corresponding slot (not shown) is formed in the side wall (not shown) that is opposite to side wall 930.

The holder 900 has a support 940 that can be used to support the holder 900 relative to a support surface 902. The support 940 includes a support component 950 that has a body 952 with opposite ends 954 and 956. End 954 is pivotally coupled to the body 910 by a pin (not shown). End 956 is configured to engage a support surface 902 and may include a curved or recessed portion 958. The body 952 includes an edge 960 that defines an opening 962 within the body 952. In different embodiments, the size and configuration of the opening 962 can vary.

The support 940 includes an additional support component 970 that has a body 972 with opposite ends 974 and 976. End 974 is pivotally coupled to the body 952 of support component 950 by a pin 990 that is inserted through openings formed in the support components 950 and 970. End 976 is coupled to the body 910 of the holder 900 by a pin 995 that extends through opening 978 of the support component 970 and into slot 932 in side wall 930 and the corresponding slot in the side wall opposite to side wall 930. The pin 995 can slide along the slots in the side walls and is retained in particular positions in the slots based on friction and the engagement of the pin 995 with the projections in the slots.

Referring to FIG. 33, in this embodiment, the body 952 of the support member 950 has an inner surface 953 that includes slots or grooves 955 and 957 formed therein. The grooves 955 and 957 are configured to receive the exposed portions of the pin 995 on opposite sides of the support component 970 when the support components 950 and 970 are moved to their retracted positions. As a result, support component 950 can be moved to a retracted position within the body 910 of the case 900.

Figure 34:
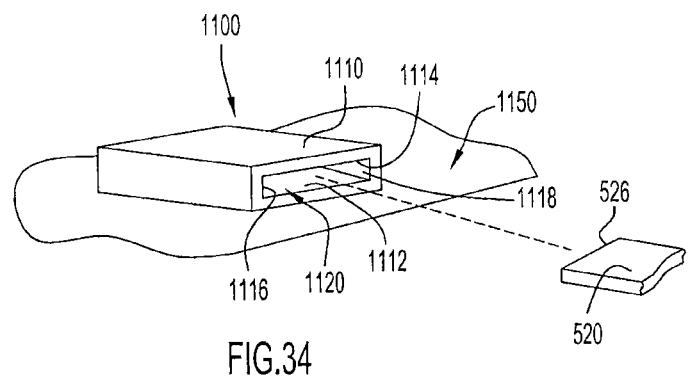
FIG. 34 illustrates a perspective view of an embodiment of an attachment mechanism for coupling a support to a surface.
Figure 35:
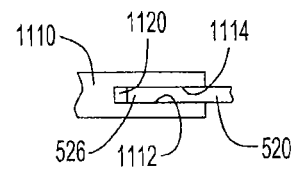
FIG. 35 illustrates a cross-sectional side view of the attachment mechanism illustrated in FIG. 34 being coupled to the support.

Referring to FIGS. 34-35, an embodiment of an attachment mechanism that can be used to couple a support to a surface, such as a surface of a vehicle such as an automobile, a bicycle, etc. The attachment mechanism 1100 is coupled to a surface 1150.

In one embodiment, the surface 1150 is a surface of a vehicle, such as a dashboard for the vehicle. The attachment mechanism 1100 can integrally formed with the surface 1150. Alternatively, the attachment mechanism 1100 can be formed separately from the surface 1150 and coupled to the surface 1150 using any conventional technique or component, such as an adhesive, friction fit, or a fastener or coupler.

The attachment mechanism 1100 includes a body 1110 with several inner walls 1112, 1114, 1116, and 1118 that collectively define a receptacle 1120. The receptacle 1120 can have any shape or configuration in various embodiments. The body 1110 can be formed of molded plastic or similar material.

As shown in FIG. 35, the distal end 526 of support component 520 can be inserted into the receptacle 1120. The distal end 526 can be retained in the receptacle 1120 via friction. In an alternative embodiment, the distal end 526 can be retained in the receptacle 1120 via a locking mechanism, such as a cooperating set of a projection and a recess on opposite surfaces. When the support component 520 is inserted into the receptacle 1120, the holder 300 with support component 520 is held in place and supported relative to support surface 1150. If the frictional contact between the attachment mechanism 1100 and the support component 520 is sufficient, the attachment mechanism 1100 can be oriented at any angle and will still be able to hold and support the support component 520 and its associated holder. Accordingly, a user can view and use the electronic device held by holder 300 and supported relative to surface 1150.

The surface 1150 can be any surface relative to which a user would like to use the electronic device. In one embodiment, the surface 1150 can be a top or front of the dashboard surface in an automobile. In another embodiment, the surface 1150 can be a surface of a bicycle, motorcycle, stroller for infants, computer monitor, desk, table, article of furniture, briefcase or smaller piece of luggage. The attachment mechanism 1100 can be molded plastic, formed metal or any other similar material.

Figure 36:
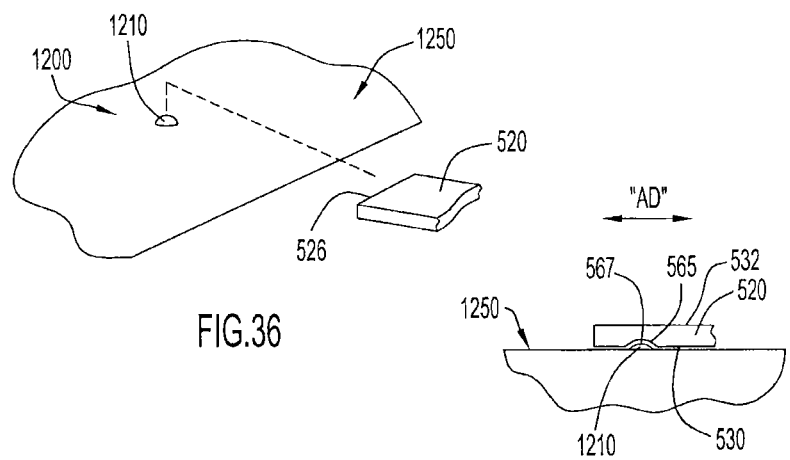
FIG. 36 illustrates a perspective view of an alternative embodiment of an attachment mechanism for coupling a support to a surface.
Figure 37:
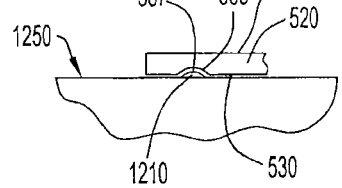
FIG. 37 illustrates a cross-sectional side view of the attachment mechanism illustrated in FIG. 36 being coupled to the support.

Referring to FIGS. 36 and 37, another embodiment of an attachment mechanism is illustrated. In this embodiment, a surface relative to which the electronic device can be used is illustrated as surface 1250. Similar to surface 1150, surface 1250 can be any type of surface. The surface 1250 includes an attachment mechanism 1200. In one embodiment, the attachment mechanism 1200 includes a nub or protrusion 1210 that is integrally formed with the surface 1250 and extends outwardly from the surface 1250. In an alternative embodiment, the hub or protrusion 1210 is separately formed and subsequently coupled to the surface 1250 using any conventional technique, such as an adhesive. The nub 1210 can be molded plastic or any other similar material.

Referring to FIG. 37, the arrangement of the support component 520 relative to the surface 1250 is illustrated. In this embodiment, the support component 520 has an outer surface 530 and an inner surface 532. The outer surface 530 includes a recess 567 that is defined by a surface 565. The recess 567 is sized to receive the nub 1210 and eliminate movement of the support component 520 along the directions of arrows "AD." The engagement of the hub 1210 with the recess 567 maintains the support component 520 and its associated holder in a fixed position relative to the surface 1250. Accordingly, a user can view and use the electronic device held by holder 300 and supported relative to surface 1250.

Figure 38:
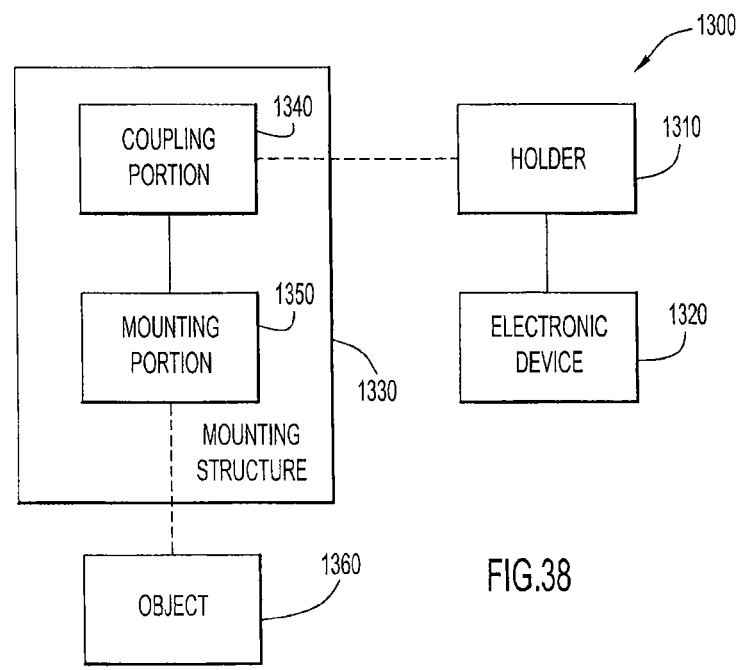
FIG. 38 illustrates a schematic diagram of an embodiment of a mounting structure useable with a holder.

Referring to FIG. 38, a schematic diagram of an embodiment of a system is illustrated. In this embodiment, the system 1300 includes a holder 1310 to which an electronic device 1320 can be coupled. The holder 1310 includes a support (not shown) that can be repositioned relative to the holder 1310 to support the holder 1310 and the electronic device 1320 at various angles relative to a support surface.

A mounting structure 1330 can be used with the holder 1310 to mount the holder 1310 to an object 1360. For example, a user may want to mount the holder 1310 to an object 1360 proximate to the user, such as an article of clothing or an accessory such as a belt. The mounting structure 1330 includes a coupling portion 1340 that couples the holder 1310 to the mounting structure 1330 and a mounting portion 1350 that mounts the mounting structure 1330 to the object 1360. While one embodiment of a mounting structure is illustrated in FIG. 39, in different embodiments, the mounting structure may have different configurations and features.

Figure 39:
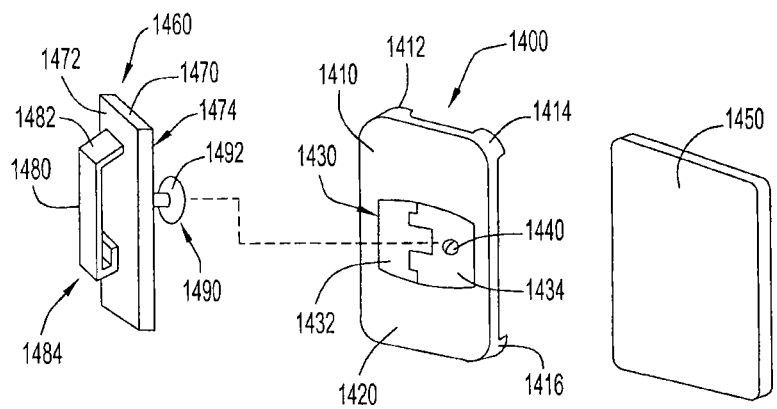
FIG. 39 illustrates a perspective view of an embodiment of a mounting structure useable with a holder.

Referring to FIG. 39, the holder 1400 includes a body 1410 to which an electronic device 1450 can be coupled using coupling members 1412, 1414, and 1416. The holder 1400 includes a repositionable or reconfigurable support 1430 that can be used to support the holder 1400 relative to a support surface. The support 1430 is movable relative to the base plate 1420 and includes support component 1432 and support component 1434 that are coupled together and movable relative to each other. In this embodiment, one of the support components 1432 and 1434 includes an opening 1440 formed therein. The opening 1440 can extend through the particular support component, which in the embodiment illustrated in FIG. 39, is support component 1434.

Also illustrated is an embodiment of a mounting structure 1460 that can be used to mount the holder 1400 to an object such as a belt, article of clothing, or other structure. The mounting structure 1460 includes a body 1470 with opposite surfaces or sides 1472 and 1474. Coupled to side 1472 is a mounting portion or clip 1480 that is configured to be used to mount the body 1470 to the object. The mounting portion 1480 has a coupled end 1482 and a free end 1484. In this embodiment, the mounting portion 1480 is a resilient arm that is coupled to the body 1470. The resilient arm may be made of plastic or molded rubber. The free end 1484 can be moved relative to surface 1472 so that the object, such as a belt, can be inserted between the mounting portion 1480 and the body 1470. In an alternative embodiment, the mounting portion 1480 can be a pivotally mounted arm that is biased into a closed position via a biasing member, such as a spring. The free end of the pivotally mounted arm can be moved away from the body 1470 to accommodate the object and released to mount the mounting structure 1460 to the object. The free of the mounting portion 1480 can be moved away from the body 1470 again so that the object can be removed.

The mounting structure 1460 also includes a coupling portion 1490 that is located proximate to surface 1474 of the body 1470. The coupling portion 1490 includes a projection or protrusion 1492 that can be inserted or snapped into opening 1440 of support 1430 to couple the holder 1400 to the mounting structure 1460. In other embodiments, the positions of the projection 1492 and the opening 1440 can be reversed and the configuration and location of the coupling portion 1490 and opening 1440 can vary provided that a positive engagement between the coupling portion 1490 and the holder 1400 is achieved. In still other embodiments, projection 1492 and opening 1440 can be replaced by hook and loop fasteners. The coupling portion 1490 is configured to allow for the adjustment of the holder 1400 and the electronic device 1450 coupled thereto by the user, such as by spinning the holder 1400 to a desired orientation or position.

In one embodiment, the portions or components of the mounting structure 1460 can be integrally formed. In other embodiments, the portions or components of the mounting structure 1460 can be formed separately and subsequently coupled to each other.

In alternative embodiments, a holder may include multiple supports or support portions. In other embodiments, the configuration of the coupling mechanism of the holder, which couples the holder to an electronic device, can vary.

Figure 40:
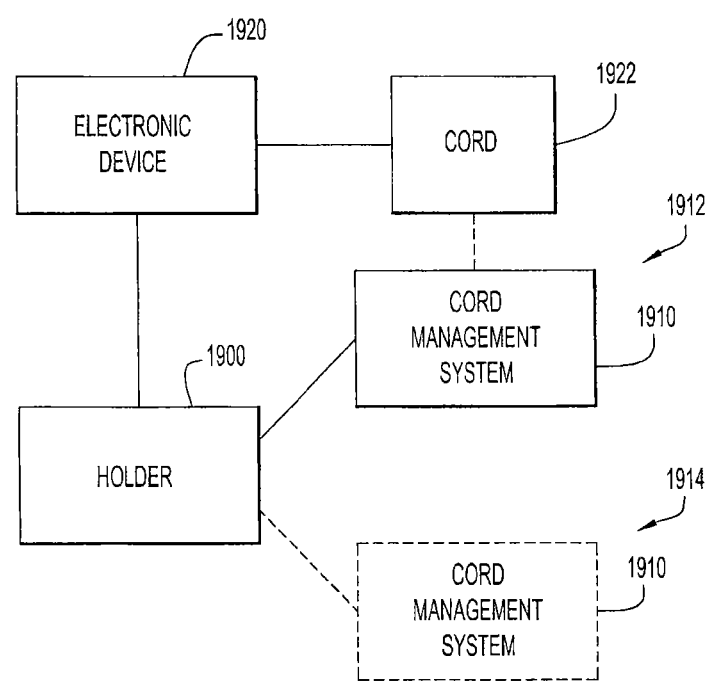
FIG. 40 illustrates a schematic block diagram of a holder with a cord management system according to the invention.

Referring to FIG. 40, a holder 1900 may include a cord management system or mechanism 1910 that can be used to retain a cord 1922 coupled to an electronic device 1920 that is engaged with the holder 1900. In one embodiment, the cord management system 1910 includes a single, fixed engagement member that is coupled to or otherwise forms part of the holder 1900. The cord can be repeatedly wrapped around the fixed engagement member and the plug connected to the cord that is inserted into a jack or port on the electronic device 1920. In another embodiment, the cord management system or mechanism 1910 includes more than one fixed engagement member, such as two fixed engagement members, around which the cord 1922 can be wrapped alternately.

Alternatively, as shown in FIG. 40, the cord management system 1910 can be repositionable, such as being movable from a first position 1912 to a second position 1914. The repositionable member can be referred to as an extendable member. The movement can occur by sliding or translating, rotating or pivoting, flipping. For example, the cord management system 1910 may be movable relative to the holder 1900 between a retracted or first position and a second or extended position. In the retracted position, the cord management system 1910 may be disposed within the holder 1900 and not engageable by the cord 1922. In one embodiment, the cord management system 1910 includes an engagement member that is movably coupled or mounted to the holder 1900. The engagement member can be slidably and/or rotatably mounted to the holder 1900 such that a user can wrap a cord around the engagement member when it is extended and around the plug. In another embodiment, the cord management system 1910 of the holder 1900 may include multiple, extendable engagement members around which the cord can be wrapped.

Figure 40A:
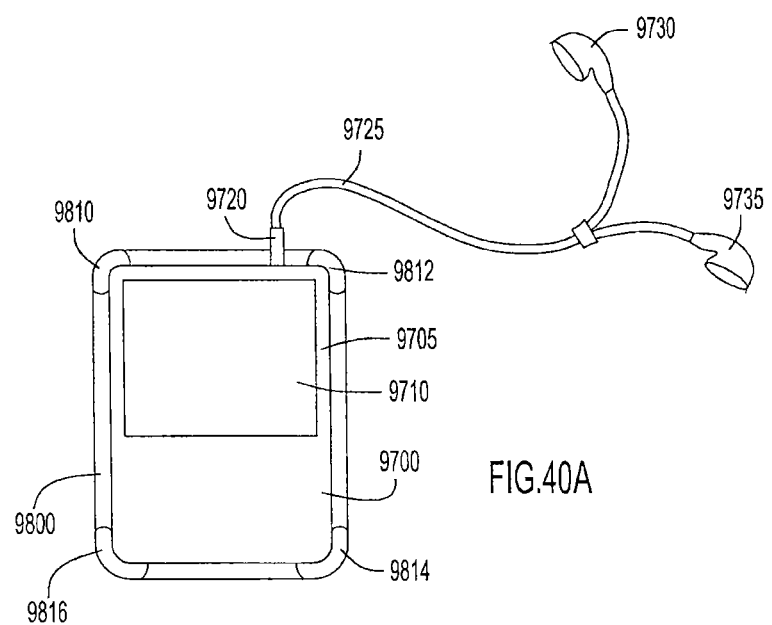
FIG. 40A illustrates an embodiment of a holder and an electronic device according to the invention.
Figure 40B:
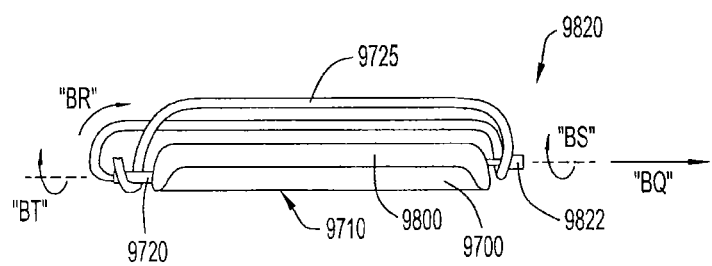
FIG. 40B illustrates an exemplary method of wrapping a cord from an electronic device using the holder illustrated in FIG. 40A.

Referring to FIGS. 40A and 40B, an exemplary implementation of wrapping the cord is illustrated. In this implementation, an electronic device 9700 includes a housing 9705 with a display or screen 9710 and has a holder 9800 coupled thereto via one or more coupling portions 9810, 9812, 9814, and 9816. Headphones or speakers 9730 and 9735 are connected to a cord or wire 9725 which is connected to a plug 9720 that is inserted into a port or jack on the device 9700. When the user does not want to use the headphones 9730 and 9735 any more, the cord management system of the holder 9800 can be used to wrap the cord to reduce the length that it extends from the device 9700 and the holder 9800.

Referring to FIG. 40B, an exemplary cord management system or mechanism 9820 is illustrated. Cord management system 9820 has the basic feature that when it is not in use, the system 9820 does not protrude from or interfere with the use of the device 9700 and the holder 9800 by the user. However, the system 9820 can be moved or reconfigured so that it can be engaged by the cord 9725 when desired in a manner consistent with this disclosure. In this embodiment, the system 9820 includes an extendable member 9822 that can be moved outwardly from the holder 9800. For example, the member 9822 can be moved along the direction of arrow "BQ" to an extended or deployed position.

The cord 9725 can then be moved along the direction of arrow "BR" around member 9822 along the direction of arrow "BS" and then around the plug 9720 along the direction of arrow "BT." The alternate wrapping of the cord 9725 around the member 9822 and the plug 9720 can be repeated until the unwrapped portion of the cord 9725 is short enough to permit the headphones 9730 and 9735 to be tucked underneath one or more of the wrapped portions of the cord 9725, or left dangling.

In an alternative embodiment, the engageable or extendable member 9822 may include a slot or other securing portion that can be used to secure or tie-off the cord 9725.

Figure 41A:
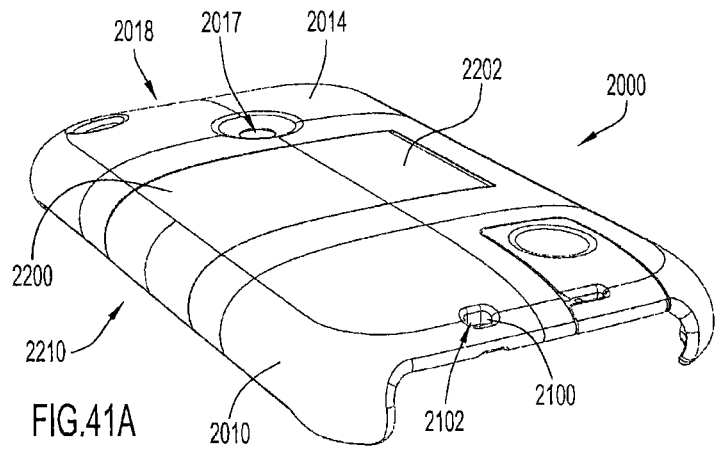
FIG. 41A illustrates an outer perspective view of another embodiment of a holder in a retracted configuration according to the invention.
Figure 41B:
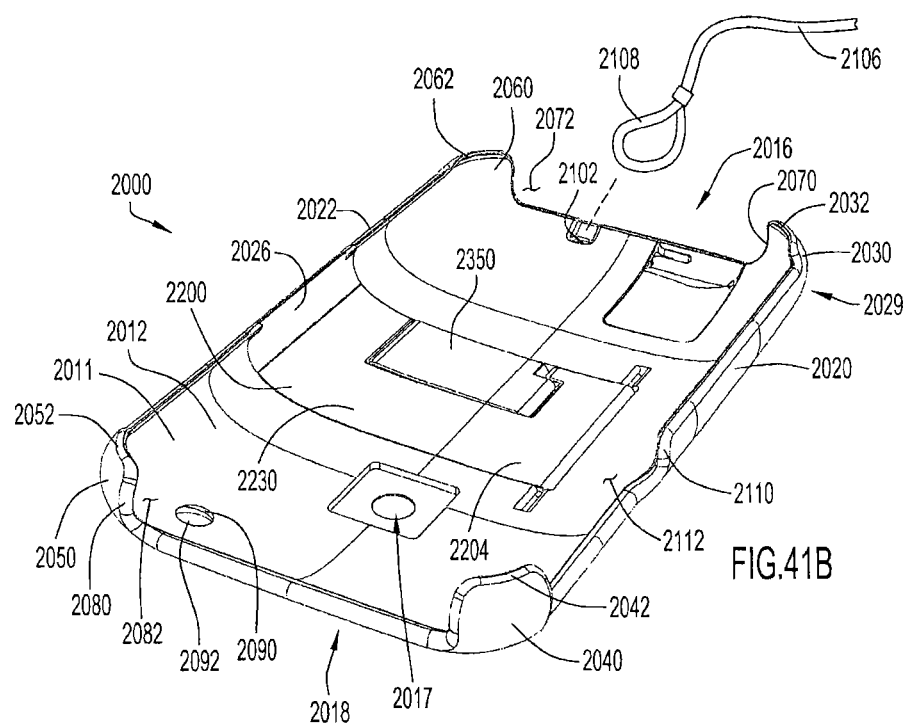
FIG. 41B illustrates an inner perspective view of the holder illustrated in FIG. 41A.

Referring to FIGS. 41A and 41B, perspective views of another embodiment of a case or holder according to the invention is illustrated. In this embodiment, the holder 2000 includes a body or base 2010 that is molded using a plastic material. In an alternative embodiment, the base 2010 of the holder 2000 can be formed of metal or a combination of materials that could include fabric, or rubber. The body or base 2010 can be referred to alternatively as a mounting portion.

The body 2010 has opposite ends 2016 and 2018 and opposite sides 2020 and 2022. The body 2010 includes a rear plate or base plate 2011 that has an inner surface 2012 (see FIG. 41B) and an outer or rear surface 2014 (see FIG. 41A). The inner surface 2012 and the outer surface 2014 of the plate 2011 define a thickness therebetween. As shown in FIG. 41A, the plate 2011 includes an edge 2090 that defines an opening 2092 that is aligned with a camera eye or opening on the electronic device coupled to the holder 2000.

The body 2010 has several notches or openings located along its perimeter. Proximate to end 2018, the body 2010 includes an edge 2080 that defines a notch or open area 2082 that provides access to one or more features or ports on the electronic device coupled to the holder 2000. Similarly, proximate to end 2016, the body 2010 includes an edge 2070 that defines a notch or open area 2072 that provides access to one or more features or ports on the electronic device. Also, the body 2010 includes an edge 2110 along part of the side 2020 that defines a notch or open area 2112.

Figure 49:
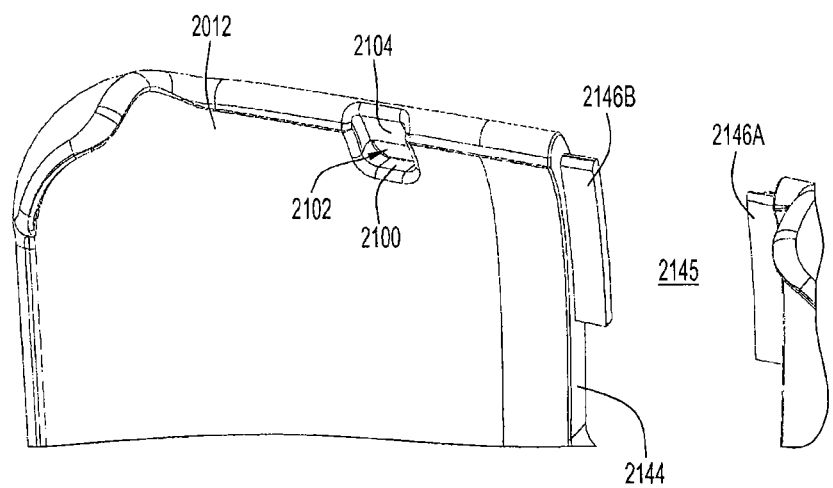
FIG. 49 illustrates an inner perspective view of the portion of the holder illustrated in FIG. 48.

The body 2010 also includes a wrist strap mounting opening 2102 that is defined by edge or wall 2100 as shown in FIGS. 41A and 41B. An end 2108 of a wrist strap 2106 can be inserted into the opening 2102 and looped around itself to couple the wrist strap 2106 to the holder 2000. As best shown in FIG. 49, the body 2010 includes a recessed portion 2104 that has a thickness less than that of the body 2010. The recessed portion 2104 permits a strap to be coupled to the holder 2000 via the opening 2102 and not interfere with the electronic device coupled to the holder 2000. Thus, the strap can be wrapped around the recessed portion 2104 and not prevent the electronic device from being coupled to the holder 2000.

The case 2000 also includes a coupling mechanism 2029 that can be used to couple the case 2000 to an electronic device. The coupling mechanism 2029 is a releasable coupling mechanism so that a user can easily remove the case 2000 from the electronic device when desired. The coupling mechanism 2029 includes at least one coupling member. In this embodiment, the coupling mechanism 2029 includes coupling members 2030, 2040, 2050, and 2060, each of which is located near a corner of the case 2000 and a corner of the electronic device.

As shown, coupling member 2030 has a length that extends to an outer edge 2032. The coupling member 2030 has a curved configuration that curves around an edge of an electronic device. The edge 2032 is located proximate to the front surface of the electronic device, but does not cover any of the front surfaces in a manner similar to coupling member 366 described above. As a result, the coupling member 2030 provides protection for the electronic device by being located in the corner area. Coupling members 2040, 2050, and 2060 are similarly configured to coupling member 2030 and have edges 2042, 2052, and 2062, respectively, that are configured similar to edge 2032.

Referring to FIGS. 41A and 41B, the body 2010 also includes an opening 2017 into which an attachment mechanism can be inserted or otherwise fitted into from the inner surface 2012 or from the outer surface 2014, to enable a mounting structure to be coupled to the body 2010, in a manner similar to that described above with respect to FIGS. 38 and 39. In one embodiment, partially shown in FIGS. 38 and 39, the attachment mechanism can be a snap mechanism that snaps into the body of the case, or alternatively faces away from the body of the case to snap into a mounting structure. In another embodiment, not shown, the attachment mechanism can be slid into a slot formed in that inner sidewall that is opposite to side wall 2120 with respect to opening 2132.

Referring to FIGS. 42-45, the holder 2000 is illustrated in deployed configurations. The holder 2000 is shown in a deployed configuration in a first orientation in FIGS. 42 and 43. The holder 2000 is also shown in a deployed configuration in a second orientation in FIGS. 44 and 45 that is different than the first orientation.

As shown in FIGS. 41A-45, the holder 2000 includes a support or support portion 2200 coupled to the body 2010. The support 2200 can be referred to alternatively as a stand or kickstand assembly. The support 2200 is configured to be used to support the body 2010 at one or more orientations relative to a support surface. The support 2200 is shown in a retracted configuration 2210 in FIGS. 41A and 41B. The support 2200 is shown in a first deployed configuration and orientation 2212 in FIGS. 42 and 43. The support 2200 is shown in a second deployed configuration and orientation 2214 in FIGS. 44-45.

In this embodiment, the support 2200 has an outer surface 2202 (see FIG. 40) and an inner surface 2204 (see FIG. 41). The support 2200 includes two support components 2230 and 2350. As discussed in detail below, support component 2230 is coupled to the body 2010 and to support component 2350 and the support component 2350 is coupled to the body 2010 and to support component 2230. The support 2200 is illustrated in a retracted or collapsed configuration in FIGS. 41A-41B.

Figure 44:
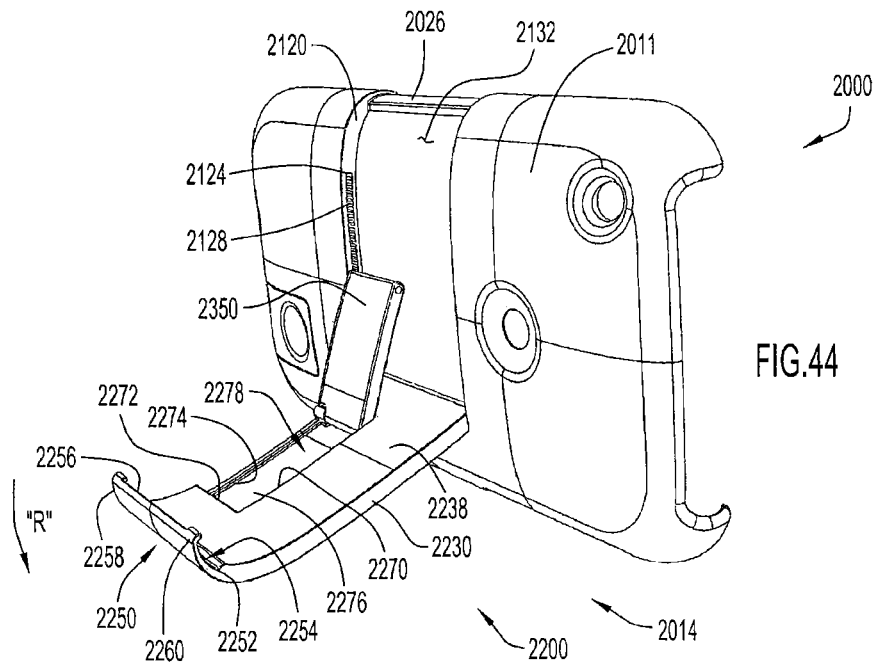
FIG. 44 illustrates an outer perspective view of the holder illustrated in FIG. 41A in another deployed configuration.
Figure 45:
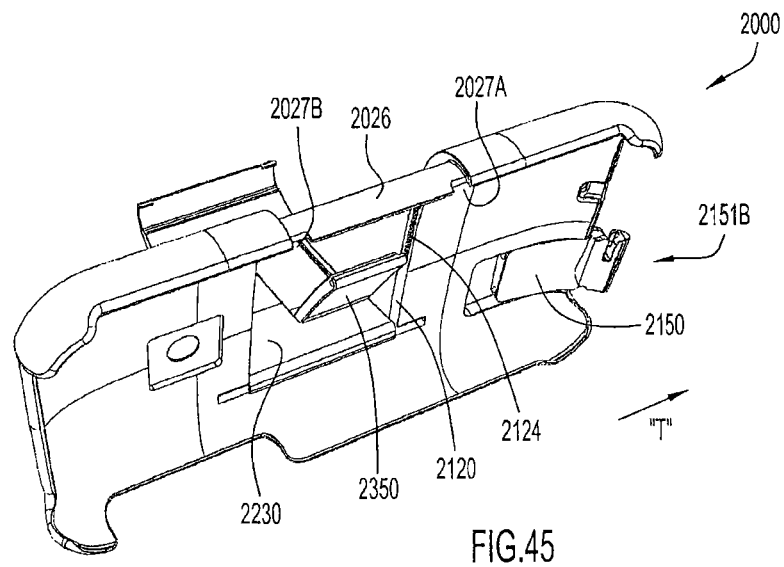
FIG. 45 illustrates an inner perspective view of the holder illustrated in FIG. 44.
Figure 47:
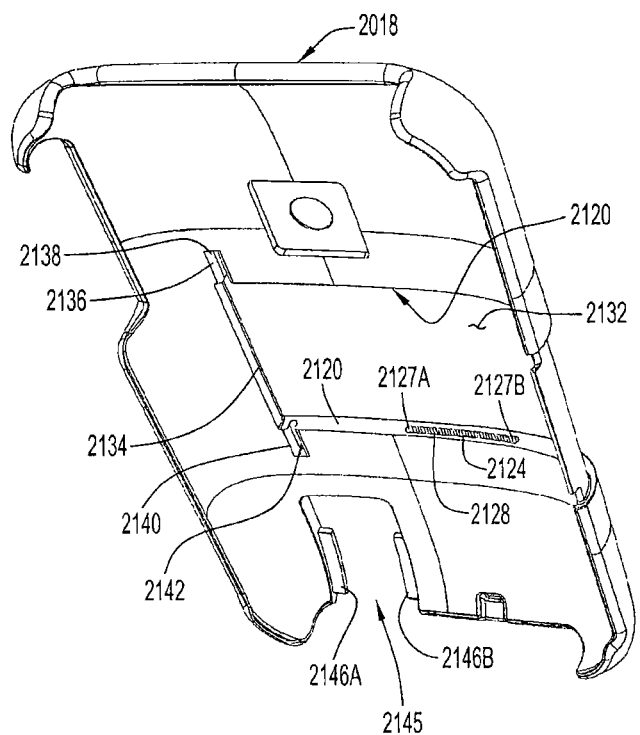
FIG. 47 illustrates an inner perspective view of the holder illustrated in FIG. 41A with its support portion removed.

Referring to FIGS. 44, 45, and 47, the plate 2011 includes edges or walls that collectively define an opening 2132. In this embodiment, the opening 2132 is substantially centrally located on the plate 2011. However, in other embodiments, the opening 2132 may be offset along the plate 2011 and may have a different shape or configuration than opening 2132.

Opening 2132 is defined by side wall 2120 (see FIG. 44), side wall 2122 (see FIG. 47), end wall 2134 (see FIG. 47), and connector 2026 (see FIG. 44). The body 2010 of the holder 2000 includes a positioning mechanism that includes slots formed in side walls of the body 2010. As shown, side wall 2120 includes a slot 2124 with opposite ends 2127A and 2127B and a surface that includes several projections or ridges 2128 formed on the upper and lower portions of the surface. Each of the projections or ridges 2128 defines a position for a pin or connector coupled to the support portion 2000 and as a result, defines a position for the support 2000. As shown, more than three positions for the support 2000 are defined by the quantity of the ridges 2128. In other embodiments, the projections or ridges 2128 may be of a different shape, size, material or frequency, may not have visible shapes, or may only be on one of the upper or lower surfaces.

As shown in FIG. 41B, the components 2230 and 2350 are visible and accessible from the inner side of the case 2000. When the support components 2230 and 2350 are moved to their collapsed or retracted positions, the support components 2230 and 2350 are substantially coextensive with the opening 2132 in the plate 2011 of the body 2010. The support components 2230 and 2350 are sized and configured to collectively mate with the opening 2132.

Referring to FIGS. 43 and 44, support component 2230 includes a body 2231 with a first end 2232 that is pivotally coupled to the plate 2011 and an opposite, second end 2234. The body 2231 includes an inner surface 2238 and an outer surface 2236 that engages a support surface when the holder 2000 is in use. The outer surface 2236 forms a contact surface or area that engages a support surface and is used for support. In this embodiment, the portion of the outer surface 2236 that engages the support surface varies depending on the orientation of the holder 2200. For example, in the orientation shown in FIG. 42, the engagement portion or surface 2240 of the component 2230 that contacts a support surface is close to the distal tip of the end 2234 of the component 2230. The holder 2000 and the device coupled thereto can be flipped over 180.degree. to the configuration illustrated in FIG. 44. Thus, the holder 2000 and the device can be placed in an upside down orientation and in a right-side-up orientation. In the orientation shown in FIG. 44, the engagement portion or surface 2242 of the component 2230 that contact a support surface is on the curved portion of the end 2234 of the component 2230. Accordingly, different surfaces and portions of the component 2230 can be used to engage a support surface depending on the orientation of the holder 2000.

As shown in FIG. 43B, component 2230 includes an opening 2280 formed proximate to end 2232. Referring to FIG. 43, a connector 2244, such as a pin, is inserted through opening 2280 to mount component 2230 to the body 2010 of the holder 2000. Referring to FIG. 47, on opposite sides of the opening 2132, the body 2010 includes pairs of tapered surfaces 2136 and 2140 that lead to grooves or slots 2138 and 2142, respectively. After the connector 2244 is inserted into the component 2230, the connector 2244 can be engaged with the tapered surfaces 2136 and 2140 and pressed into the slots 2138 and 2142.

Referring to FIG. 44, component 2230 includes a coupling portion 2250 that is used to engage the body 2010 of the holder 2000 and retain component 2230 in its retracted position shown in FIG. 41B. As shown, the outer surface of component 2230 is flush with the outer surface of the body 2010 when the component 2230 is in its retracted position.

As shown in FIG. 44, the coupling portion 2250 includes a surface 2252 that defines a recessed area 2254 so that the end portion 2234 of the component 2230 has a smaller thickness as compared to the rest of the component 2230. A distal edge or tip 2256 includes projections 2258 and 2260 spaced apart from each other and located therealong. Referring to FIGS. 44 and 45, the connector 2026 that is coupled to the body 2010 of the holder 2000 has a thickness that is less than the thickness of the body 2010. In addition, the connector 2026 is spaced apart from the outer surface of the body 2010. When component 2230 is moved to its retracted position, the distal edge 2256 and projections 2258 and 2260 slide over the connector 2026 and move until the connector 2026 engages the recessed area 2254 of the component 2230. In this position, the projections 2258 and 2260 engage the notches 2027A and 2027B formed in the connector 2026 (see FIG. 45). The engagement of these projections and notches and the curved configuration of the coupling portion 2250 cooperate to retain component 2230 in its retracted position until a sufficient force is applied to the component 2230 to overcome the engagement with the connector 2026.

As mentioned above, the support 2200 also includes a second component 2350. Referring to FIG. 43A, component 2350 includes opposite ends 2352 and 2354 with an extending portion 2356 at end 2352. In this embodiment, the extending portion 2356 does not extend the width of component 2350. This reduced width facilitates the mounting of component 2350 to component 2230. Component 2350 includes openings 2358 and 2360 extending therethrough proximate to ends 2352 and 2354, respectively. A connector, such as a pin, can be inserted into opening 2358 to couple component 2350 to component 2230 and define an axis 2362. Similarly, a connector, such as a pin, can be inserted into opening 2360 to couple component 2350 to the body 2010 via slot 2124 and define an axis 2364. Component 2350 also includes tapered surfaces 2366 and 2368 that facilitate the repositioning of components 2230 and 2350 by providing clearance.

Referring to FIG. 44, in this embodiment, component 2230 includes a receptacle 2278 formed in part of its inner surface. In particular, walls 2270, 2272, and 2274 and lower surface 2276 collectively form the receptacle 2278 into which component 2350 can be placed when the components 2230 and 2350 are moved to their retracted positions. The receptacle 2278 permits the smaller component 2350 to be placed within the larger component 2230, and in fact, within the profile of the larger component 2230. As a result, neither component 2230 or 2350 interferes with the electronic device that is coupled to the holder 2000 when the holder 2000 is in its collapsed configuration. In addition, both components 2230 and 2350 are within the thickness or the profile of the holder 2000 as shown in FIGS. 41A and 41B.

Referring to FIG. 42, a user can grasp the distal end of component 2230 and pull along the direction of arrow "P" with sufficient force to overcome the engagement of component 2230 with connector 2026. As component 2230 rotates or pivots about axis 2201 defined by a pin, component 2350 rotates relative to component 2230 about the connector that defines axis 2362 (see FIG. 43A). At the same time, the pin defining axis 2364 slides along the direction of arrow "Q" in FIG. 43 in the slot 2124. The pin can be retained in a particular desired position by the ridges 2128 (see FIG. 44) extending into the slot 2124. The angle between the particular engagement surface of component 2230 and the body 2010 can be adjusted as desired. As shown in FIG. 44, component 2230 can be moved along the directions of arrow "R."

Figure 46:
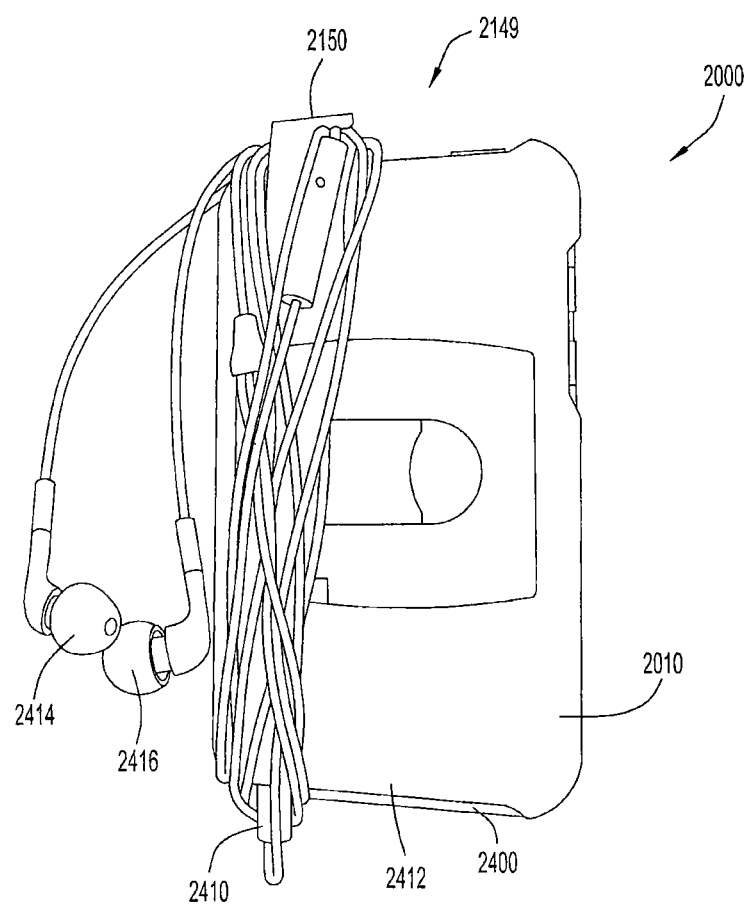
FIG. 46 illustrates a side view of the holder illustrated in FIG. 41A.

As shown in FIG. 46, holder 2000 includes a wire or cord holding mechanism 2149. An exemplary electronic device 2400 is illustrated as being coupled to the body 2010 of the holder 2000. The wire holding mechanism 2149 can be used to hold, retain or tie-off the wire 2412 of headphones 2414 and 2416 that are connected to the device 2400 to prevent the wire 2412 and headphones 2414 and 2416 from being entangled or caught on another object. The wire holding mechanism 2149 includes an extendable member 2150 that is movably coupled to the body 2010 of the holder 2000. The wire 2412 can extend from the plug 2410 that is plugged into the device 2400 and can be wrapped around the extendable member 2150 and the plug 2410 repeatedly until the wire 2412 is a desired length to be slid into an opening or notch formed on extendable member 2150 or otherwise be tucked under the wrapped cord. As a result, the wire 2412 is prevent from hanging loose from the device 2400 and the headphones 2414 and 2416 are maintained proximate to the holder 2000 and device 2400.

Referring to FIG. 43, the extendable member 2150 is illustrated in its retracted position 2151A in which the member 2150 is located within the profile of the holder 2000. Referring to FIG. 45, the member 2150 can be pulled along the direction of arrow "T" to its extended position 2151B. In this position 2151B, the extendable member 2150 can be used to receive and manage the headphone cord or wire 2414.

Figure 48:
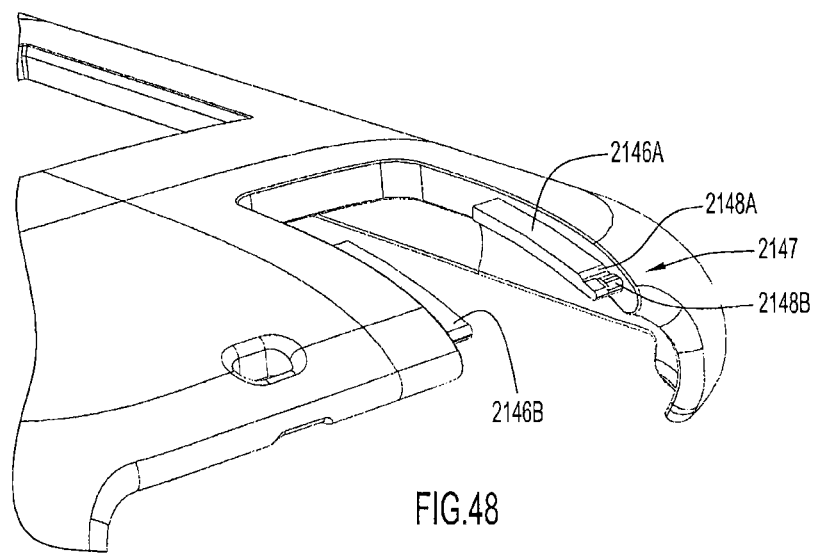
FIG. 48 illustrates a close-up perspective view of a portion of the holder illustrated in FIG. 47 with which a cord management feature can be used.

Referring to FIGS. 47-49, the body 2010 includes a side wall 2144 that defines an opening 2145 proximate to end 2016. Guides 2146A and 2146B extend into the opening 2145 from opposite side walls. Guide 2146B includes a coupling mechanism 2147 that is used to keep the extendable member 2150 coupled to the body 2010. The coupling mechanism 2147 includes a recessed portion 2148A and a projection 2148B that is engaged by the extendable member 2150.

Figure 50:
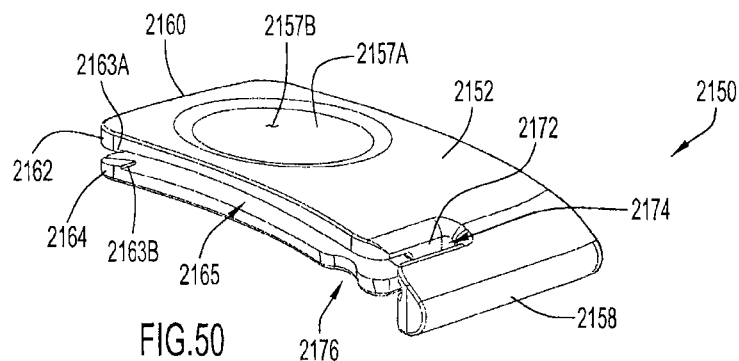
FIG. 50 illustrates a perspective view of a cord wrap member of the holder illustrated in FIG. 41A.
Figure 51:
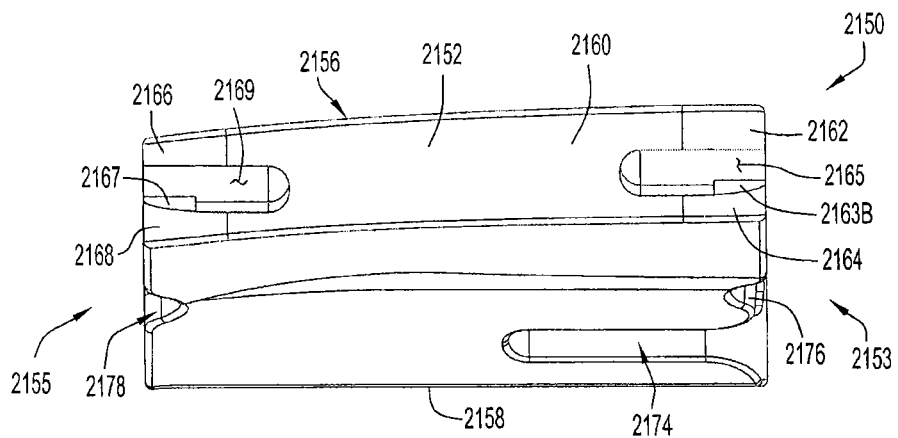
FIG. 51 illustrates an end view of the cord wrap member illustrated in FIG. 50.
Figure 52:
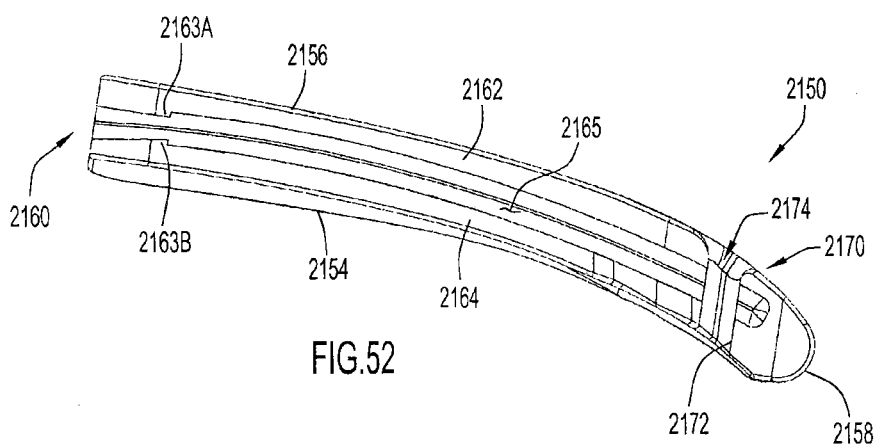
FIG. 52 illustrates a side view of the cord wrap member illustrated in FIG. 50.

Referring to FIGS. 50-52, the extendable member 2150 is illustrated in detail. In this embodiment, the extendable member 2150 includes a body 2152 with opposite sides 2153 and 2155 that slide along the opposite walls defining the opening 2145 in the body 2010. The body 2152 has an inner surface 2154 directed inwardly toward the electronic device and an outer surface 2156. The outer surface 2156 has a tapered or curved configuration that matches the tapered or curved configuration of the outer surface of the body 2010 of the holder 2000 when the extendable member 2150 is in its retracted position 2151A. The outer surface 2156 includes a small surface 2157A that defines a recess or recessed portion 2157B that can be engaged by a finger of a user to move the extendable member 2150 relative to the body 2010 (see FIG. 50). The recess 2157B provides an additional gripping or grasping surface that can be used by the user. The body 2152 of the extendable member 2150 also includes opposite ends 2158 and 2160 as shown in FIG. 52.

As shown in FIG. 52, on side 2153 of the body 2152, there are two portions 2162 and 2164 that have inner surfaces that define a groove or slot 2165 therebetween. The portions 2162 and 2164 have projections or tabs 2163A and 2163B that extend into the slot 2165. The projections 2163A and 2163B slide along the surface of guide 2146B.

Similarly, as shown in FIG. 51, on side 2155 of the body 2152, there are two portions 2166 and 2168 that have inner surfaces that define a groove or slot 2169. Projections (only projection 2167 is shown) are formed on portions 2166 and 2168 and extend into the slot 2169 to provide a surface that frictionally engages the guide 2146B on the body 2010 of the holder 2000 and engage the coupling mechanism 2147, which keeps the extendable member 2150 coupled to the body 2010.

Referring to FIG. 51, the body 2152 includes notches or grooves 2176 and 2178 formed in opposite sides of the body 2152. As discussed above, the wire or cord connected to headphones can be wrapped around the extendable member 2150. Initially when wrapping the wire, the wire can be engaged with the notch 2178 as the wire is wrapped around the member 2150. In an alternative embodiment, only notch 2178 is formed in the body 2152.

As shown in FIGS. 50-52, the extendable member 2150 includes a wire tie-off feature or mechanism 2170. This mechanism 2170 includes a wall 2172 that defines a recess 2174 formed in the side 2153 of the body 2152. When the wire has been sufficiently wrapped around the extendable member 2150, the friction of the wire with the wall 2172 keeps the wire retained in the recess 2174 until a sufficient force is applied to the wire to pull it out of the recess 2174.

Figure 52A:
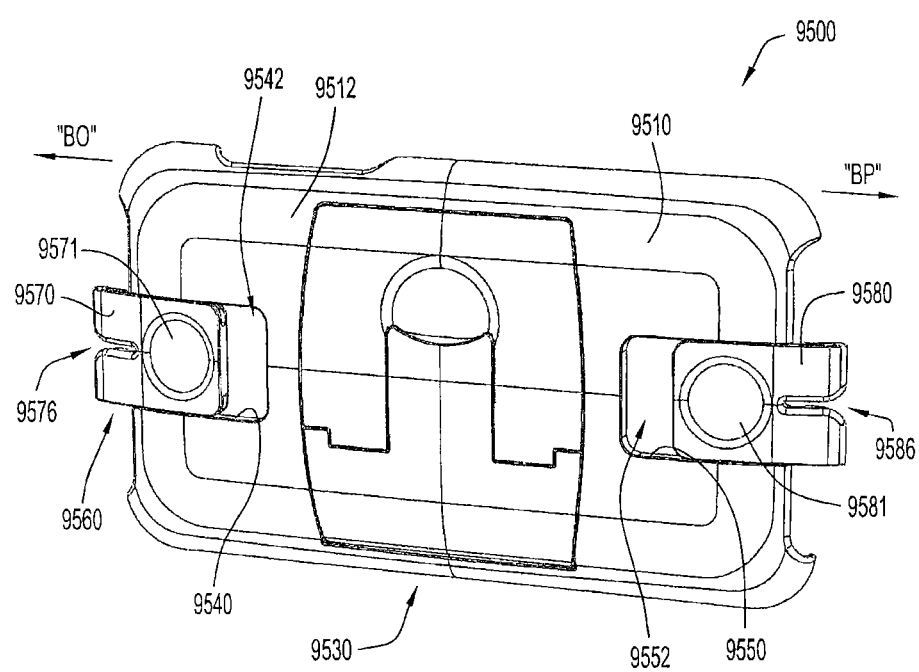
FIG. 52A illustrates a rear perspective view of another embodiment of a holder according to the invention with its cord management system in a deployed configuration.

Referring to FIG. 52A, another embodiment of a holder according to the invention is illustrated. In this embodiment, holder 9500 includes a body 9510 that has an outer surface 9512 and opposite ends. A support portion 9530 is coupled to body 9510 and can be used to prop up the holder 9500 and an electronic device coupled thereto in a particular angle relative to a support surface. The holder body 9510 also includes walls 9540 and 9550 that define receptacles 9542 and 9552, respectively.

The holder 9500 includes a cord management system 9560 as well. In this embodiment, the cord management system 9560 includes engagement members 9570 and 9580 that are slidably mounted to the body 9510 in receptacles 9542 and 9552, respectively. Engagement members 9570 and 9580 include finger engaging recesses 9571 and 9581, respectively, and can be moved along the directions of arrows "BO" and "BP" from retracted positions to extended or deployed positions. In this embodiment, each member 9570 and 9580 includes a tie-off slot 9576 or 9586. In other embodiments, the members 9570 and 9580 can be located elsewhere, can tie-off the cord by a means other than a slot shape, or not include a slot 9576 and 9586. A cord (not shown) that is connected to an electronic device coupled to holder 9500 can be wrapped alternately around engagement members 9570 and 9580.

Referring to FIGS. 53-57, another embodiment of a case or holder according to the invention is illustrated. In this embodiment, the holder 3000 includes a body or base 3010 that is molded using a plastic material. In an alternative embodiment, the base 3010 of the holder 3000 can be formed of metal or a combination of materials that could include fabric, or rubber. The body or base 3010 can be referred to alternatively as a mounting portion.

Figure 54:
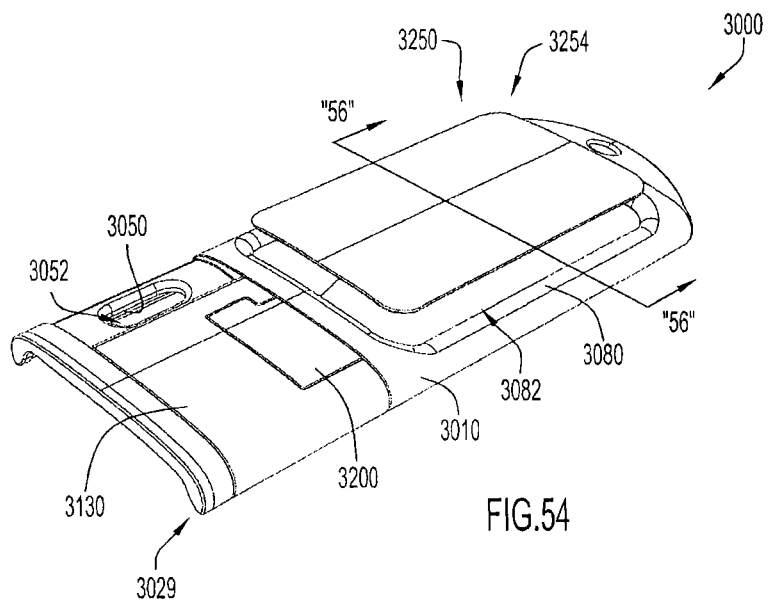
FIG. 54 illustrates a perspective view of the holder illustrated in FIG. 53 with its cord management system in a deployed configuration.

The body 3010 has opposite ends 3016 and 3018 and opposite sides 3020 and 3022. The body 3010 includes a rear plate or base plate 3011 that has an inner surface 3012 and an outer surface 3014. The inner surface 3012 and the outer surface 3014 of the plate 3011 define a thickness therebetween. As shown in FIG. 54, the plate 3011 includes an edge 3050 that defines an opening 3052 that is aligned with a feature on the electronic device coupled to the holder 3000.

In this embodiment, the body 3010 has a plate 3024 located proximate to end 3016. The plate 3024 includes an edge 3026 that defines a notch or opening 3028 that can receive a wrist strap that is inserted into the opening 3028. An end of a wrist strap (not shown) can be inserted into the opening and looped around itself to couple the wrist strap to the holder 3000. The plate 3024 is offset from the portion of the holder 3000 to which the electronic device is coupled. As a result, any strap coupled to the plate 3024 does not interfere with the electronic device.

The case 3000 also includes a coupling mechanism 3029 that can be used to couple the case 3000 to an electronic device. The coupling mechanism 3029 is a releasable coupling mechanism so that a user can easily remove the case 3000 from the electronic device when desired. The coupling mechanism 3029 includes at least one coupling member. In this embodiment, the coupling mechanism 3029 includes coupling members 3030 and 3040 located on opposite sides of the holder 3000.

Figure 55:
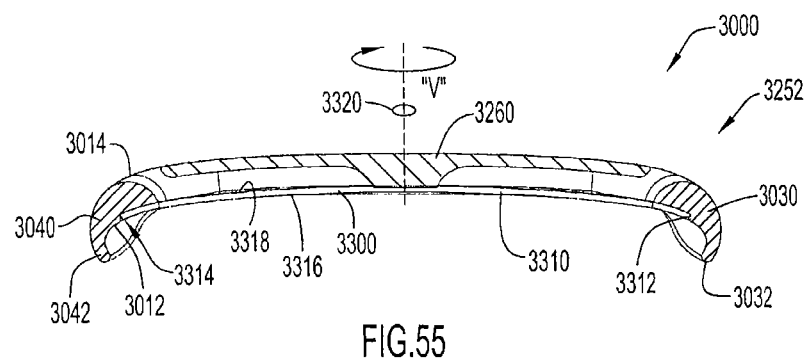
FIG. 55 illustrates a cross-sectional end view of the holder illustrated in FIG. 53 taken along the line "55-55."

Referring to FIG. 55, coupling member 3030 extends to an outer edge 3032 and coupling member 3040 extends to an outer edge 3042. Each of the coupling members 3030 and 3040 has a curved configuration that curves around an edge of an electronic device. The edges 3032 and 3042 are located proximate to the front surface of the electronic device, but do not cover any of the front surface in a manner similar to coupling member 366 described above.

Figure 53:
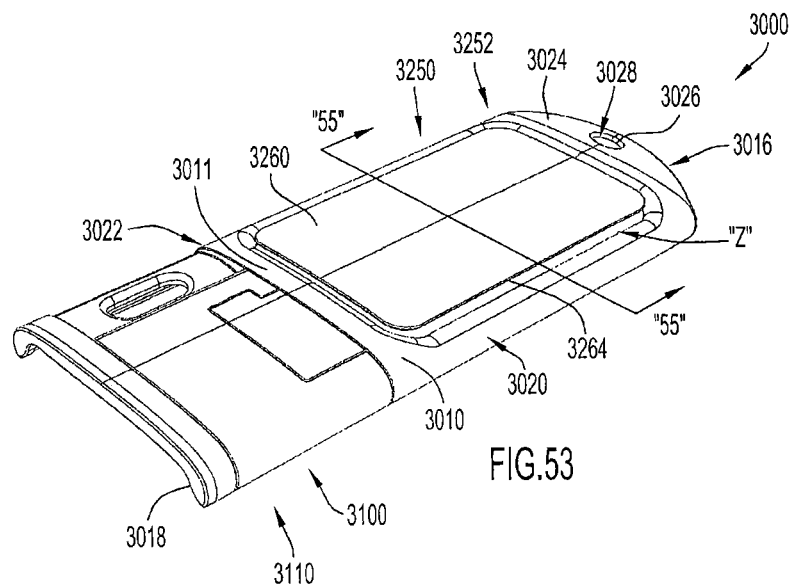
FIG. 53 illustrates a perspective view of another embodiment of a holder according to the invention with its cord management system in a retracted configuration.
Figure 57:
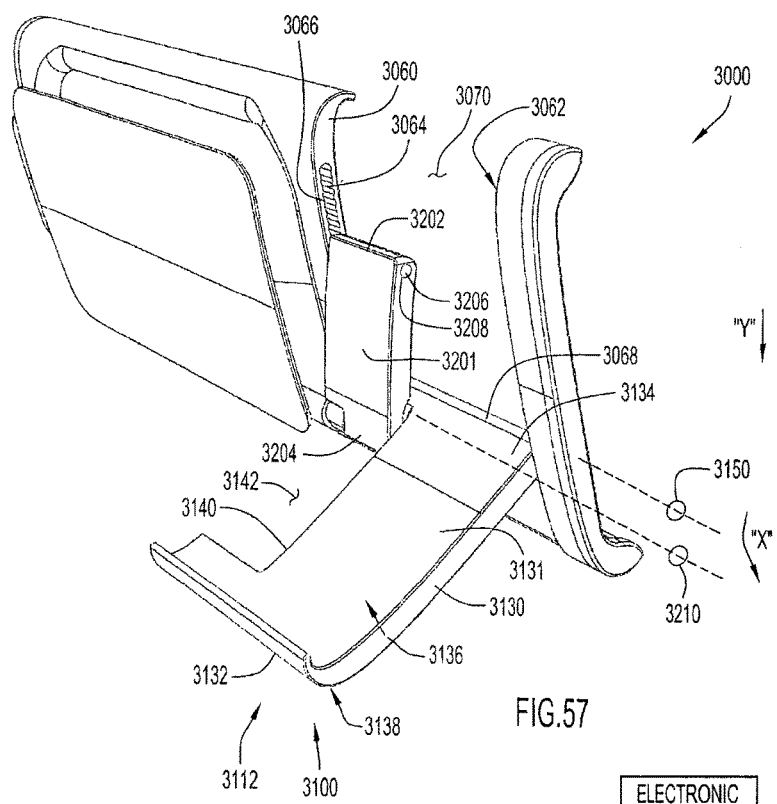
FIG. 57 illustrates a perspective view of the holder illustrated in FIG. 53 with its support portion in a deployed position.

Referring to FIGS. 53 and 54, the holder 3000 is illustrated in a collapsed or retracted configuration. In FIG. 57, the holder 3000 is shown in a deployed configuration. The holder 3000 includes a support or support portion 3100 coupled to the body 3010. The support 3100 is configured to be used to support the body 3010 at one or more orientations relative to a support surface. The support 3100 is shown in a retracted configuration 3110 in FIGS. 53 and 54 and in a deployed configuration 3112 in FIG. 57.

In this embodiment, the support 3100 includes two support components 3130 and 3200. Support component 3130 is coupled to the body 3010 and to support component 3200 and support component 3200 is coupled to the body 3010 and to support component 3130 in a manner similar to that described above with respect to holder 2000.

Referring to FIG. 57, the plate 3011 includes edges or walls that collectively define an opening 3070. In this embodiment, the opening 3070 is offset toward end 3018 of the body 3010. Opening 3070 is defined by side walls 3060 and 3062 and end wall 3068. The body 3010 of the holder 3000 includes a positioning mechanism that includes slots formed in side walls of the body 3010. As shown, side wall 3060 includes a slot 3064 with opposite ends and a surface that includes several projections or ridges 3066 formed on the upper and lower portions of the surface. Each of the projections or ridges 3066 defines a position for a pin or connector coupled to the support portion 3100 and as a result, defines a position for the support 3100. As shown, more than three positions for the support 3100 are defined by the quantity of the ridges 3066.

When the support components 3130 and 3200 are moved to their collapsed or retracted positions, the support components 3130 and 3200 are substantially coextensive with the opening 3070 in the plate 3011 of the body 3010. The support components 3130 and 3200 are sized and configured to collectively mate with the opening 3070.

Referring to FIG. 57, support component 3130 includes a body 3131 with a first end 3134 that is pivotally coupled to the plate 3011 and an opposite, second end 3132. The body 3131 includes an outer surface 3136 that engages a support surface when the holder 3000 is in use. The outer surface 3136 forms a contact surface or area that engages a support surface and is used for support. In the configuration and orientation illustrated in FIG. 57, the engagement portion or surface 3138 of the component 3130 that contacts a support surface is close to the distal tip of the end 3132 of the component 3130. The holder 3000 and the device coupled thereto can be flipped over 180.degree. to an inverse configuration. In the orientation shown in FIG. 57, the engagement portion or surface 3138 of the component 3130 that contacts a support surface is on the curved portion of the end 3132 of the component 3130.

Support component 3130 also includes a wall 3140 with several sections that collectively define a receptacle 3142. The receptacle 3142 is sized and configured to receive support component 3200 therein when the components 3130 and 3200 are in their collapsed or retracted positions shown in FIGS. 53 and 54.

Component 3200 can be configured substantially similar to component 2230, which was described above. Component 3200 includes a body 3201 with opposite ends 3202 and 3204 and openings (only opening 3206 shown in FIG. 57) proximate to the ends 3202 and 3204. A connector 3208, such as a pin, is inserted through opening 3206 to movably couple component 3200 to the body 3010 of the holder 3000 via slot 3064.

Referring to FIG. 57, a user can grasp the distal end of component 3130 and pull along the direction of arrow "X" about axis 3150 with sufficient force to move the component 3130 relative to the body 3010. As component 3130 rotates or pivots about axis 3150 defined by a pin, component 3200 rotates relative to component 3130 about the connector defining the axis 3210. At the same time, the pin 3208 slides along the direction of arrow "Y" in FIG. 57 in the slot 3064. The pin 3208 can be retained in a particular desired position by the ridges 3066 extending into the slot 3064. The angle between the particular engagement surface of component 3130 and the body 3010 can be adjusted as desired. The support components 3130 and 3200 can be moved in the directions opposite to arrows "X" and "Y" to move from their deployed positions to their retracted positions.

Referring to FIGS. 53-56, holder 3000 includes a cord holding or management mechanism 3250. The mechanism 3250 can be used to hold, retain or tie-off the headphone cord that is connected to the electronic device to prevent the cord and headphones from being entangled or caught on another object. The body 3010 includes an edge or surface 3080 that defines a receiving area 3082.

Figure 56:
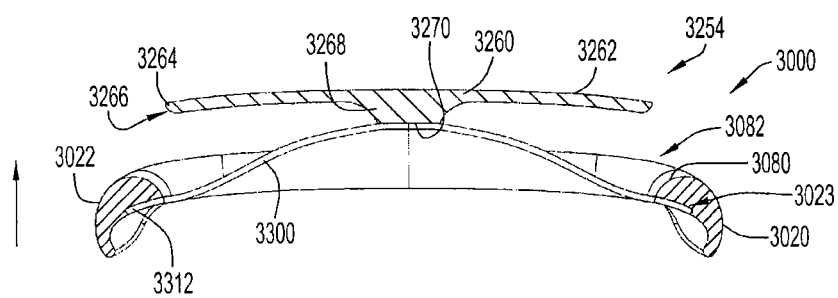
FIG. 56 illustrates a cross-sectional end view of the holder illustrated in FIG. 54 taken along the line "56-56."

Referring to FIGS. 55 and 56, a cross-sectional view of the components of holder 3000 is illustrated. The mechanism 3250 includes a plate 3260 that is coupled to a membrane 3300 that is connected to the body 3010. In one embodiment, the membrane 3300 is made of a stretchy rubber material. The plate 3260 includes an outer surface 3262 and an edge 3264 that defines a perimeter 3266 of the plate 3260. Along its inner surface, the plate 3260 includes a mounting portion 3268 that has an edge 3270. The mounting portion 3268 and in particular, the edge 3270, is coupled to a flexible, resilient membrane 3300. The membrane 3300 has a body portion 3310 with an outer edge 3312 that defines a perimeter 3314. The membrane 3300 includes an inner surface 3316 and an outer surface 3318 (see FIG. 55). The outer edge 3312 of the membrane 3300 is mated with a groove or recess 3023 that is formed in the body 3010 and that extends around the receiving area 3082. The membrane 3300 can be coupled to the body 3010 and to the plate 3260 via an adhesive. Alternatively, the membrane 3300 can be coupled to the body 3010 and/or to the plate 3260 by co-molding, snap-fit insertion, or other means of fixedly attaching.

Referring to FIGS. 53-56, the use of the cord management system 3250 is described. In this embodiment, a user can wrap a cord that is connected to the electronic device around the cord management system 3250 to enable storage of the cord. While the cord is still connected to the electronic device coupled to the holder 3000, the user can insert a portion of the cord along the arrow "Z" in FIG. 53 into the receiving area 3082 between the plate 3260 and the body 3010. The user wraps the cord around the mounting portion 3268 of the plate 3260 around axis 3320 along the arrow "V" in FIG. 55. As more of the cord is wrapped around the mounting portion 3268, the cord forces the plate 3260 to move from its retracted position 3252 shown in FIGS. 53 and 55 to its raised or deployed position 3254 shown in FIGS. 54 and 56. This movement of the plate 3260 occurs because the cord fills up the receiving area 3082 and continues to engage the plate 3260. Due to the resilient, yet flexible, characteristics of the membrane 3300, the plate 3260 can move away from the body 3010 and when the cord is unwound or removed, the plate 3260 is moved back to its retracted position.

In an alternative embodiment, the membrane 3300 can be replaced by a mechanical coupler or coupling mechanism that mounts the plate 3260 relative to the body 3010 of the holder and provides a surface around which a cord can be wrapped. The coupling mechanism can include one or more members that are pivotally and/or slidably coupled to the plate 3260 and the body 3010.

Figure 58:
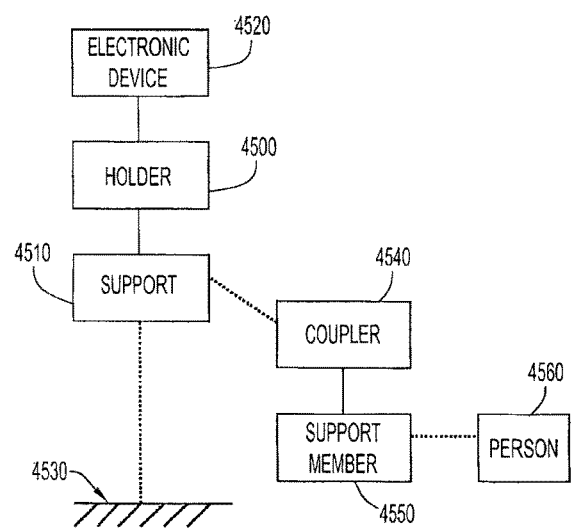
FIG. 58 illustrates a schematic diagram of another embodiment of a holder according to the invention.

Referring to FIG. 58, a schematic block diagram of an exemplary use of a holder according to the invention is illustrated. As shown, a holder 4500 includes an electronic device 4520 coupled thereto. The holder 4500 has a support or support portion 4510 that can be used to mount the holder 4500 and electronic device 4520 in multiple ways. In one embodiment, the support 4510 can be placed in a retracted position or configuration and in an extended or deployed position or configuration. The support 4510 is configured to engage a support surface 4530 on which the holder 4500 may be placed to prop or maintain the support 4510 in a particular orientation relative to the support surface.

Alternatively, the support 4510 can engage a coupler 4540 to mount the support 4510 and holder 4500 to a support member 4550 that can be used, worn, carried or otherwise transported by a person 4560. In one embodiment, the coupler 4540 can include a receptacle that receives at least a portion of the support 4510. In another embodiment the support member 4550 can be integrally formed with coupler 4540.

In this embodiment, a support or support portion 4510 can be used for cord management in that a cord coupled to device 4520 can be wrapped around part of the support 4510, or around the combination of coupler 4540 and support 4510, or around the combination of coupler 4540, support 4510 and support member 4550.

Referring to FIGS. 59A-63, another embodiment of a holder according to the invention is illustrated. In this embodiment, the holder 4000 includes a body or base 4010 that is molded using a plastic material. The body 4010 has opposite ends 4016 and 4018 and opposite sides 4020 and 4022. The body 4010 includes a rear plate or base plate 4011 that has an inner surface 4012 and an outer surface 4014. A guide plate 4023 extends from the inner surface 4012 as shown in FIGS. 62 and 63. The inner surface 4012 and the outer surface 4014 of the plate 4011 define a thickness therebetween. As shown in FIG. 59B, the plate 4011 includes an edge 4050 that defines an opening 4052 that is aligned with a feature on the electronic device coupled to the holder 4000.

The case 4000 also includes a coupling mechanism 4029 that can be used to couple the case 4000 to an electronic device. The coupling mechanism 4029 is a releasable coupling mechanism so that a user can easily remove the case 4000 from the electronic device when desired. The coupling mechanism 4029 includes at least one coupling member. In this embodiment, the coupling mechanism 4029 includes coupling members 4030 and 4040 located on opposite sides of the holder 4000.

Figure 59A:
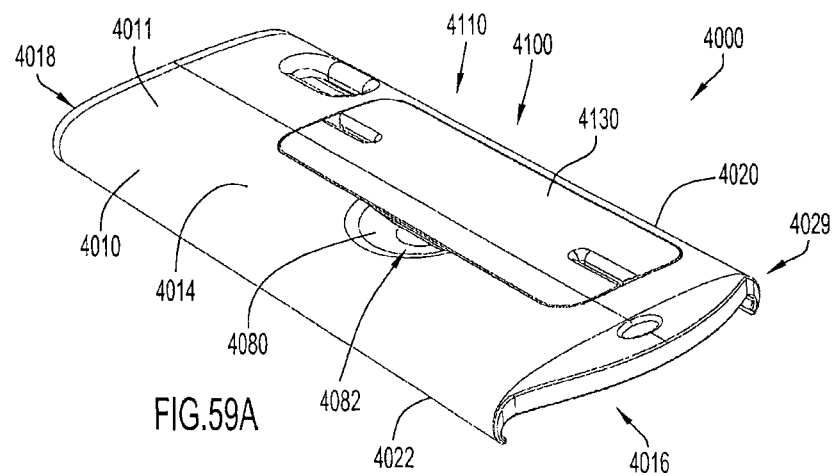
FIG. 59A illustrates a perspective view of another embodiment of a holder according to the invention.
Figure 59B:
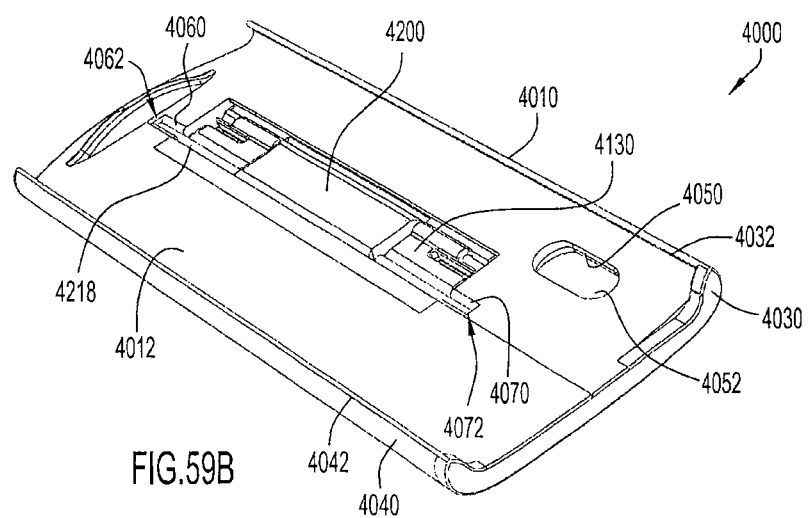
FIG. 59B illustrates another perspective view of the holder illustrated in FIG. 59A.

Referring to FIGS. 59B and 63, coupling member 4030 extends to an outer edge 4032 and coupling member 4040 extends to an outer edge 4042. Each of the coupling members 4030 and 4040 has a curved configuration that curves around an edge of an electronic device. The edges 4032 and 4042 are located proximate to the front surface of the electronic device, but do not cover any of the front surface in a manner similar to coupling member 366 described above.

Figure 60:
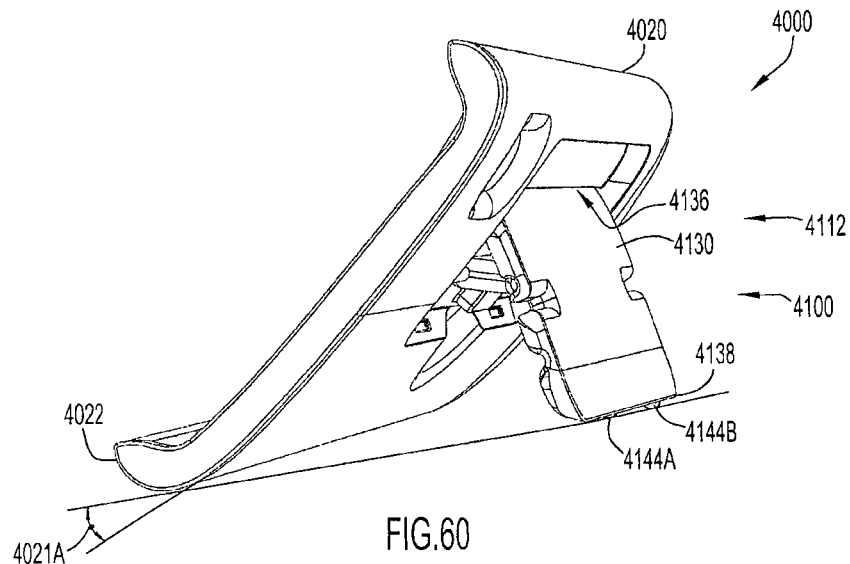
FIG. 60 illustrates a perspective view of the holder illustrated in FIG. 59A with its support portion in a deployed configuration.
Figure 61:
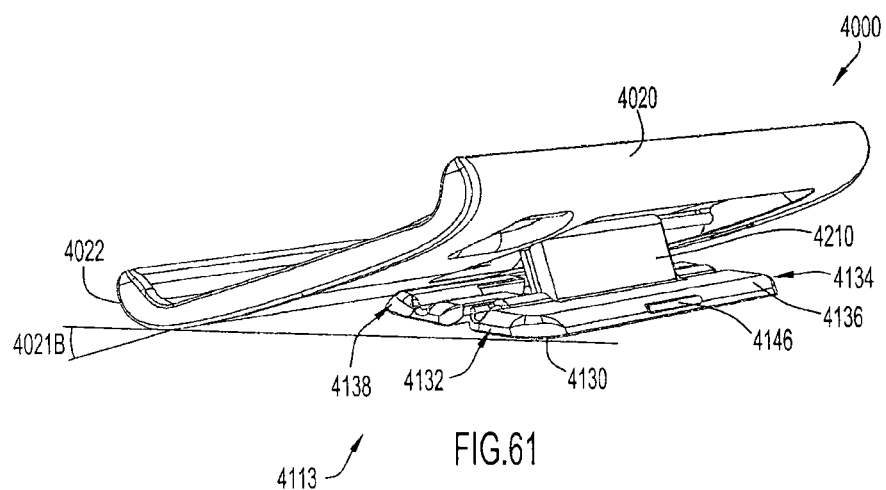
FIG. 61 illustrates a perspective view of the holder illustrated in FIG. 60 in an alternative configuration.

The holder 4000 includes a support or support portion 4100 coupled to the body 4010. The support 4100 is configured to be used to support the body 4010 at one or more orientations relative to a support surface. Referring to FIGS. 59A and 59B, the holder 4000 and the support 4100 are illustrated in a collapsed or retracted configuration 4110. In FIGS. 60-62, the holder 4000 and the support 4100 are shown in deployed configurations 4112. Another deployed configuration 4113 is illustrated in FIG. 61. Another deployed configuration 4114 of the support 4100 and the holder 4000 is illustrated in FIG. 63.

In this embodiment, the support 4100 includes two support components 4130 and 4200. Support component 4130 is engageable with the body 4010 and coupled to support component 4200 and support component 4200 is coupled to the body 4010 and to support component 4130. As shown in FIGS. 59A and 63, the body 4010 includes a surface 4080 to forms a recessed area 4082 that permits a user to insert a finger beneath an edge of the support component 4130 to move it relative to the holder 4000.

Referring to FIG. 63, the plate 4011 includes several surfaces, including surface 4084, that collectively define an opening or receptacle 4086. When the support components 4130 and 4200 are moved to their collapsed or retracted positions, the support components 4130 and 4200 are substantially coextensive with the opening 4086 in the plate 4011 of the body 4010. The support components 4130 and 4200 are sized and configured to collectively mate with the opening 4086.

Referring to FIGS. 61 and 63, support component 4130 includes a body 4131 with opposite ends 4132 and 4134 and opposite sides 4136 and 4138. The body 4131 includes an inner surface 4140 and an outer surface 4142 that engages a support surface when the holder 4000 is in use. The outer surface 4142 forms a contact surface or area that engages a support surface and is used for support. In the configuration and orientation illustrated in FIG. 61, the engagement portion or surface of the component 4130 that contacts a support surface is close to the distal tip of the side 4138 of the component 4130. The holder 4000 and the device coupled thereto can be flipped over 180.degree. to an inverse configuration. In that configuration, the engagement portion or surface of the component 4130 that contacts a support surface is on the outer side of the component 4130.

As shown in FIG. 60, in this embodiment, the support component 4130 includes projections 4144A and 4144B that extend from side 4138 of the body 4131. Similarly, as shown in FIG. 61, the support component 4130 includes a projection 4146 that extends from side 4136 of the body 4131. Referring to FIG. 63, the wall 4084 includes a notch 4088 that is configured to receive projection 4146 when the component 4130 is moved to its retracted position.

Referring to FIGS. 61 and 63, the support component 4130 includes an inner wall 4150 and side walls 4152, 4154, 4155, and 4156 which collectively form a receptacle 4160. The receptacle 4160 is sized and configured to receive support component 4200 therein when the components 4130 and 4200 are in their collapsed or retracted positions.

Component 4200 includes a body 4210 with opposite ends 4220 and 4222 and openings 4212 and 4214 proximate to the ends. Connector 4216 and 4218, such as pins, are inserted through the openings 4212 and 4214, respectively, to movably couple component 4200 to the body 4010 of the holder 4000 and to component 4130. Component 4200 rotates about connector 4218 along the direction of arrow "AC" to a deployed position and rotates about connector 4218 along the direction of arrow "AD" to a retracted position. The connector 4218 is inserted into slots 4062 and 4072 defined by surfaces 4060 and 4070, respectively, in FIG. 59B.

Side wall 4156 includes a notch or groove 4158 that provides clearance for receiving connector 4218 when the components 4130 and 4200 are moved to their retracted positions. To retain the components 4130 and 4200 in deployed positions, support component 4200 includes a projection 4224 that engages a notch 4151 formed on the inner wall 4150. Support component 4130 can be rotated about connector 4216 along the directions of arrows "AC" and "AD" as desired.

Support component 4130 can be pivoted so that side 4136 engages an inner wall of the body 4010 to prop the body 4010 at a first angle 4021A relative to a support surface as shown in FIGS. 60 and 62. In addition, support component 4130 can be pivoted so that side 4138 engages an inner wall of the body 4010 to prop the body 4010 at a second angle 4021B relative to a support surface as shown in FIG. 61. Thus, by repositioning the support component 4130, the body 4010 can be supported at different angles relative to a support surface. The difference in the first and second support angles is partially due to the fact that the connector 4216 is located at a point offset from the middle of the support component 4130. As shown in FIG. 63, the distance between the connector 4216 and end 4136 is different than the distance between the connector 4216 and end 4138. As a result, the body 4010 and any electronic device coupled thereto can be supported at different angles by adjusting the position of the support component 4130.

Also, a cord coupled to an electronic device that is connected to the body 4010 can be wrapped around support component body 4210 when the body 4210 is in the position illustrated in FIG. 63.

Referring to FIGS. 63A-63D, an exemplary mounting of the support 4000 is illustrated. As shown, a support member 4600, such as a band or strap (which may be elastic or inelastic), includes opposite ends 4602 and 4604 and a loop 4606 that has an opening 4608 to receive end 4602. The band 4600 can be a used as a belt, an arm band, a backpack strap or other supporting mechanism. A portion of one side of the support member 4600 includes one of a hook or loop material and a portion of the other side of the support member 4600 includes the other of a hook or loop material. Accordingly, the support member 4600 can be wrapped around an object, such as the waist or the arm of a user, and worn in a conventional manner using the hook and loop materials to retain the support member 4600 in place.

Figure 63A:
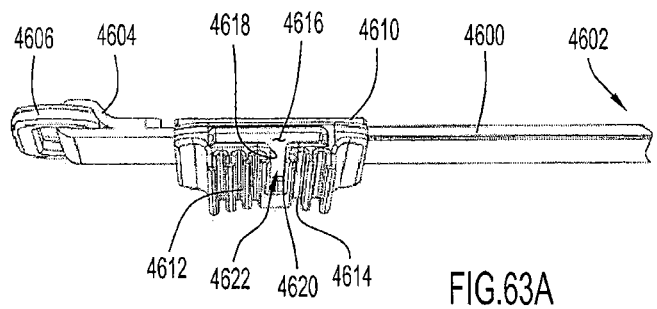
FIG. 63A illustrates a top view of a coupler and support member according to the invention.
Figure 63B:
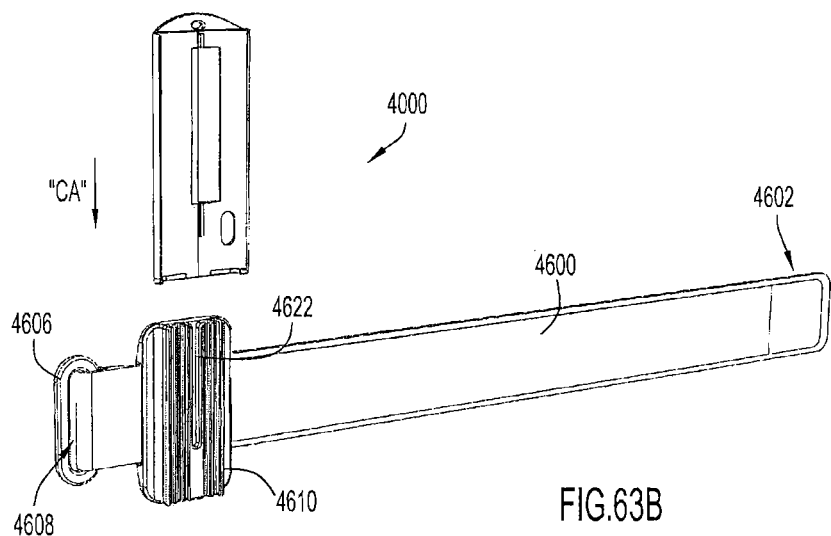
FIG. 63B illustrates a perspective view of a support proximate to the coupler and support member illustrated in FIG. 63A.
Figure 63C:
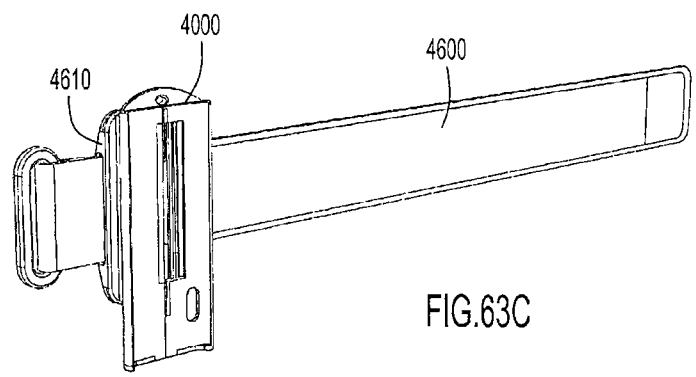
FIGS. 63C and 63D illustrate perspective views of the support mounted to the coupler illustrated in FIG. 63A.
Figure 63D:
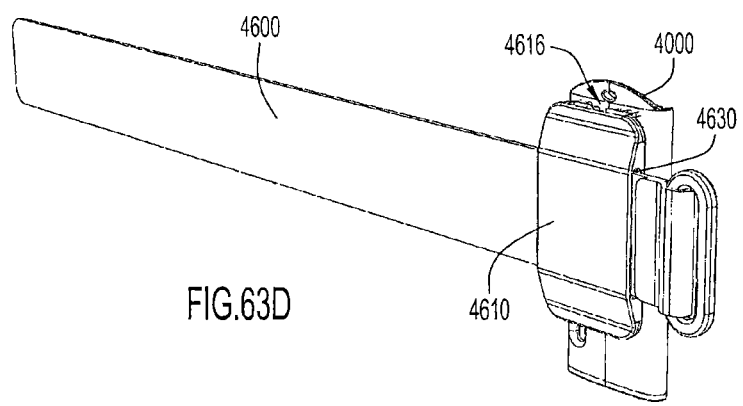

In this embodiment, a coupler 4610, which can be a plastic or rubber housing, includes a slot 4630 (see FIG. 63D) that permits the coupler 4610 to slide along the support member 4600. In another embodiment, coupler 4610 does not slide as it is integrally formed with support member 4600. In yet another embodiment, the support component 4130 can be slid or twisted into a semi-flexible buttonhole opening in an alternate coupler and support member configuration. Referring to FIG. 63A, the coupler 4610 includes guide portions 4612 and 4614 that define a receptacle 4616 and that have ends 4618 and 4620, respectively, that define a slot 4622 therebetween. The receptacle 4616 and the slot 4622 are configured to slidably receive the support component body 4131 and the support component body 4210 (see FIG. 63), respectively, when the support 4000 is moved along the direction of arrow "CA" in FIG. 63B. The opening for each of the receptacle 4616 and the slot 4622 are oriented upward so that the support 4000 is maintained on the coupler 4610 via the engagement of the support components 4130 and 4200 with the coupler 4610. FIGS. 63C and 63D show the support 4000 mounted to the coupler 4610 and in a position to be worn by a user via the support member 4600.

Figure 64:
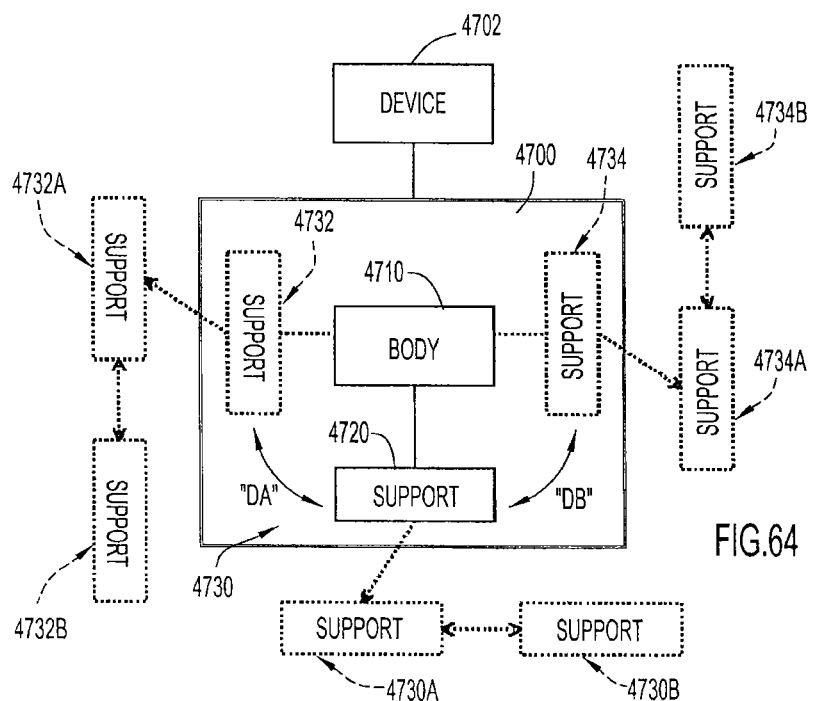
FIG. 64 illustrates a schematic block diagram of a holder according to the invention.

Referring to FIG. 64, a schematic block diagram of another embodiment of a holder or case according to the invention is illustrated. As shown, the holder 4700 includes a body 4710 and a support 4720 that is movably coupled to the body 4710. The holder 4700 is configured to be coupled to a device 4702, such as an electronic device, in a manner consistent with this disclosure.

The support 4720 is movable relative to the body 4710 and placeable in many different orientations. In FIG. 64, the support 4720 is illustrated as being in the holder 4700 which represents the support 4720 being in a retracted position relative to the body 4710, which in some embodiments includes the support 4720 being disposed within the holder 4720.

The support 4720 is illustrated in orientation 4730 in FIG. 64. In this embodiment, the orientation of the support 4720 can be changed. The orientation of the support determines the orientation of the case or holder and the electronic device relative to a support surface or supporting object. In one embodiment, orientation 4720 may correspond to the body 4710 and the device 4702 being in a landscape orientation when viewed from the front. The support 4720 can be moved along the direction of arrow "DA" to another orientation 4732. In one embodiment, orientation 4732 may correspond to the body 4710 and device 4702 being in a portrait orientation. In this embodiment, the angle of rotation between orientations 4730 and 4732 is approximately 90 degrees. In addition, the support 4720 can be moved along the direction of arrow "DB" to orientation 4734. In one embodiment, orientation 4734 may correspond to the body 4710 and device 4702 being in another portrait orientation, which is 180 degrees different than orientation 4732. The angle of rotation between orientations 4730 and 4732 is approximately 90 degrees and between orientations 4732 and 4734 is approximately 180 degrees. Support 4720 can be moved 360 degrees in the direction of arrow "DB" or "DA" and can stop at any angle.

In one embodiment, the support 4720 is rotatably mounted to the body 4710 and can be rotated between the different orientations 4730, 4732, and 4734. In another embodiment, the support 4720 may be slidably mounted to the body 4710 and, for example, movable along an arcuate slot in the body 4710 between orientations 4730, 4732, and 4734.

The support 4720 can be moved to an extended configuration or position relative to the holder 4700 as well. This movement to an extended position from a retracted position can occur when the support 4720 is in any orientation relative to the body 4710. The extending movement can be manually performed by a user.

Referring to FIG. 64, the support 4720 can be moved from its retracted position to an extended position 4730A in which the support 4720 extends from the body 4710 and is engageable with a support surface or other structure to support the holder 4700 and device 4702. The support 4720 can be moved to another extended position 4730B while in this orientation 4730. The support 4720 extends from the body 4710 at different angles whether the support 4720 is in position 4730A or position 4730B, and accordingly, supports the holder 4700 and device 4702 at different angles as well in this landscape orientation.

The support 4720 can be moved between any of the orientations 4730, 4732, and 4734 while the support 4720 is in either a retracted position or an extended position relative to the body 4710. Once the support 4720 is in its orientation 4732, the support 4720 can be placed in at least two extended positions 4732A and 4732B, which enables the support 4720 to be used to support the holder 4700 and device 4702 in a portrait orientation at different angles. Similarly, once the support 4720 is in its orientation 4734, the support 4720 can be placed in at least two extended positions 4734A and 4734B, which enables the support 4720 to be used to support the holder 4700 and device 4702 in a portrait orientation at different angles. In at least one combination of support orientation and extension, the support 4720 can be grasped by a user to hold the holder 4700 to facilitate use of the device 4702 by the user.

The body 4710 can include several semi-permanent positioners, locators, or locking members that can be used to identify an orientation of the support 4720 and temporarily retain the support 4720 in that orientation. While three orientations 4730, 4732, and 4734 are illustrated in FIG. 64, the support 4720 can be placed in other orientations as well. In addition, the angles of rotation between the different orientations can vary.

One benefit of the repositionable or reorientable support 4720 is that it permits a user to view the device 4702 and/or to record images (such as a still or motion video image of the user via an image recording device like a webcam) while in any desired orientation.

Figure 65:
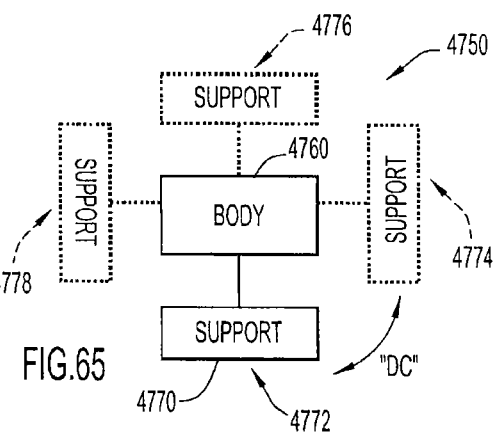
FIG. 65 illustrates a schematic block diagram of another holder according to the invention.

Referring to FIG. 65, another embodiment of a holder according to the invention is illustrated. In this embodiment, the holder 4750 includes a body 4760 that can be coupled to an electronic device and a support 4770 that is movably coupled to the body 4760. The support 4770 can be placed in several different orientations relative to the body 4760 and in this embodiment, the support 4770 can be rotated along the directions of arrow "DC" 360 degrees or in a full, complete circle. The support 4770 is illustrated in orientations 4772, 4774, 4776, and 4778, which can be approximately 90 degrees apart. The body 4760 may include a detent mechanism that provides a "soft stop" for the support 4770 so that the support 4770 can be appropriately aligned and oriented with the body 4760.

In one example, when support 4770 is in orientation 4772 or 4776, the body 4760 is in a portrait orientation in which an electronic device coupled to the body 4760 can be viewed by a user. In this orientation, the support 4770 can be adjusted through a wide range of angles, based on the configuration of the support, to maintain the body 4760 relative to a support surface as desired. In either orientation 4772 or 4776, body 4760 and the device can be placed in an "upside down" orientation and in a "right-side-up" position with respect to the support surface given that the devices screen image auto-orients itself right-side up, enabling a larger range of extension for more viewing options in one position and/or better support for more stability in the other position given the component structure of support 4772.

When support 4770 is in orientation 4774 or 4778, the body 4760 is in a landscape orientation in which an electronic device coupled to the body 4760 can be viewed by a user. In this orientation 4774, the support 4770 can be adjusted through a wide range of angles like orientation 4772. In either orientation 4774 or 4778, body 4760 and the device can be placed in an "upside down" orientation and in a "right-side-up" position with respect to the support surface given that the devices screen image auto-orients itself right-side up, enabling a larger range of extension for more viewing options in one position and/or better support for more stability in the other position given the component structure of support 4772.

In various uses, both the support 4720 in FIG. 64 and the support 4770 in FIG. 65 can be used as a handle by a user when the supports are in any orientation relative to the body to hold the body or case in any desired orientation. In various embodiments, the quantity of orientations of the supports can vary depending on the size and shape of the holder or body (such as whether the body has less or more than four sides).

Figure 66:
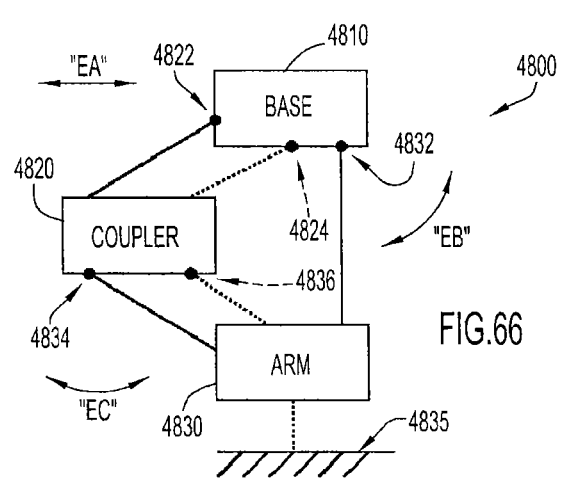
FIG. 66 illustrates a schematic block diagram of an embodiment of components of a support according to the invention.

Referring to FIG. 66, a schematic block diagram showing the movements of the components of an embodiment of a support according to the invention is illustrated. In this embodiment, the support 4800 includes a base or base member 4810 that is movably mounted to the body of a holder (not shown). In one embodiment, the base 4810 can be pivotally mounted to the holder body so that the base 4810 (and the other components of the support 4800) can be reoriented and disposed in one of many orientations.

In this configuration, a coupler 4820 is slidably and pivotally coupled to base 4810 at point 4822 which is movable along the direction of arrow "EA." In an alternative embodiment, the coupler 4820 may be slidably and pivotally coupled to base 4810 at a second point 4824 in addition to the first point 4822. In that embodiment, the first and second points 4822 and 4824 can be moved relative to the base 4810 simultaneously to reposition the coupler 4820 between a retracted position and an extended position.

An arm 4830 (also referred to as a support component or an engagement member) is configured to engage a support surface 4835. The arm 4830 is pivotally coupled to the coupler 4820 at one or more points or locations 4834 and 4836, depending on the configuration of the coupler 4820. The arm 4830 can be rotated about point 4834 as shown by arrow "EC." The arm 4830 is also coupled to the base 4810 at point 4832 about which the arm 4830 can be rotated as shown by arrow "EB." The extent of movement of the coupler 4820 and the arm 4830 relative to the base 4810 determines how far the arm 4830 extends from the base 4810 in angular movement and the angle at which the support 4800 supports the electronic device and holder.

Figure 67:
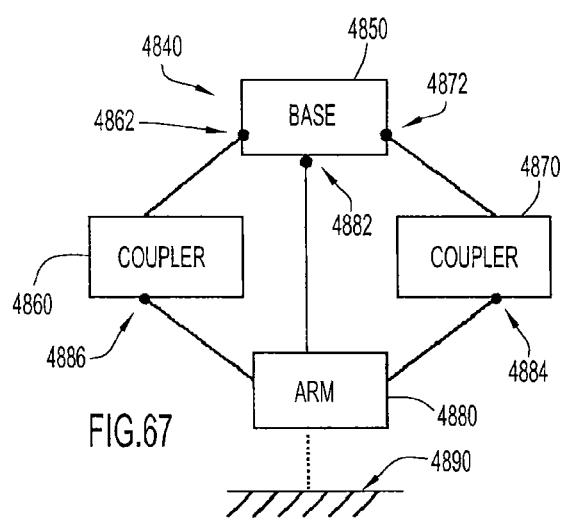
FIG. 67 illustrates a schematic block diagram of an embodiment of components of another support according to the invention.

Referring to FIG. 67, another embodiment of a support is illustrated. In this embodiment, the support 4840 includes a base 4850 to which couplers 4860 and 4870 are slidably and pivotally coupled at points or locations 4862 and 4872, respectively. An arm 4880, engageable with a support surface 4890, is pivotally coupled to couplers 4860 and 4870 at points 4886 and 4884 and to base 4850 at point 4882. In this embodiment, two separate couplers 4860 and 4870 are provided.

Referring to FIGS. 68-76, another embodiment of a support or support mechanism according to the invention is illustrated. In this embodiment, the support 5000 has a body 5010 that includes a support portion 5100. In one embodiment, the support 5000 can be provided with one or more coupling members on the body 5010 to couple the body 5010 to an electronic device. In another embodiment, the support 5000 can be inserted into a sleeve or jacket that is coupled to an electronic device. In this arrangement, the support 5000 can be easily removed from the electronic device and the sleeve or jacket. In one implementation, the sleeve can include a pocket into which the support 5000 is inserted. The sleeve can be a soft shell sleeve that is coupled to the electronic device. The sleeve can be a fabric shell, a leather shell, a rubber shell, a co-molded rubber and fabric shell, a shell with plastic portions, or other suitable material, or any combination thereof. The sleeve can include an opening through which the support portion 5100 can extend.

As shown and described below, the support portion 5100 is movable relative to the body 5010 and disposable in several orientations and in several extended or deployed configurations. In addition, the support portion 5100 is repositionable relative to the body 5010 so that an electronic device coupled thereto can be supported in any orientation, including, but not limited to, a portrait orientation and in a landscape orientation.

Referring to FIG. 68, the body 5010 has a first or upper end 5012 and an opposite second or lower end 5014 and a pair of opposite sides 5016 and 5018. The body 5010 also includes a front or inner surface 5022 (see FIG. 69) and a rear or outer surface 5020 (see FIG. 68). In this embodiment, the body 5010 is substantially rectangular with rounded corners. In alternative embodiments, the body 5010 may have a different shape or configuration, such as a square or a circle, or may have more than four sides. In one embodiment, the body 5010 is approximately the same size and shape as the electronic device to which the body 5010 is coupled or proximate.

The body 5010 also includes a mounting ring 5026 that defines an opening 5028. The opening 5028 is located closer to end 5014 than end 5012 and equidistant between the sides 5016 and 5018. This location of the opening 5028 facilitates the use of the body 5010 in any number of orientations. In addition, the distance that opening 5028 is from a particular edge of the body 5010 partially determines the needed length of the support portion component that engages a support surface, as described below.

In FIGS. 68-73, the support portion 5100 is illustrated in its retracted configuration 5102. In this configuration 5102, the support portion 5100 is disposed within or substantially within the profile of the body 5010. In FIGS. 74-78, the support portion 5100 is illustrated in different deployed configurations 5104, 5106, and 5108 in which part of the support portion 5100 can engage a support surface to support the body 5010 relative to the support surface.

Referring back to FIGS. 68 and 69, the support portion 5100 includes a rotating base 5200, a coupler 5300, and an engagement member or arm 5500. As described in detail below, in this embodiment, the support portion 5100 is movably mounted to the body 5010 and disposable in several orientations relative to the body 5010. In particular, the base 5200 is rotatably mounted to the body 5010. The base 5200 includes an indicator 5260 that is used to indicate or represent the particular orientation of the support portion 5100.

In one embodiment, the engagement member or arm 5500 includes an elongate member 5503, such as a pin, that is molded into the body of the arm 5500. The elongate member 5503 extends along most or nearly all of the length of the arm 5500 and provides rigidity and stability to the arm 5500. In this embodiment, the arm 5500 includes a second elongate member 5505 that extends along an opposite side of the arm 5500 from elongate member 5503. In other embodiments, the elongate members 5503 and 5505 can be coupled to an outer surface of the arm 5500 and not molded into the arm 5500. The elongate members 5503 and 5505 may be approximately one millimeter in diameter.

The body 5010 includes a mounting ring or portion 5026 that has several orientation indicia located therealong. In other embodiments, the orientation indicia can be included on another portion of the body 5010. In this embodiment, the body 5010 includes orientation indicia 5060, 5062, and 5064 that can be used to identify the particular position or configuration of the support portion 5100. For example, orientation indicia 5060 recites "Portrait," orientation indicia 5062 recites "Landscape," and orientation indicia 5064 recites "Handle." In this embodiment, the orientation indicia 5060, 5062, and 5064 are spaced apart by approximately 90 degrees. As the support portion 5100 is rotated, the indicator 5260 can be aligned with the desired orientation indicia on the body 5010 so that the holder 5000 is in its desired orientation. An electronic device is sometimes better viewed in a portrait orientation and sometimes better viewed in a landscape orientation based on the video content being viewed on the display or screen of the electronic device. In other embodiments, the orientation indicia are located at four locations corresponding to the four orientations of rectangular devices.

Referring to FIG. 69, the base 5200 includes a body or body portion 5210 that has a locating member 5250 coupled thereto. As shown in FIG. 70, the locating member 5250 includes a bar 5252 that defines an opening or slot 5254 which allows a portion of the locating member 5250 with projection 5256 to move inwardly along the direction of arrow "FA" when a force is applied.

Referring to FIG. 69, the body 5010 includes several positioners or locators 5050, 5052, and 5054 spaced around the perimeter of the opening 5028. Each of the positioners 5050, 5052, and 5054 includes a detent that is configured to receive the projection 5256 on the locating member 5250 when the projection 5256 engages the detent of the particular positioner. As the base 5200 rotates, the projection 5256 slides along the inner wall defining the opening 5028. When the projection 5256 engages a detent, the base 5200 is located in one of the predetermined orientations and the user can feel the engagement of the projection 5256 and detent.

Referring to FIGS. 68 and 69, on the outside, indicator 5260 is aligned with indicia 5060 and on the inside, the locating member 5250 is engaged with positioner 5050. In this orientation, labeled "Portrait," the body 5010 and the electronic device are disposed in a portrait orientation.

Figure 71:
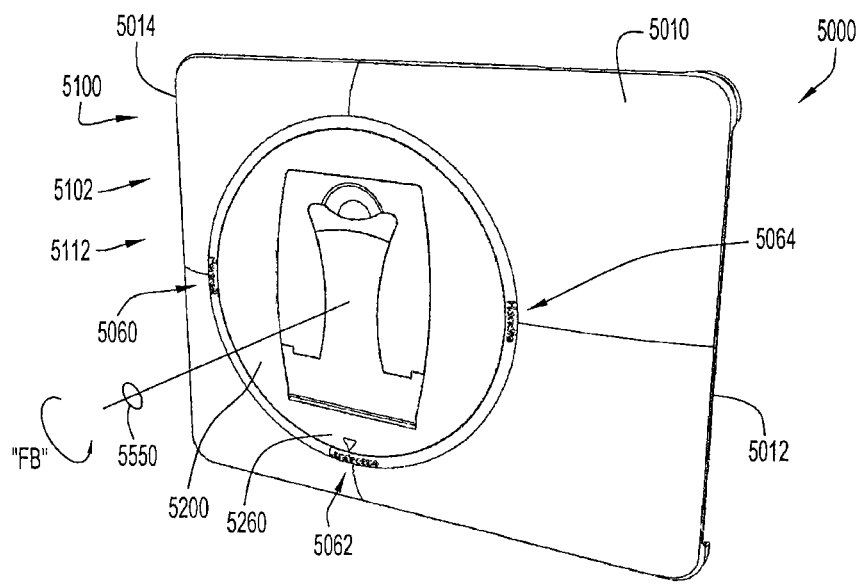
FIG. 71 illustrates a rear perspective view of the holder illustrated in FIG. 68 with its support in another orientation.
Figure 72:
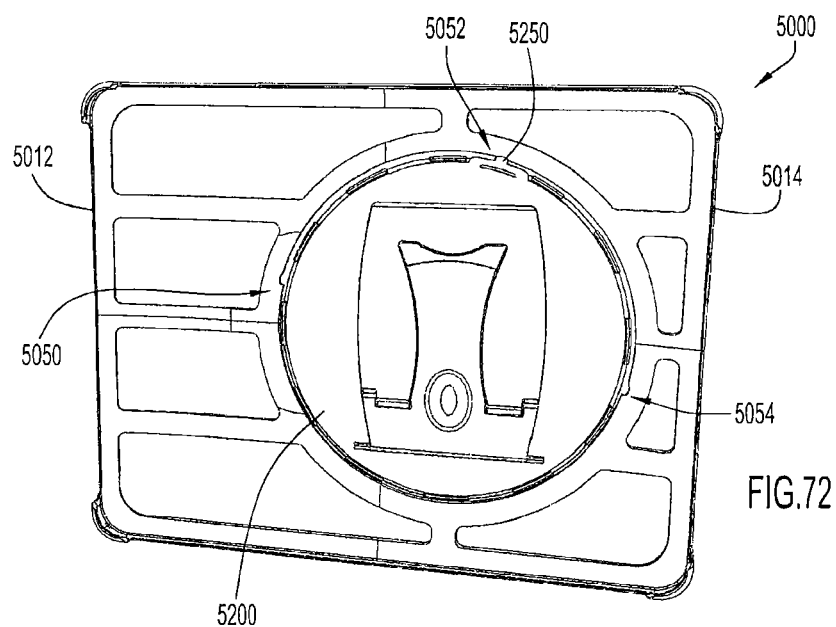
FIG. 72 illustrates a front perspective view of the holder illustrated in FIG. 71.

Referring to FIGS. 71 and 72, the support portion 5100 has been rotated along the direction of arrow "FB" about axis 5550 to a different orientation 5112. In this orientation, indicator 5260 is aligned with orientation indicia 5062, which is "Landscape," which represents the orientation of the body 5010. As shown in FIG. 72, the locating member 5250 is engaged with positioner 5052.

Referring to FIG. 73, the support portion 5100 has been rotated along the direction of arrow "FC" about the same axis 5550 to another orientation 5114. In this orientation, indicator 5260 is aligned with orientation indicia 5064, which is "Handle," which corresponds to the fact that the orientation of the body 5010 is portrait. On the inside of holder 5000, the locating member 5250 of the base 5200 is engaged with positioner 5054 (not shown).

Referring to FIG. 74, the support portion 5100 is illustrated in a deployed configuration 5106 in which the engagement member 5500 is moved along the direction of arrow "AG" so that the engagement member 5500 extends outward from the base 5200. In this orientation, a user can grasp the engagement member 5500 and use it as a handle be inserting part of the user's hand in the space 5502 between the engagement member 5500 and the coupler 5300, and in this orientation the engagement member 5500 can engage with a support surface in a right side-up and upside down position.

As shown in FIG. 74, in one embodiment, the engagement member 5500 includes an extension member 5501 that can be moved between a retracted position and an extended position relative to the engagement member 5500. The extension member 5501 is illustrated in an extended position in FIG. 74. In this position, the extension member 5501 lengthens engagement member 5500 to enable the engagement member 5500 to provide better support due to its increased length. Referring to FIGS. 74A and 74B, member 5501 can be moved relative to engagement member 5500 by sliding along the direction of arrow "AG2" or rotating along the direction of arrow "AG1."

Figure 75:
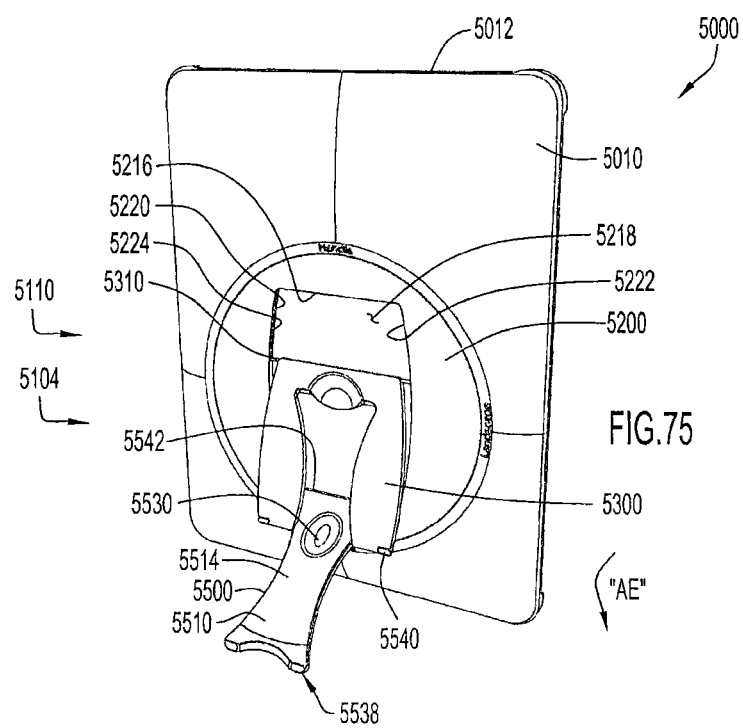
FIG. 75 illustrates a rear perspective view of the holder illustrated in FIG. 68 with its support in a deployed configuration.

Referring to FIG. 75, the orientation of the support portion 5100 is returned to the initial portrait orientation 5110. As shown, the engagement member 5500 has been moved along the direction of arrow "AE" to an extended position in which the engagement member 5500 can contact a support surface.

As shown in FIG. 75, the engagement member 5500 includes a body 5510 with an outer surface 5512 (FIG. 68), an inner surface 5514, and an engagement surface or portion 5538 at the distal end of the engagement member 5500. In one embodiment, engagement surface 5538 and a portion of outer surface 5512 and inner surface 5514 are made of rubber and fixedly attached or integrally formed via co-molding with engagement member 5500, to provide a better grip of the support surface. A finger engageable recess 5530 is formed on the inner surface 5514 of the body 5510. The engagement member 5500 is coupled to the base 5200 at joint or point 5542 by a connector, such as a pin (not shown).

The base 5200 include a wall 5216 that defines an opening 5218 through the base 5200. The wall 5216 includes side wall portions 5220 and 5222, each of which includes a slot (only slot 5224 shown in FIG. 75). The coupler 5300 includes an opening at one end in which a connector 5310 (such as a pin) is inserted. The connector 5310 is slidable along the slots in the side wall portions 5220 and 5222, which include ridges which help retain the connector 5310 in a particular location along the slots. The frictional forces between the pin ends and the slots in the base 5200 in which they are inserted cooperate with the ridges in the slots to retain the coupling member 5300 in a particular positions. The coupler 5300 is coupled to the engagement member 5500 along a joint 5540, which in this embodiment is located on both sides of the engagement member 5500.

Figure 76:
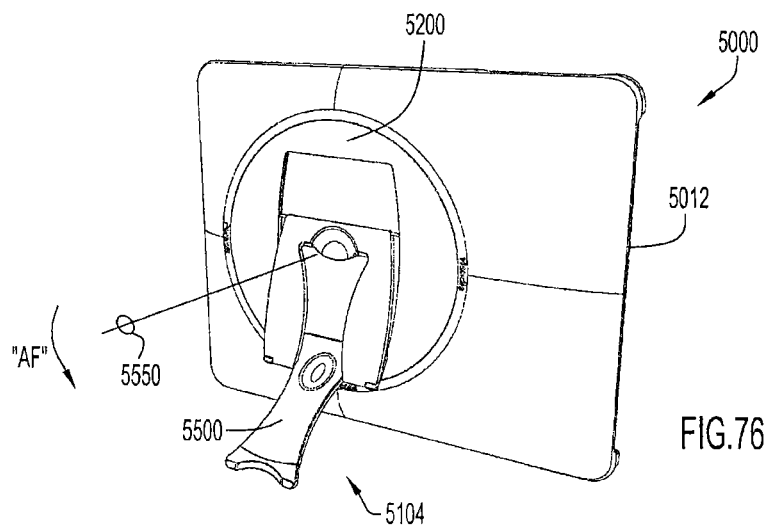
FIG. 76 illustrates a rear perspective view of the holder illustrated in FIG. 71 with its support in a deployed configuration.

Referring to FIG. 76, while the support portion 5100 is maintained in its deployed configuration 5104, the support portion 5100 can be rotated about axis 5550 along the direction of arrow "AF" from the position illustrated in FIG. 75 to the position illustrated in FIG. 76.

Figure 77:
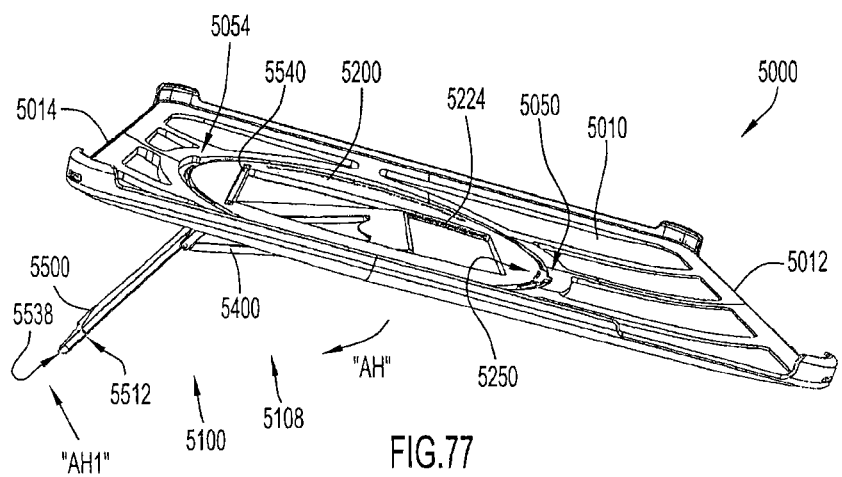
FIGS. 77 and 78 illustrate perspective views of the holder illustrated in FIG. 68 in different orientations with its support in a deployed configuration.

Referring to FIG. 77, the base 5200 has been rotated so that the locating member 5250 is engaged with positioner 5050, which corresponds to a portrait orientation of the holder 5000. As shown, the support portion 5100 is in an extended configuration 5108 and the engagement member 5500 has been moved along the direction of arrow "AH" so that it extends outward to engage a support surface with engagement portion 5538. In this configuration, when engagement member 5500 and end 5012 of the body 5010 are placed on a support surface, the force applied to engagement member 5500 from the support surface is along the direction of arrow "AH1." Arrow "AH1" is directed relative to the joint 5540 such that the applied force tends to cause the engagement member 5500 to move away from its retracted position further. However, the movement of the coupler 5300 is limited by the length of the slot 5224 and as a result, the movement of the engagement member 5500 is similarly limited, and in this upside down configuration the support structure can withstand more weight and pressure since a significant component of the force acting upon the stand is not rotational but aimed directly through the pin. Thus, the holder 5000 in this configuration provides a stable and sturdy support for an electronic device on which a user can be typing, which would incur more force on the electronic device than simply viewing the display or screen of the device.

Figure 78:
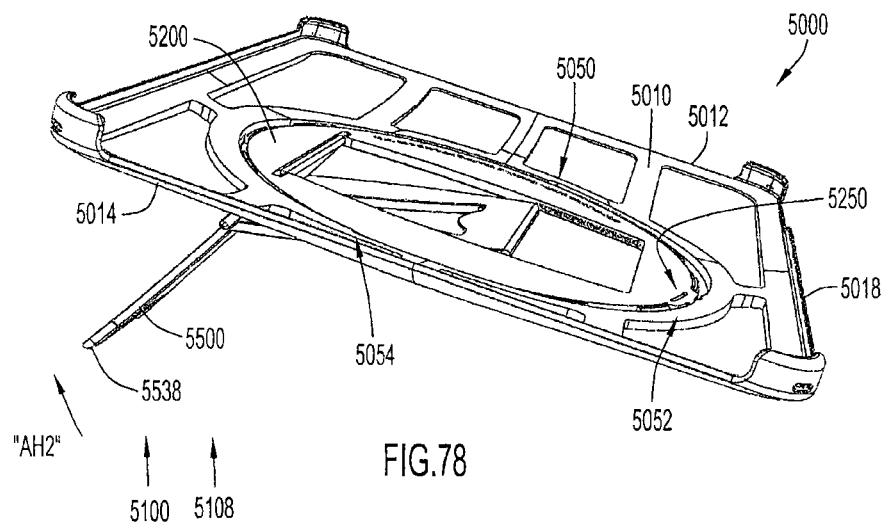

Referring to FIG. 78, the base 5200 has been rotated so that the locating member 5250 is engaged with positioner 5052, which corresponds to a landscape orientation of the holder 5000. The support portion 5100 is still in its extended configuration 5108 and when engagement member 5500 and side 5018 of the body 5010 are placed on a support surface, the force applied to engagement member 5500 from the support surface is along the direction of arrow "AH2," which is similar to arrow "AH1" in FIG. 77. Thus, as with the forces discussed in FIG. 77, the holder 5000 in this configuration provides a stable and sturdy support for an electronic device on which a user can be typing in a landscape orientation as opposed to a portrait orientation as shown in FIG. 77.

Figures 78A, 78B:
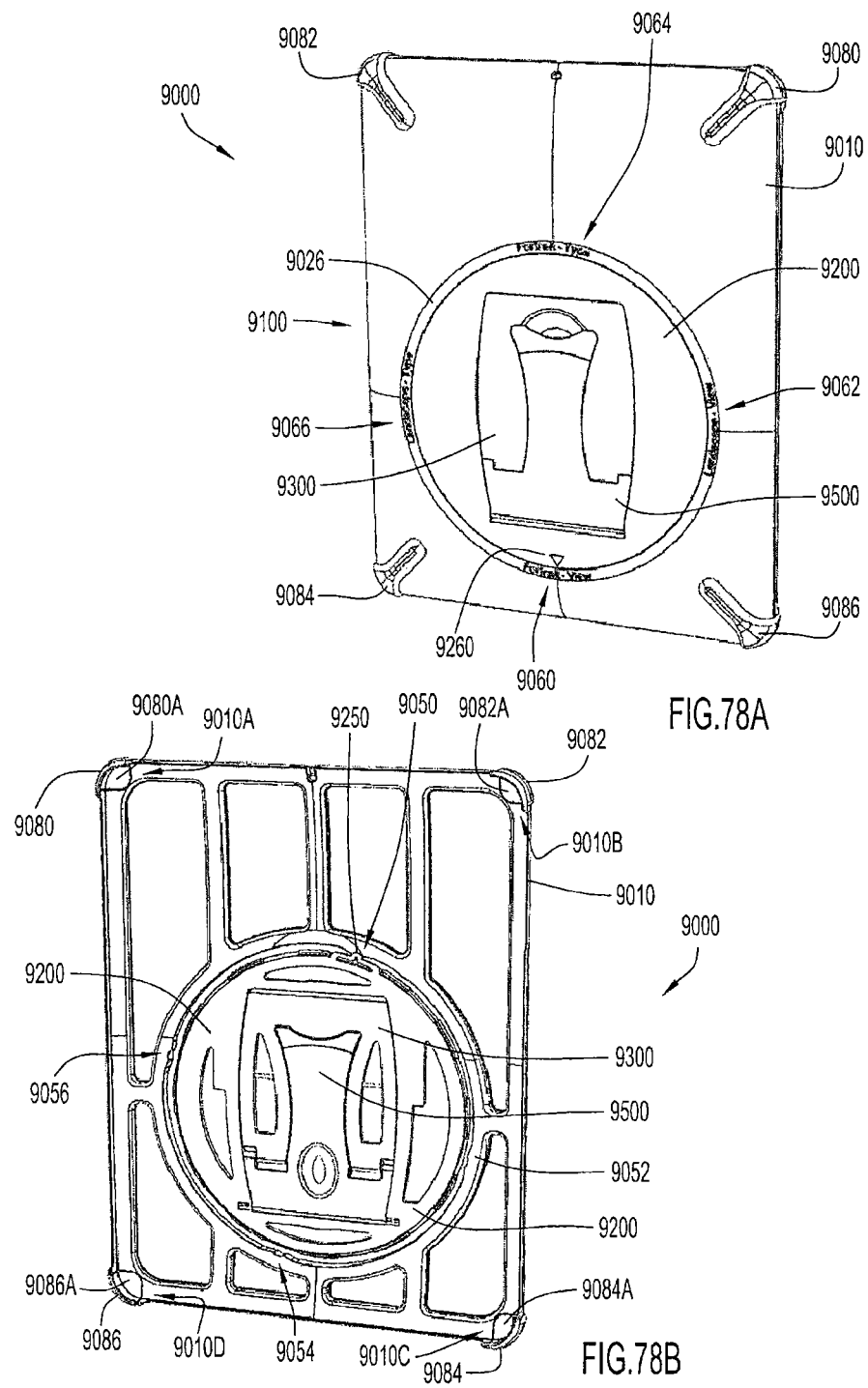
FIG. 78A illustrates a rear perspective view of another embodiment of a holder with its support in one orientation according to the invention.
FIG. 78B illustrates a front perspective view of the holder illustrated in FIG. 78A.

Referring to FIGS. 78A and 78B, another embodiment of a support according to the invention is illustrated. In this embodiment, the support 9000 has a body 9010 that includes a support portion 9100. In one embodiment, the support 9000 can be provided with one or more coupling members on the body 9010 to couple the body 9010 to an electronic device.

In this embodiment, the body 9010 includes four rubber bumpers 9080, 9082, 9084, and 9086 that are located at the corners of the body 9010 and provide protection to the body 9010 and couple the body 9010 to an electronic device to provide increased protection to the electronic device. The rubber bumpers 9080, 9082, 9084, and 9086 extend through the body 9010 and have portions 9080A, 9082A, 9084A, and 9086A that extend along the inner corner surfaces 9010A, 9010B, 9010C, and 9010D of body 9010, respectively, to provide protection to the electronic device. Similar to the support illustrated in FIGS. 68-78 and described above, the support portion 9100 is movable relative to the body 9010 and disposable in several orientations and in several extended or deployed configurations. Referring to FIG. 78A, the body 9010 has a structure that is generally similar to that of body 5010. The differences between body 5010 and body 9010 are described in detail.

As shown, the support portion 9100 includes a rotating base 9200, a coupler 9300, and an engagement member or arm 9500. The support portion 9100 is movably mounted to the body 9010 and disposable in several orientations relative to the body 9010. In particular, the base 9200 is rotatably mounted to the body 9010. The base 9200 includes an indicator 9260 that is used to indicate or represent the particular orientation of the support portion 9100.

The body 9010 includes a mounting ring or portion 9026 that has several orientation indicia located therealong. In other embodiments, the orientation indicia can be included on another portion of the body 9010. In this embodiment, the body 9010 includes orientation indicia 9060, 9062, 9064, and 9066 that can be used to identify the particular position or configuration of the support portion 9100. For example, orientation indicia 9060 recites "Portrait-View," orientation indicia 9062 recites "Landscape-View," orientation indicia 9064 recites "Portrait-Type," and orientation indicia 9066 recites "Landscape-Type." In this embodiment, the orientation indicia 9060, 9062, 9064, and 9066 are spaced apart by approximately 90 degrees. As the support portion 9100 is rotated, the indicator 9260 can be aligned with the desired orientation indicia on the body 9010 so that the holder 9000 is in its desired orientation. Support portion 9100 can also be rotated to any desired orientation along a full 360 degrees of rotation and with the engagement member 9500 in any one of several extended positions be used as a support or as a handle, as described previously. The shape of the rubber bumpers 9080, 9082, 9084, and 9086 wrap the outside corners of the body 9010 and extend inward from the corners so that these bumpers engage with the support surface, in ever orientation of the support portion 9100 and every angle of extension of engagement arm 9500 including its retracted position, to provide more stability. In other words, when the engagement member 9500 is retracted and the body 9010 is laid flat on a surface, only the rubber bumpers 9080, 9082, 9084, and 9086 engage the support surface. The combination of these rubber bumpers and the rubber engagement surface 5538 (see FIG. 77) provide even grip and support of the support surface for typing, vibrating surfaces (such as airplane tray tables) and finger engagement with touch screen electronic devices.

Referring to FIG. 78B, the base 9200 includes a body or body portion 9210 that has a locating member 9250 coupled thereto. As shown, the body 9010 includes several positioners or locators 9050, 9052, 9054, and 9056 spaced around the perimeter of the opening. Each of the positioners 9050, 9052, 9054, and 9056 includes a detent that is configured to receive the projection on the locating member 9250 when the projection engages the detent of the particular positioner. When the projection engages a detent, the base 9200 is located in one of the predetermined orientations and the user can feel the engagement of the projection and detent.

Figure 79:
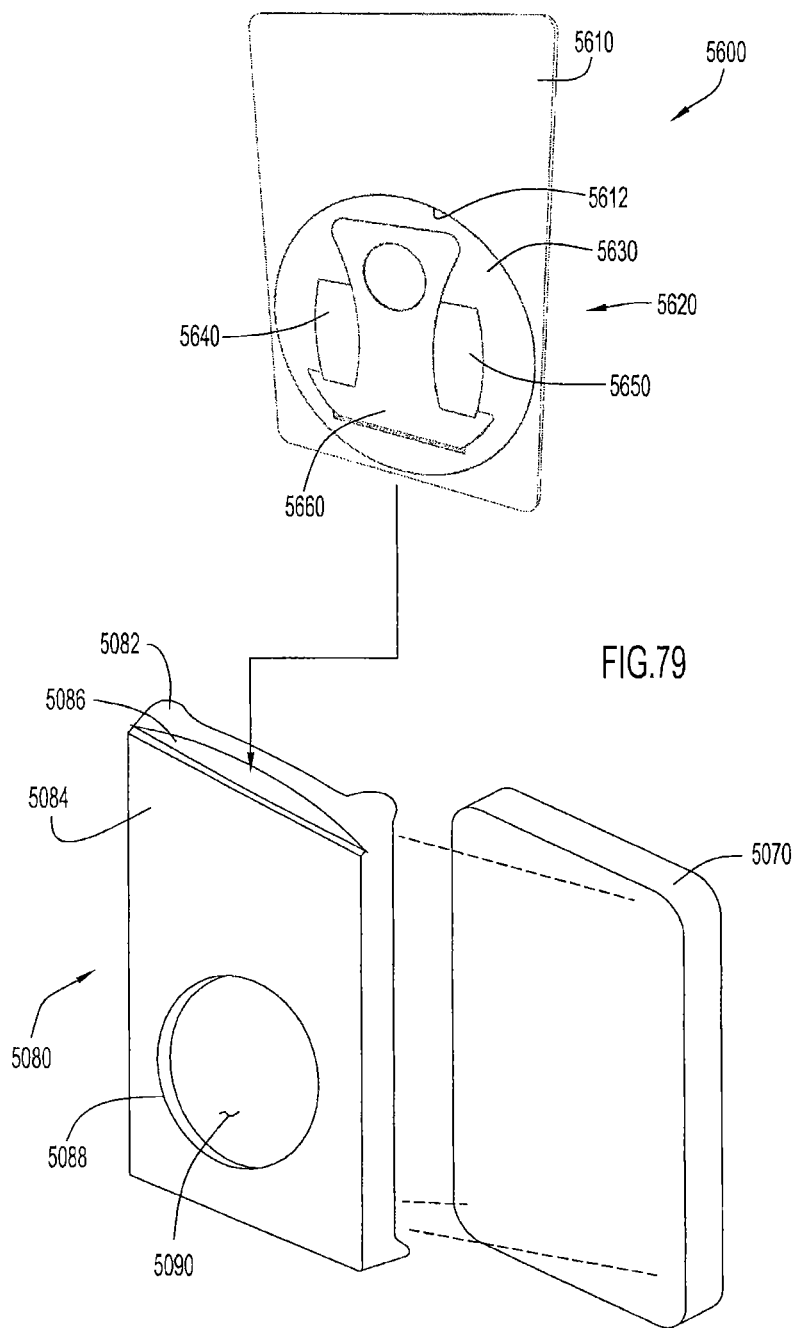
FIG. 79 illustrates a rear perspective view of an alternative embodiment of a holder according to the invention.

Referring to FIG. 79, an alternative embodiment of a holder or support mechanism according to the invention is illustrated. Only a rear perspective view of this holder or support mechanism is illustrated for simplicity. In this embodiment, the holder 5600 includes a body 5610 that has an opening formed 5612 therein. The holder 5600 includes a support 5620 that has a rotating base 5630 removably mounted in the opening 5612 and rotatable relative to the body 5610 about an axis extending through the support 5620. Coupled to the base 5620 are two coupling members 5640 and 5650 and an engagement arm 5660. The support 5620 operates in substantially the same way as support portion 5100 of holder 5000 with the exception that the U-shaped coupling member 5300 is replaced by coupling members 5640 and 5650 and the shape of the engagement member 5500 is changed accordingly.

As shown in FIG. 79, a holder or coupler 5080 can be coupled to an electronic device 5070 via a coupling mechanism 5082, which engages the device 5070. The holder 5080 forms a sleeve and can be a fabric shell, a leather shell, a rubber shell, a co-molded rubber and fabric shell, a shell with plastic portions, or other suitable material, or any combination thereof. The holder 5080 includes a piece of material 5084 that defines a receptacle 5086 in which the body 5610 can be inserted as shown. The material 5084 includes an edge 5088 that defines an opening 5090 through which the support portion 5620 can pass when the support portion 5620 is moved to an extended position.

Figure 79A:
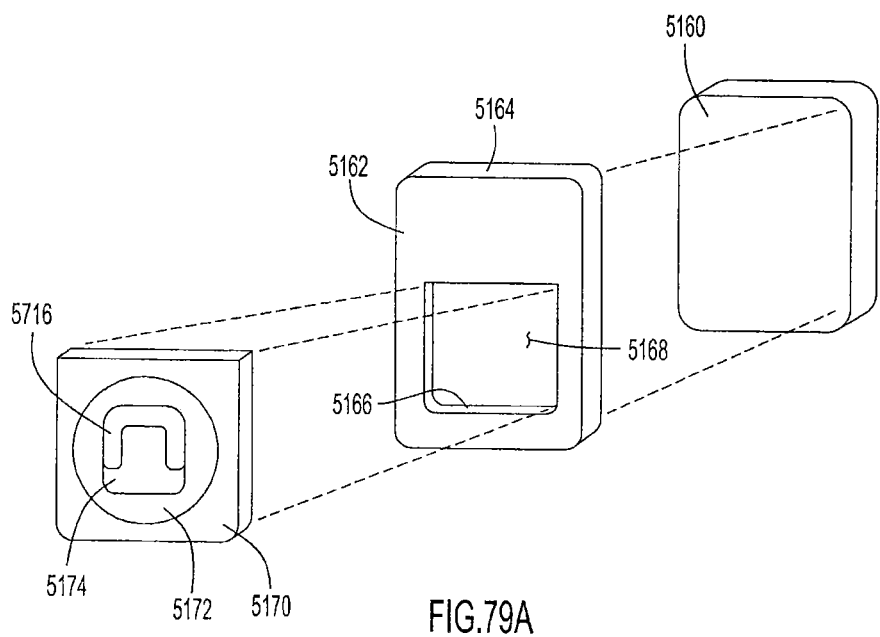
FIG. 79A illustrates a rear perspective view of an alternative embodiment of a holder and a support according to the invention.
Figure 79B:
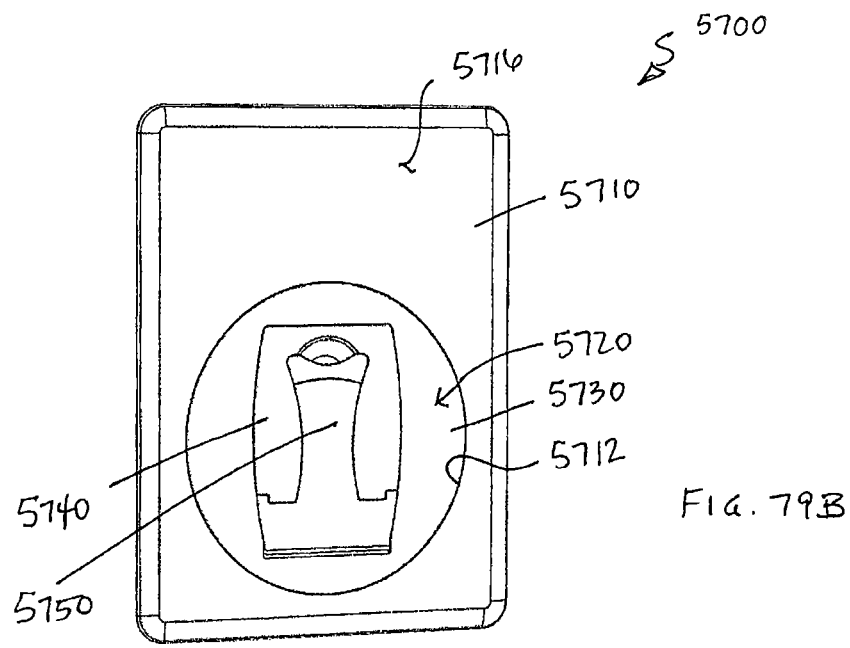
FIGS. 79B and 79C illustrate rear and front perspective views of another embodiment of a holder and a support according to the invention, respectively.
Figure 79C:
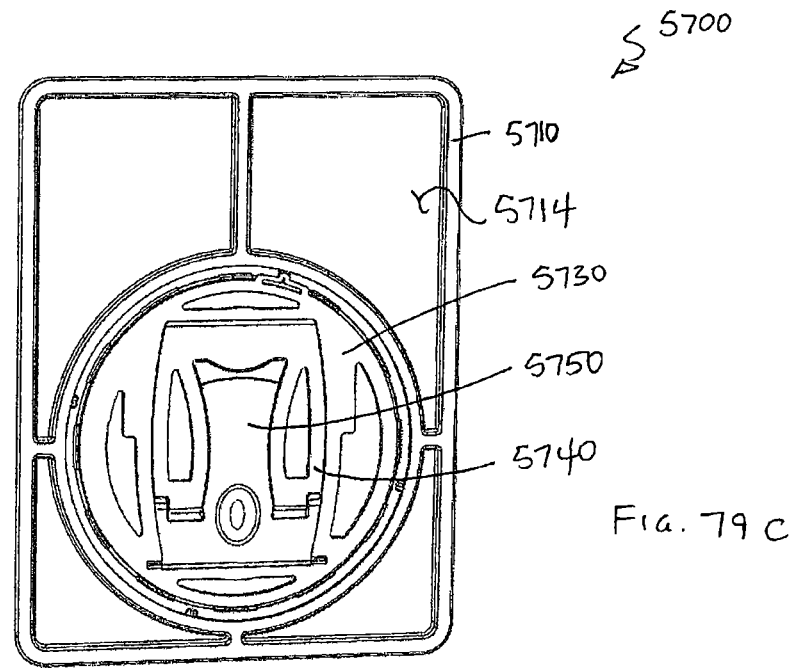

Referring to FIGS. 79B and 79C, rear and front perspective views of another embodiment of a holder that can be used with holder or coupler 5080 are illustrated. In this embodiment, the holder 5700 has a body 5710 with a front surface 5714 and a rear surface 5716 with an opening 5712 therebetween. Rotatably mounted in the opening 5712 is a support 5720 that includes a rotating base 5730 with a coupling member 5740 and an engagement arm 5750.

Referring to FIG. 79A, in another embodiment, a coupler 5162 includes a coupling mechanism 5164 that can be coupled to an electronic device 5160. The holder 5162 includes an edge 5166 that defines an opening 5168 into which a plate 5170 can be easily inserted. The plate 5170 includes a support with a rotatable base 5172 and movable support components 5174 and 5176 that can be used to support the electronic device 5160. When desired, the plate 5170 can be decoupled from holder 5162, or can be fixedly attached. The plate can be coupled to the holder 5162 in the opening 5168 via a snap fit arrangement, fasteners, a friction fit, a slide-in sleeve, with rivets, sewn-in, via magnets, an adhesive, or other connectors or techniques.

Figures 79D, 79E:
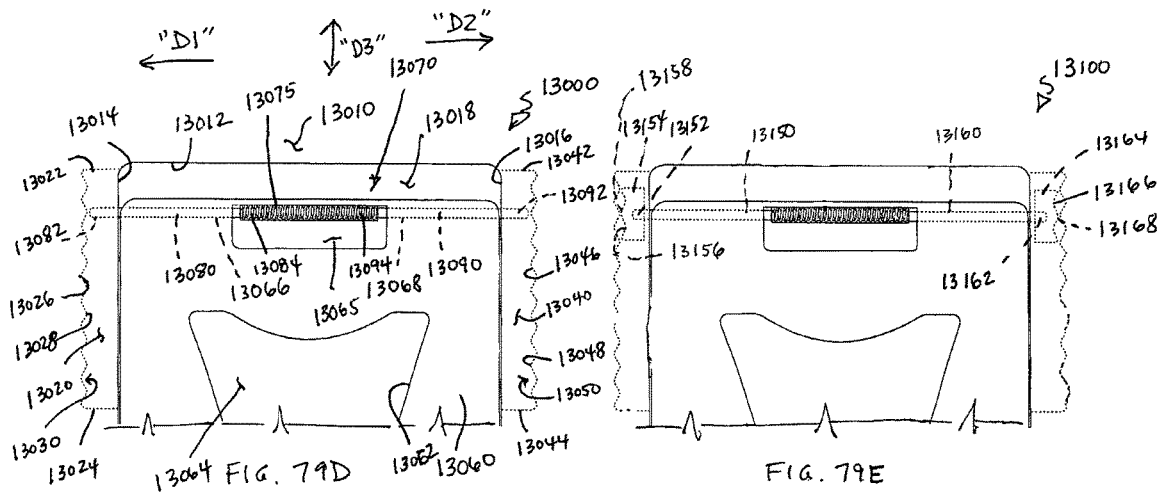
FIGS. 79D-79J illustrate close-up views of different embodiments of locating mechanisms according to the present invention.

Referring to FIG. 79D, an exemplary embodiment of a locating mechanism that can be used to locate and retain a support in a particular position is illustrated. While only portions of the support 13000 are illustrated, it is to be understood that the features of support 13000 can be used with any of the cases or holders described herein. Support 13000 includes a rotating base 13010 that has an inner end wall 13012 and opposing side walls 13014 and 13016 that collectively define an opening 13018 that is configured to receive coupling member 13060 when the coupling member 13060 is in its collapsed or retracted position. Side wall 13014 includes a groove 13020 formed therein with opposite ends 13022 and 13024 and an inner wall 13026 extending between the ends 13022 and 13024. Located along the inner wall 13026 are several projections 13028 that define notches 13030 therebetween. Similarly, side wall 13016 includes a groove 13040 with opposite ends 13042 and 13044 and an inner wall 13046 with projections 13048 and notches 13050.

Coupling member 13060 includes a wall 13062 that defines an opening 13064 that is configured to receive a support arm (not shown in FIG. 79D) when the support arm is in its collapsed or retracted position or configuration. Proximate to an end of coupling member 13060 is an opening 13065 that is in communication with two channels 13066 and 13068 that extend between the opening 13065 and respective outer walls or sides of the coupling member 13060.

The locating mechanism 13070 is used to locate and retain the coupling member 13060, and as a result the support 13000 as a whole, in a particular configuration and position relative to the rotating base 13010. In this embodiment, the locating mechanism 13070 includes a pair of pins 13080 and 13090 that are slidably mounted in the channels 13066 and 13068, respectively. The pins 13080 and 13090 have outer ends 13082 and 13092 and inner ends 13084 and 13094.

A biasing member 13075, such as a spring, is mounted on the inner ends 13084 and 13094 of the pins 13080 and 13090 and biases the pins 13080 and 13090 outwardly along the directions of arrows "D1" and "D2," respectively. When the pins 13080 and 13090 are biased in those directions, the outer ends 13082 and 13092 of the pins 13080 and 13090 engage the notches 13030 and 13050 in the inner walls 13026 and 13046 of the grooves 13020 and 13040. The biasing member 13075 applies a sufficient force to the pins 13080 and 13090 so that the pins 13080 and 13090 remain engaged with a particular pair of notches 13030 and 13050 unless moved by a user.

The pins 13080 and 13090 are metal and the rotating base 13010 is molded plastic. In this embodiment, the only surfaces that frictionally engage each other as the coupling member 13060 is moved along the directions of arrow "D3" relative to the rotating base 13010 are the outer ends 13082 and 13092 of the pins 13080 and 13090 and the inner walls 13026 and 13046. The limited engagement of surfaces in this embodiment reduces the wear on the inner walls 13026 and 13046, thereby lengthening the useful life of the parts.

Referring to FIG. 79E, in this embodiment, support 13100 is generally the same as support 13000 except that the pins 13150 and 13160 have engagement members 13154 and 13164 on ends 13152 and 13162. Members 13154 and 13164 are formed of molded plastic and include surfaces 13156 and 13166 with projections 13158 and 13168 that are configured to engage the inner walls of the grooves to locate the pins 13150 and 13160 relative to the base unless the coupling member is moved by a user. In this embodiment, the only surfaces that frictionally engage each other are both molded plastic, which reduces the friction between the surfaces as the coupling member is moved. Further, in this embodiment, the larger engagement surface of 13154 and 13164 spread the frictional forces over a larger area thereby lengthening the useful life of the parts.

Figures 79F, 79G:
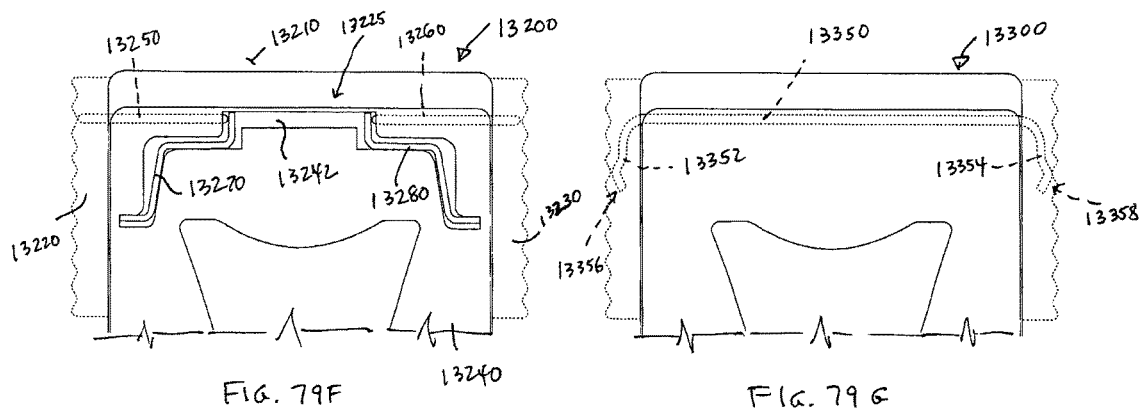

Referring to FIG. 79F, alternative support 13200 includes a base 13210 with opposing side walls with grooves 13220 and 13230 formed therein. The support 13200 includes a coupling member 13240 and a locating mechanism 13225 that can be used to locate the coupling member 13240. Locating mechanism 13225 includes a pair of pins 13250 and 13260 and a pair of biasing members 13270 and 13280 that engage the inner ends of the pins 13250 and 13260 to bias the outer ends of the pins 13250 and 13260 outwardly into engagement with the inner walls of the grooves 13220 and 13230. The biasing members 13270 and 13280 are bent metal pieces that are inserted into the stepped groove 13242 of the coupling member 13240.

Referring to FIG. 79G, alternative support 13300 has a locating mechanism that includes a resilient pin 13350, formed of metal, that is molded or inserted into a channel in the coupling portion and has its ends 13352 and 13354 bent to form engaging portions 13356 and 13358, respectively. Resilient pin 13350 could be two separate pins instead of a single pin. Each of the engaging portions 13356 and 13358 has one or more projections formed therein that can engage one of the notches formed in the sidewall of a corresponding groove.

Figures 79H, 79I:
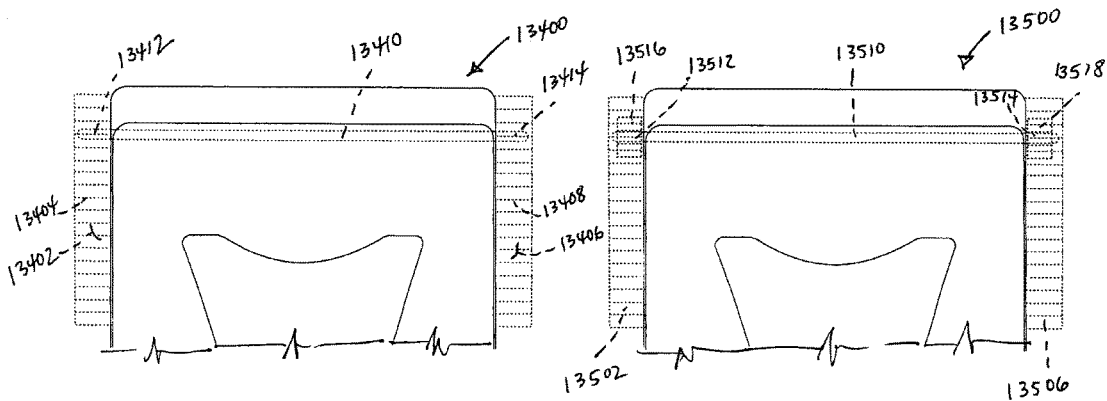

Referring to FIG. 79H, alternative support 13400 has a locating mechanism that includes a pin 13410 with opposite ends 13412 and 13414 that are inserted into opposing grooves 13402 and 13406. Resilient pin 13410 could be two separate pins instead of a single pin. In this embodiment, instead of the projections and notches being formed in the inner side walls of the grooves 13402 and 13406, the projections 13404 and 13408 are formed in one or more of the opposing top and bottom walls defining the grooves 13402 and 13406.

Referring to FIG. 79I, alternative support 13500 has a locating mechanism that includes a pin 13510 with opposite ends 13512 and 13514 that have engagement members 13516 and 13518 mounted thereto. Resilient pin 13510 could be two separate pins instead of a single pin. Each of the engagement members 13516 and 13518 has opposing surfaces with projections and notches that engage the projections and notches formed in the opposing top and bottom walls defining the grooves 13502 and 13506.

Figure 79J:
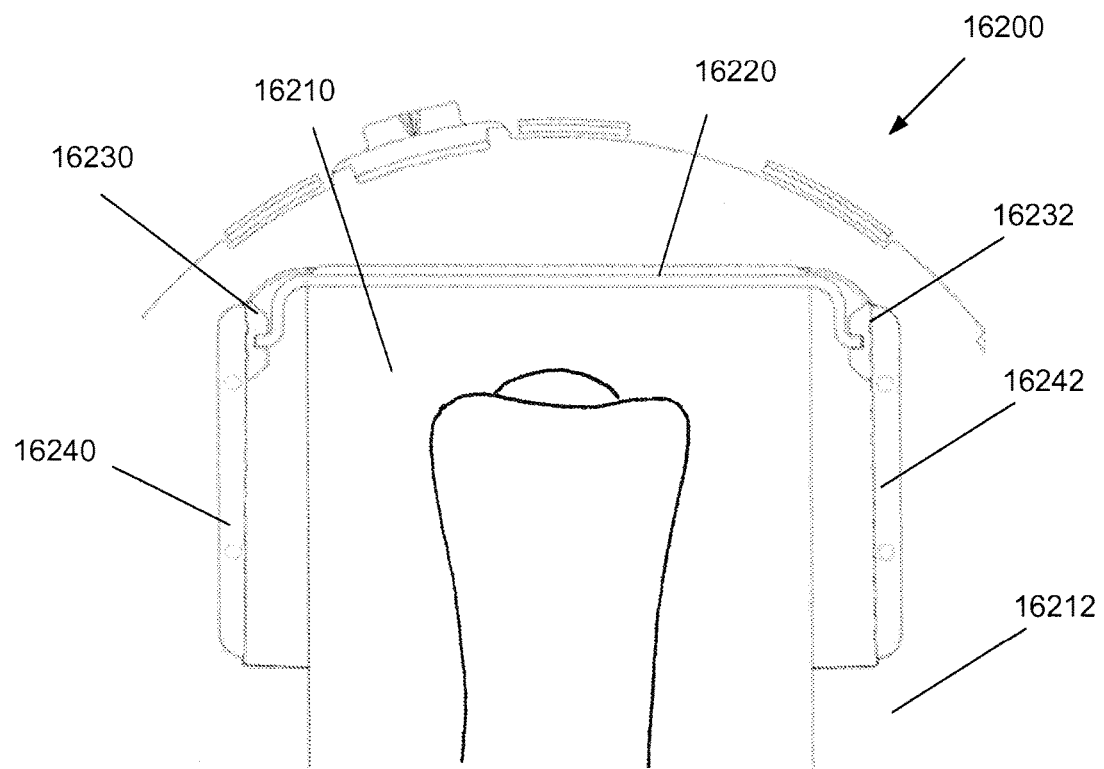

Referring to FIG. 79J, another embodiment of a locating mechanism for a holder according to the present invention is illustrated. Only a portion of the holder is illustrated for simplicity. As shown, the holder includes a support 16200 that has a repositionable arm or body 16210 and a base 16212. Similar to the previously described embodiments, the body 16210 has a pin 16220 coupled thereto. The pin 16220 is made of steel and has a spring-like or resilient characteristics such that the portions of the pin 16220 extending beyond the arm 16210 can bend and flex.

The pin 16220 has opposite ends to which sliders or positioning members 16230 and 16232 are coupled. Each of the positioning members 16230 and 16232 has a contact or sliding surface that has several grooves formed therein. The support 16200 also includes a pair of engagement members 16240 and 16242 that are coupled to the base 16212. Engagement members 16240 and 16242 can also be integrally formed with base 16212. As the arm 16210 is moved to reposition the support, the positioning members 16230 and 16232 slide along the engagement members 16240 and 16242, and the grooves and ridges formed in each of the surfaces engages those in the opposing surface. In this embodiment, the engagement members 16240 and 16242 and positioning members 16230 and 16232 are formed of chromed zinc material, which enhances the longevity of the surfaces and improves their wear through the repeated adjustment of the support. In other embodiments, the members 16230, 16232, 16240, and 16242 are made of a material that is durable and generally resistant to wear.

Figure 80:
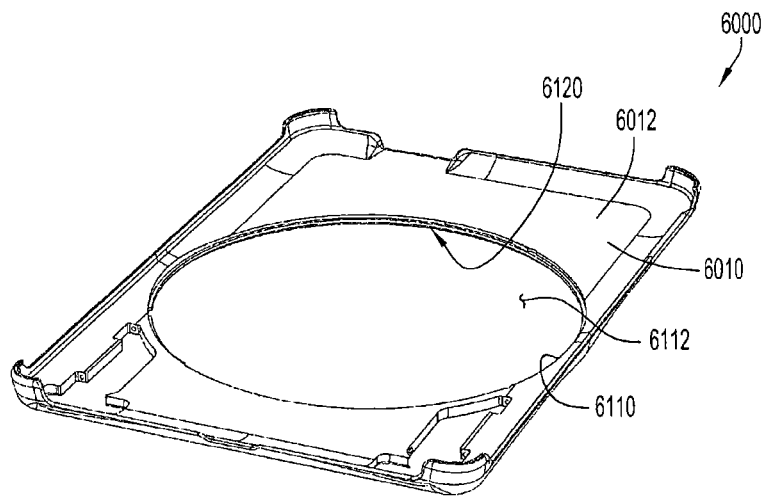
FIG. 80 illustrates a perspective view of a body of another embodiment of a holder according to the present invention.

Referring to FIGS. 80-86, an exemplary embodiment of a holder body and a support removably coupleable to the holder body is illustrated. In FIG. 80, a perspective view of the body 6010 of the holder 6000 is illustrated. The body 6010 includes an inner surface 6012 with an edge or wall 6110 that defines an opening 6112, which is circular. The wall 6110 includes a coupling mechanism 6120 that is used to couple a base 6300 of a support portion 6200 to the body 6010 (see FIG. 81).

Figure 81:
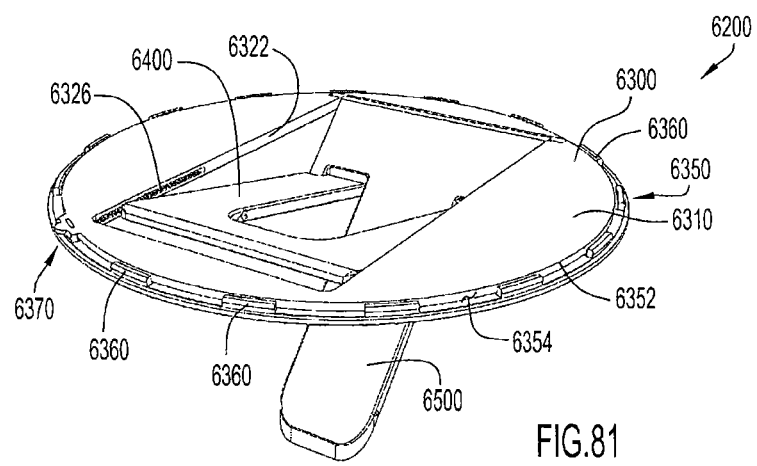
FIG. 81 illustrates a perspective view of the support portion of the holder illustrated in FIG. 80.

Referring to FIG. 81, a perspective view of the support portion 6200 is illustrated. In this embodiment, the support portion 6200 includes an engagement member 6500, a coupler 6400, and a body 6310 with an outer edge that defines a perimeter and an inner side wall 6322 with a slot 6326 formed therein. Located along the perimeter of the body 6310 is a coupling mechanism 6350 that is used with coupling mechanism 6120 to couple the base 6300 to the body 6010. Coupling mechanism 6350 includes several spaced apart guide members 6360 with one locator member 6370. In this embodiment, the guide members 6360 and locator member 6370 are integrally formed with the body 6310 and are located within a space 6354 that is defined by an edge 6352.

Figure 83:
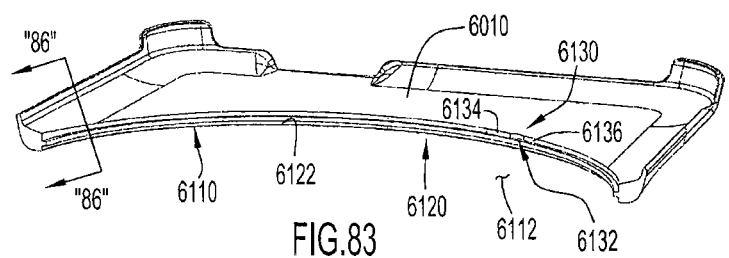
FIG. 83 illustrates a perspective view of part of the body of the holder illustrated in FIG. 80.
Figure 86:
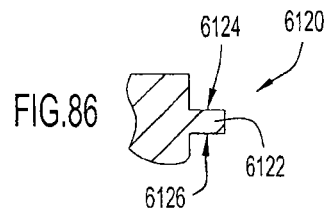
FIG. 86 illustrates a partial cross-sectional view showing a guide member on the base illustrated in FIG. 83 taken along the line "86-86."

Referring to FIG. 83, a partial cross-sectional view of the body 6010 is illustrated. As shown, the coupling mechanism 6120 of the body 6010 includes a ridge 6122 that extends around the opening 6112. Located at particular locations along the wall 6110 are positioners 6130 (only one shown in FIG. 83) which provide a slight positive locking effect or feeling to the user when the base 6300 is rotated to a position corresponding to a positioner 6130. Each positioner 6130 includes tapered surfaces 6134 and 6136 that lead to a detent or notch 6132. Referring to FIG. 86, the ridge 6122 has an upper surface 6124 that is engaged by the base 6300 when the base 6300 is inserted into the opening 6112, and a lower surface 6126.

Figure 82:
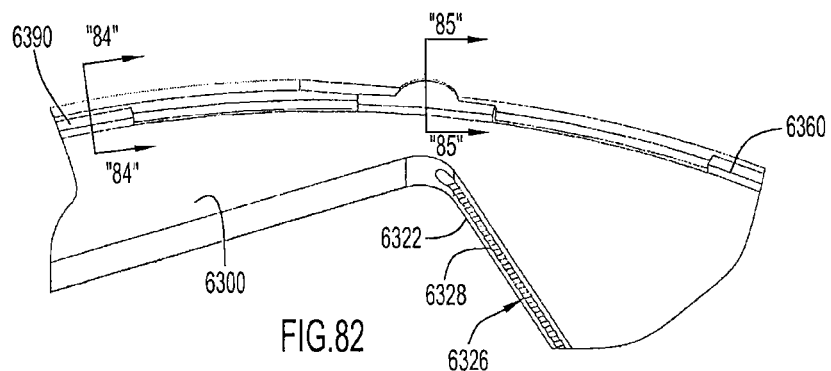
FIG. 82 illustrates a perspective view of part of the support portion illustrated in FIG. 81.
Figure 84:
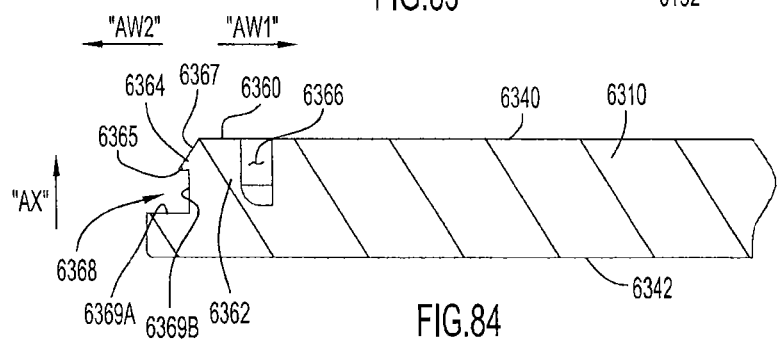
FIG. 84 illustrates a partial cross-sectional view of part of the support portion of the holder illustrated in FIG. 82 taken along the line "84-84."
Figure 85:
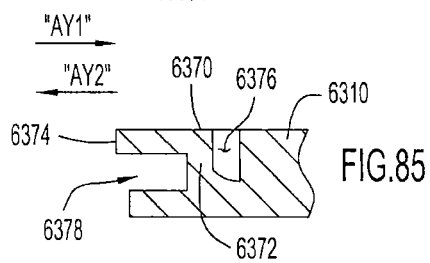
FIG. 85 illustrates a partial cross-sectional view showing a locating member of the base illustrated in FIG. 82 taken along the line "85-85."

Referring to FIGS. 82, 84, and 85, the coupling mechanism 6350 of the base 6300 is illustrated. In the partial view of FIG. 82, two guide members 6360 and locator member 6370 are illustrated.

As shown in FIG. 84, the base body 6310 has an inner surface 6340 and an outer surface 6342. Guide member 6360 is integrally formed with the body 6310. Guide member 6360 includes a body portion 6362 that extends from a lower part of body 6310 and is spaced apart from the main portion of body 6310 by a gap or space 6366, which allows the guide member 6360 to move along the directions of arrows "AW1" and "AW2," depending on the force applied to guide member 6360. The guide member body 6362 includes a projecting portion 6364 with a tapered surface 6367 that engages the lower surface 6126 of the ridge 6122 when the base 6300 is inserted along the direction of arrow "AX" in FIG. 87 into the opening 6112 of holder body 6010. When tapered surface 6367 engages the lower surface 6126, the projecting portion 6364 is moved inwardly along the direction of arrow "AW1" until the tip 6365 clears the ridge 6122. Once the tip 6365 clears the ridge 6122, the projecting portion 6364 returns along the direction of arrow "AW2" to its position shown in FIG. 87. In this position, the lower surface of the tip 6365 rests on the upper surface 6124 of the ridge 6122, thereby mounting the base 6300 in the opening 6112 of the holder body 6010. As a result, the ridge 6122 is captured in the space or groove 6368 formed by the tip 6365 and walls 6369A and 6369B and the base 6300 is coupled to the holder body 6010.

As shown in FIG. 85, locator member 6370 is integrally formed with the body 6310. Locator member 6370 includes a body portion 6372 that extends from a lower part of body 6310 and is spaced apart from the main portion of body 6310 by a gap or space 6376, which allows the locator member 6370 to move along the directions of arrows "AY1" and "AY2," depending on the force applied to locator member 6370. The locator member body 6372 includes a projecting portion 6374 with an end that is configured to engage the detent 6132 of a positioner 6130. The projecting portion 6374 is illustrated in its normal or rest position in FIG. 85.

When the base 6300 is inserted into the opening 6112 of holder body 6010, the projecting portion 6374 is moved inwardly along the direction of arrow "AY1" until the projecting portion 6374 clears the ridge 6122. The projecting portion 6374 then returns along the direction of arrow "AY2" to its position shown in FIG. 88. In this arrangement, the ridge 6122 is captured in the space or groove 6378 formed by the projecting portion 6374 and the adjacent walls of the base 6300.

Thus, when a user is rotating the support portion 6200 to one of the portrait or landscape orientations, the locator member 6370 on the base 6300 can engage the appropriate positioner 6130 for the desired orientation to provide a mechanical confirmation or engagement that the user can feel to confirm that the support portion 6200 is appropriately located. The engagement between the locator member 6370 and the positioner 6130 can be overcome with a force sufficient to move the projecting portion 6374 out of the detent 6132 and over the tip of the corresponding tapered surface 6134 or 6136, depending on the direction of rotation. In one use of the holders according to the invention, while in a first orientation, the support portion can be removed from the body of the holder, turned or rotated to a second orientation, and then snapped back onto the holder body in the second orientation.

Figure 87:
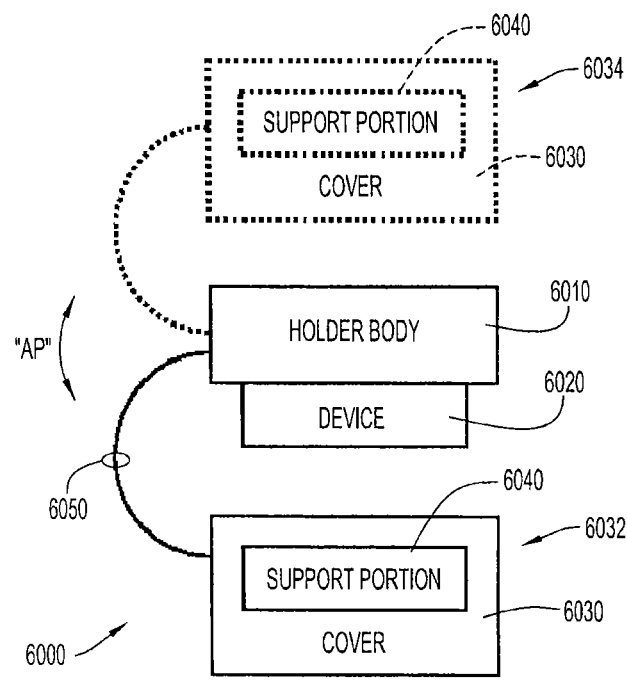
FIG. 87 illustrates a schematic block diagram of another embodiment of a holder according to the invention.

Referring to FIG. 87, a schematic block diagram of an alternative embodiment of a holder according to the invention is illustrated. In this embodiment, the holder 6000 includes a holder body 6010 to which an electronic device 6020 is coupled. Repositionable relative to the holder body 6010 is a cover 6030 that is placeable in a first or covering position 6032 in which the cover 6030 is in front of the device 6020 and provides protection thereto. In addition, the cover 6030 is placeable in a second or support position 6034 in which the cover 6030 is in back of or behind the holder body 6010. In this position 6034, a support portion 6040 coupled to the cover 6030 can be deployed or extended to engage a support surface or be held by user to support the holder body 6010 and the device 6020 as desired.

In one embodiment, the cover 6030 can be pivotally coupled to the body 6010 and movable along the directions of arrows "AP" between positions 6032 and 6034 by rotating the cover 6030 about its connection 6050 to holder body 6010. In another embodiment, the cover 6030 can be slidably coupled to the body 6010. In various embodiments, the cover 6030 can be moved around any one of the sides of the body 6010, the top of the body 6010, or the bottom of the body 6010. In another embodiment, the cover 6030 can be removably coupled to the body 6010 in the front and in the back by a conventional fastening technique or mechanism, including a snap arrangement, hook and loop materials, or a tongue and groove arrangement. Depending on the particular mechanism used, the cover 6030 can be taken off of the front of the body 6010 and attached to the back of the body 6010. The cover 6030 can also be coupled using rivets to a movable member that is coupled to the body 6010.

Figure 88:
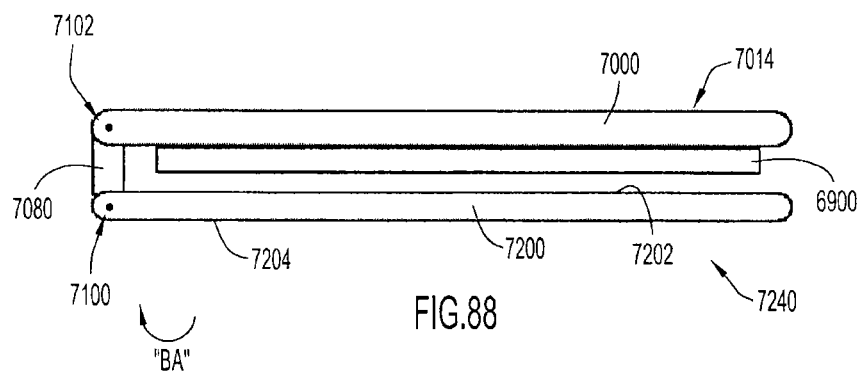
FIGS. 88 and 89 illustrate schematic diagrams of another embodiment of a holder in different configurations.
Figure 89:
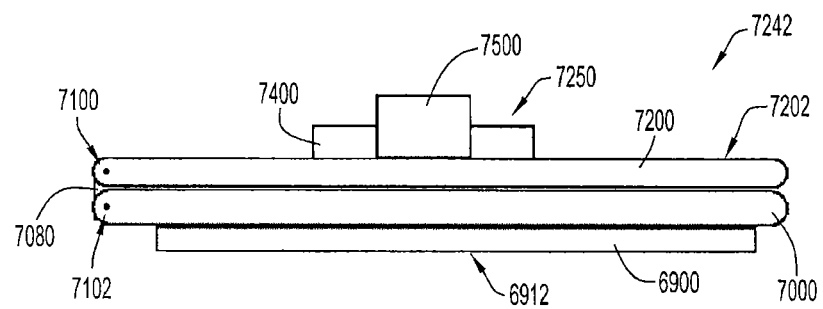

Referring to FIGS. 88 and 89, a cover 7200 can be placed in a covering position 7240 (see FIG. 88) in which the cover 7200 is located in front of an electronic device 6900 coupled to holder 7000. In this position 7240, the cover 7200 provides protection to the electronic device 6900. The cover 7200 can also be placed in a supporting position 7242 (see FIG. 89) in which the cover 7200 is located in back of the electronic device 6900 and holder 7000. In this position 7242, the cover 7200 does not obstruct the viewing or use of the front surface 6912 of the electronic device 6900 and can be reconfigured to provide support to the holder 7000 and the device 6900.

In this embodiment, at least one hinge 7080 couples the cover 7200 to the holder 7000. Connectors, such as pins, connect hinge 7080 to the cover 7200 and to the holder 7000. The connectors and hinge 7080 are aligned such that the connectors define axes 7100 and 7102 about which the cover 7200 and the hinge 7080 rotate.

Referring to FIGS. 88-89, the cover 7200 includes an inner surface 7202, an outer surface 7204, and opposite side ends. The hinge 7080 is coupled to one side of the cover 7200. While not shown in FIG. 88, the opposite side of the cover 7200 may have a curved configuration which wraps around and engages a portion of the side of the housing 7000 to maintain the cover 7200 in this covering position 7240. The cover 7200 can be pivoted along the direction of arrow "BA" about axis 7100. Either at the same time or subsequent thereto, the hinge 7080 can be pivoted along the direction of arrow "BA" about axis 7102.

Referring to FIG. 89, the hinge 7080 has been rotated about axis 7102 and cover 7200 has been rotated about axis 7100. In this configuration, the cover 7200 is in its supporting position 7242. Notably, due to the hinge 7080, the inner surface 7202, which was facing inward toward the electronic device 6900 when the cover 7200 is in its covering position 7240, is now facing outward away from the holder 7000 and the electronic device 6900. As described in detail below, the cover 7200 includes a support portion 7250 coupled thereto. The inverting of the cover 7200 relative to the holder 7000 exposes the members 7400 and 7500 of the support portion 7250 only when it is desired. In other words, the support portion 7250 is exposed and useable when the cover is in its supporting position 7242 and is not usable when the cover 7200 is in its covering position 7240. In addition, the likelihood that the support portion 7250 is inadvertently engaged or moved when it is not desired to do so, as in position 7240, is reduced.

Figure 89A:
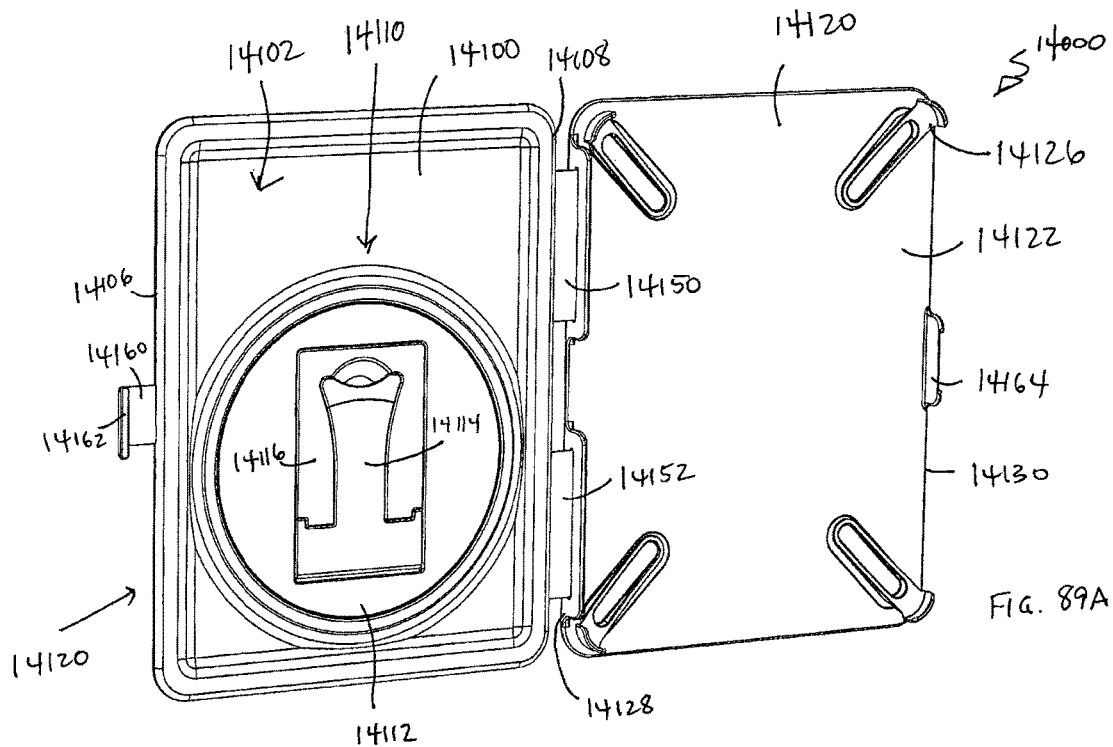
FIGS. 89A and 89B illustrate perspective views of another embodiment of a holder.
Figure 89B:
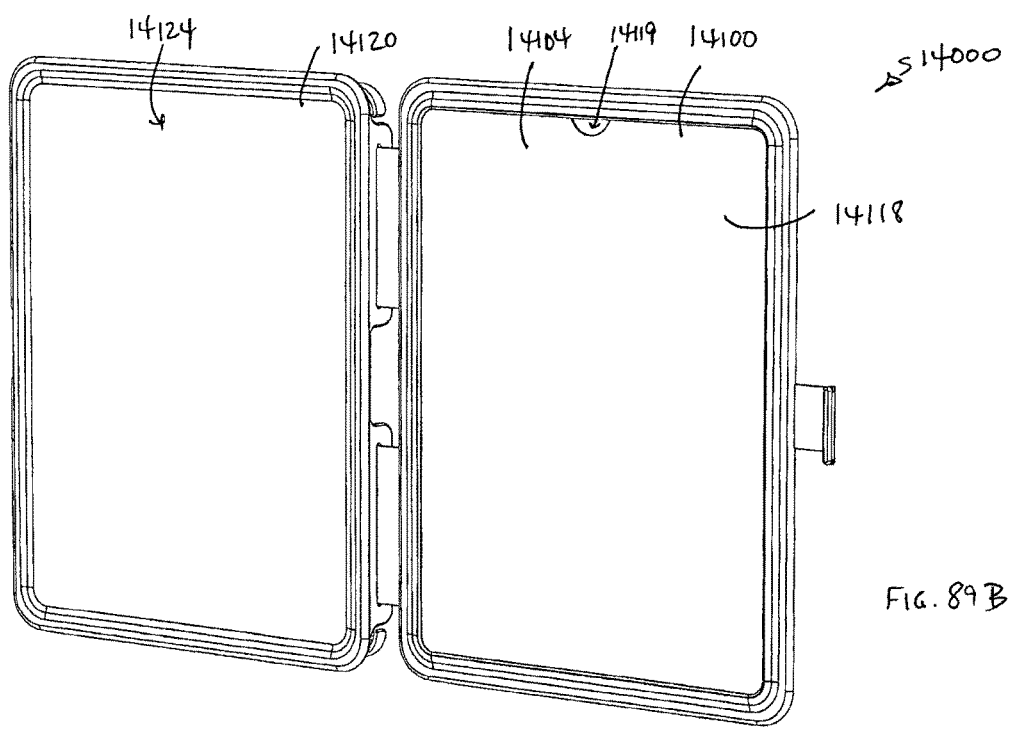

Referring to FIGS. 89A and 89B, an alternative embodiment of a holder for an electronic device is illustrated. In this embodiment, the holder 14000 includes a cover 14100 with opposite sides 14102 and 14104 and edges 14106 and 14108. A support portion 14110 with a rotating base 14112, a support arm 14114, and a coupling member 14116 is mounted to side 14102 of the cover 14100. On the other side 14104 a decorative panel or material is located 14118 with a thumb hole 14119. The panel 14118 can be interchanged with other panels that can mounted to cover 14100 via one or more connections such as post and hole combinations.

Cover 14100 is movably coupled to plate 14120 which has sides 14122 and 14124 and several mounts 14126 that are configured to retain an electronic device. Edge 14128 is coupled to edge 14108 via hinges 14150 and 14152, which can be a fabric material or a resilient material such as rubber. Cover 14100 can be retained in a closed position over an electronic device via latch 14160 by using end 14162 with engagement portion 14164.

Figure 89C:
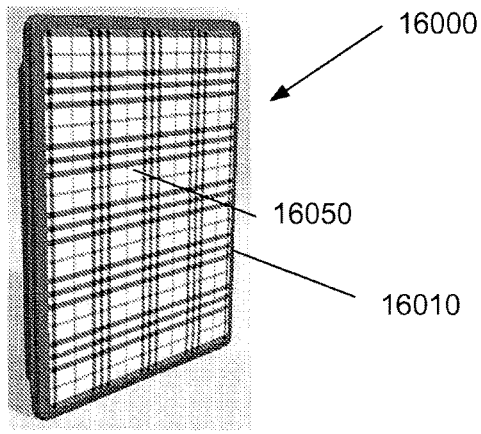
FIGS. 89C-89G illustrate different views of another embodiment of a holder according to the invention.

Referring to FIGS. 89C-89G, an alternative embodiment of a holder for a device according to the present invention is illustrated. Referring to FIG. 89C, a perspective view of the holder 16000 in a closed configuration is illustrated. The holder 16000 includes a cover 16010 to which an interchangeable layer of material 16050 is removably coupled or mounted. The layer of material 16050 can be referred to alternatively as a membrane, a skin, a panel, or a sheath for the cover 16010. The material 16050 can be any type of material, including a flexible material, such as a fabric made of synthetic and/or natural materials, or a molded material that is flexible, semi-rigid, or rigid.

In this embodiment, the layer 16050 is easily removable from the cover 16010, which allows a user to change the appearance or ornamental aspects of the holder 16000. The exemplary illustrated material 16050 has a plaid design, and when a user wishes to change the appearance of the holder 16000, the user can remove the material 16050 and couple a material with a different pattern to the cover 16010. In alternative embodiments, the material 16050 may include multiple layers that are placed proximate to each other and/or coupled to each other.

Figure 89D:
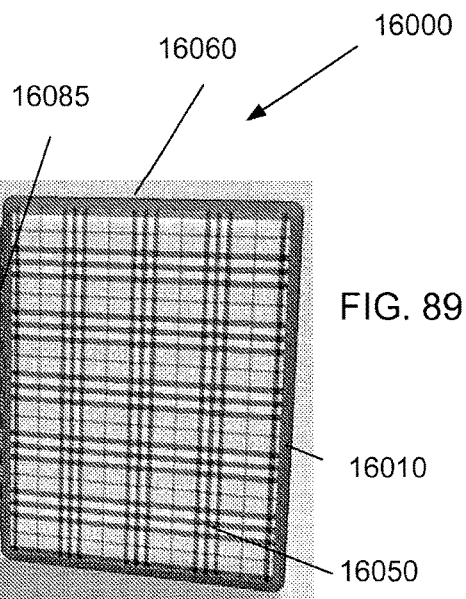
Figure 89E:
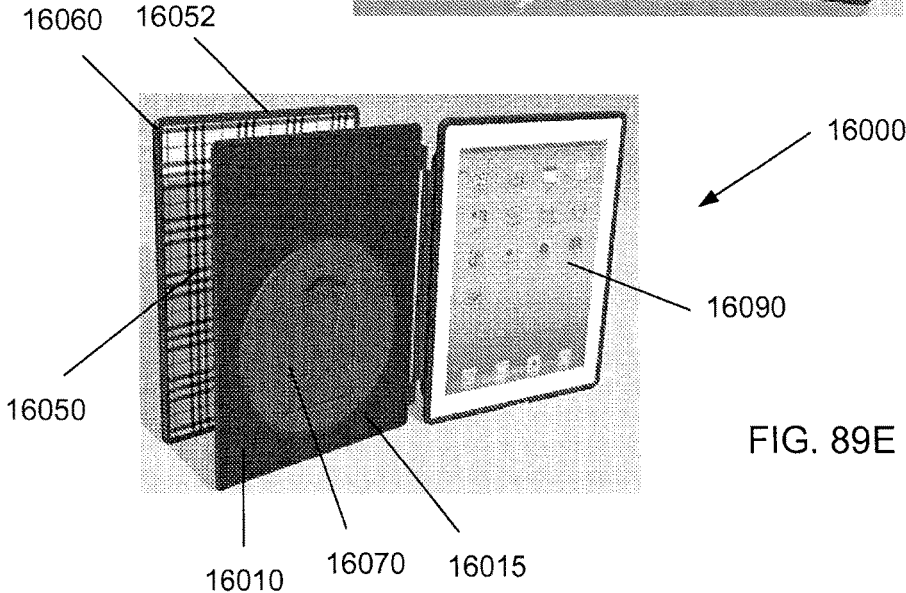

Referring to FIGS. 89D and 89E, the holder 16000 includes a plate 16080 to which an electronic device, such as device 16090, can be coupled, consistent with the various embodiments of the invention described herein. The plate 16080 is pivotally coupled to the cover 16010 via a hinge 16085, thereby allowing the cover 16010 to move between an opened position (see FIGS. 89D and 89E) and a closed position (see FIG. 89C). The cover 16010 includes a soft, protective contact material 16015, such as felt, coupled to the side of the cover 16010 that is proximate to and engages the touch screen of the electronic device 16090.

As shown in FIG. 89E, the cover 16010 includes a support 16070 that can be deployed to position the electronic device 16090 in a desired position and orientation. As illustrated, the layer of material 16050 is removable from the cover 16010. In this embodiment, a mounting component 16060 is configured to mount the layer or membrane 16050 to the cover 16010. The mounting component 16060 is sized to wrap around a portion of the cover 16010, such as the edge, and a portion of the perimeter 16052 of the layer or panel 16050, as described in detail below. The panel 16050 can include a cushioning material (not shown), such as foam, coupled to the side of the panel 16050 that is proximate to cover 16010 to provide a cushioned feel and protection to the panel 16050.

In one implementation, the mounting component 16060 is co-molded with the layer of material 16050. In another implementation, the mounting component 16060 is formed separately from the layer of material 16050 and is coupleable thereto. In this embodiment, the mounting component 16060 is visible on the exterior side of the layer or membrane 16050.

In another implementation, the layer of material 16050 is attached or integrally formed with another layer of material (now shown), that enables the combination of layers to be slid, slipped or pulled onto cover 16010 like a pillow case so that there is material on both sides of cover 16050.

Figure 89F:
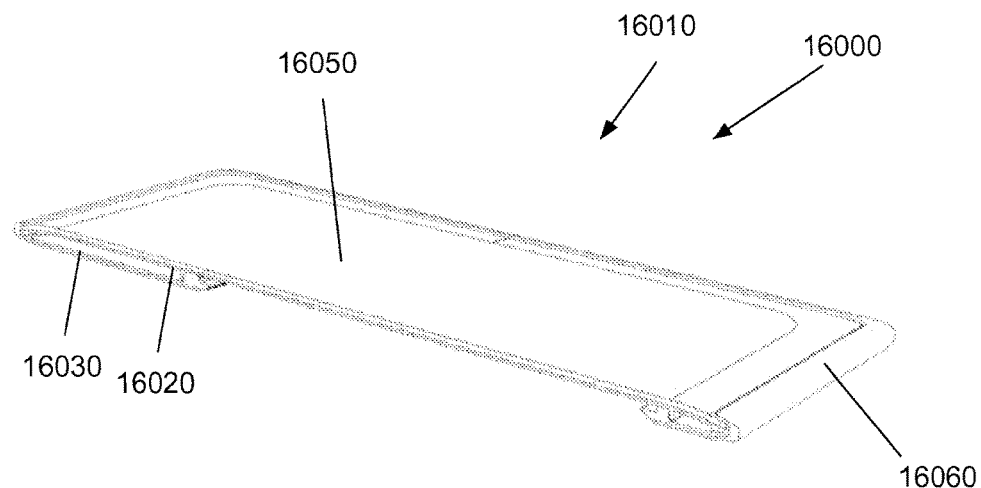
Figure 89G:
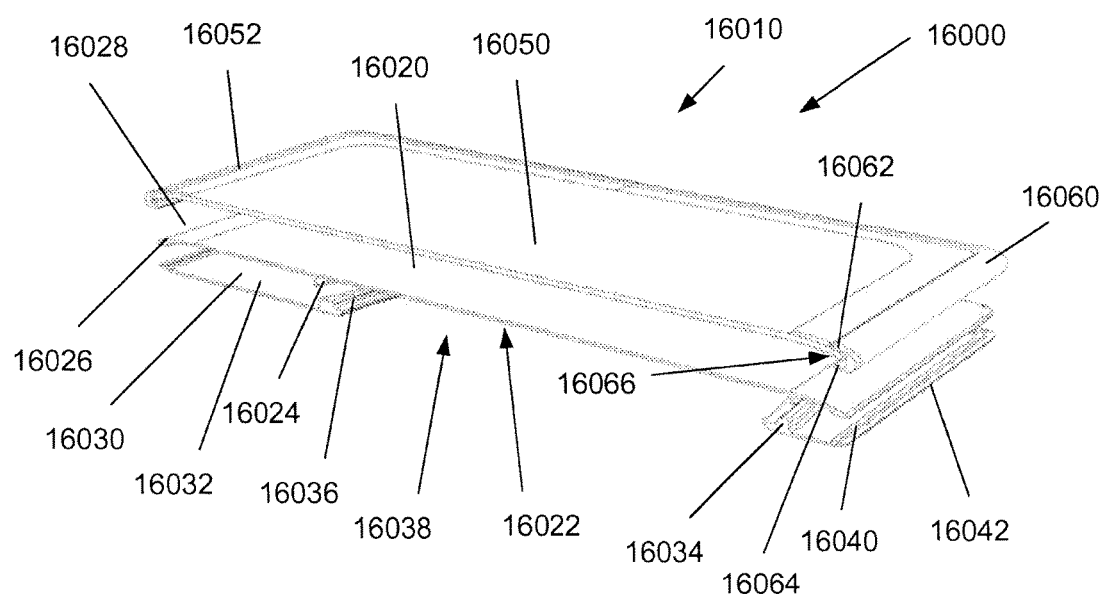
Figure 91:
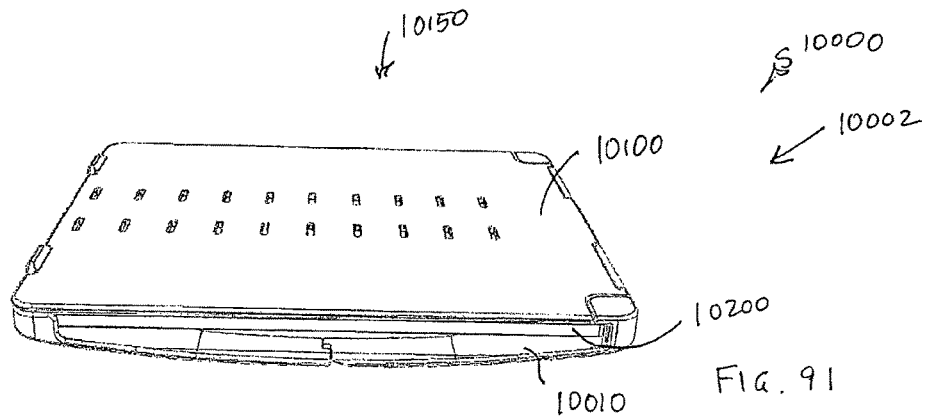
FIG. 91 illustrates a perspective view of another embodiment of a holder according to the invention.

Referring to FIGS. 89F and 89G, assembled and exploded cross-sectional views of the cover 16010 of the holder 16000 are illustrated. In this embodiment, the cover 16010 includes a plate 16020 that is coupleable to a base plate 16030. In this embodiment, the felt or soft material referenced above is coupled to the side of the base plate 16030 that faces down. The plate 16020 includes a side 16022 with a projection 16024 that extends therefrom in a circular configuration. Additional projections, ribs, or other structures can extend from plate 1620 and plate 16030 for structural stiffness reasons, and to enable the secure coupling of plates 16020 and 16030. The plate 16020 also includes an edge 16026 that defines a perimeter 16028.

The base plate 16030 of the cover 16010 has a side 16032 with a shoulder 16034 extending therefrom. The shoulder 16034 includes an edge 16036 that defines an opening 16038 into which a support may be inserted and mounted. The opening 16038 is circular, which facilitates the rotation of the inserted support to any desired position. The base plate 16030 has an outer edge 16040 that defines a perimeter 16042 of the base plate 16030. The combined panel 16020 and 16030 could also be a single integrally formed panel, with our without an attached support.

The mounting component 16060 is illustrated in detail in FIGS. 89F-89G, which shows the general u-shape or v-shape of the component 16060. The component 16060 includes flanges 16062 and 16064 that define a groove or receptacle 16066 therebetween. In one implementation, the component 16060 is formed of a resilient material, such as TPU or rubber, that allows the component 16060 to be stretched, but to return to its original position. As shown, the edge of the layer 16050 is located in the groove 16066. The component 16060 can be pulled to extend over or wrap around the edge 16028 of the plate 16020 and the edge 16040 of the base plate 16030.

Referring to FIGS. 89H and 89I, an alternative embodiment of a holder according to the present invention is illustrated. In this embodiment, no portion of the mounting component coupling the layer or membrane to the holder is visible on the outside. In this embodiment the layer is co-molded or otherwise fused with the mounting component. Holder 16000A includes a cover 16010A to which the layer or membrane 16050A is coupled in a "snap-on" manner. As a result, no rubber is located along the outer perimeter 16052A of the membrane 16050A. This configuration results in a more visually pleasing appearance as the layer is fully visible.

Figure 90:
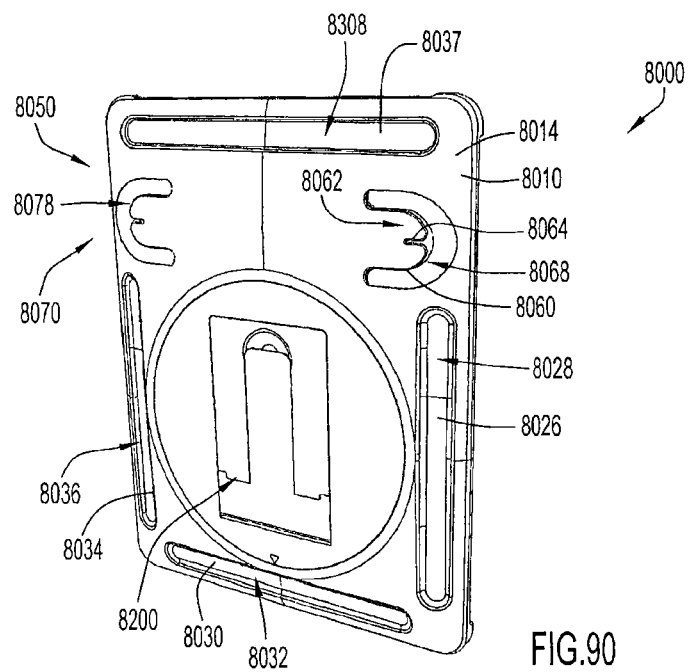
FIG. 90 illustrates a rear perspective view of another embodiment of a holder according to the invention.

Referring to FIG. 90, an alternative embodiment of a holder for an electronic device is illustrated. In this embodiment, the holder 8000 includes a body 8010 that has an outer surface 8014. Located around the outer surface 8014 of the body 8010 are several structures that facilitate the gripping and holding of the holder 8000 by a user. For example, the holder body 8010 includes a surface 8026 that defines a recessed area 8028 in which one or more fingers of a user can be located. The surface 8026 is positioned so that a user holding the holder 8000 with his or her left hand can engage the recessed area 8028 with one or more fingers to improve the gripping of the holder 8000 and device while viewing the device in a portrait orientation. In addition, surface 8030 defines a recessed area 8032 on the opposite side of the holder 8000 which can be engaged by the user's right hand in a portrait orientation. Also, when the user is holding the holder 8000 in a landscape orientation, the recessed area 8036 defined by surface 8034 and/or the recessed area 8038 defined by surface 8037 is engaged by the user, depending on which hand or hands are being used to grip the holder 8000.

In this embodiment, the holder 8000 also includes a cord management system 8050 that can be used to retain a cord coupled to an electronic device in a particular position. The cord management system 8050 includes a pair of projecting portions 8060 and 8070 that are defined by making cuts or slots in the outer surface 8014 to form the portions 8060 and 8070. Projecting portion 8060 includes a distal end 8062 with a slot 8064 formed therein. The slot 8064 can be used to tie-off the cord wrapped around the projecting portions 8060 and 8070. The slot 8064 can be placed anywhere on portion 8060. A slot forms a space or gap 8068 beneath the projecting portion 8060. As the cord is wrapped around the projecting portion 8060, the cord can be inserted into the gap 8068. Projecting portion 8070 is similarly constructed with a space or gap 8078 into which a cord can be wrapped.

Referring to FIGS. 91-103, another embodiment of a holder according to the present invention is illustrated. The holder 10000 has several configurations, including a folded or closed configuration 10002, an opened configuration 10004, and a deployed configuration 10006. In this embodiment, the holder 10000 includes a body 10010 to which an electronic device 10200 that has a display screen 10220 can be coupled and a cover 10100 that is movably coupled to the body 10010 by hinges or mounting elements 10106 and 10108 (see FIG. 92). The hinges 10106 and 10108 define axes 10114 and 10116 as shown in FIG. 92.

Figure 92:
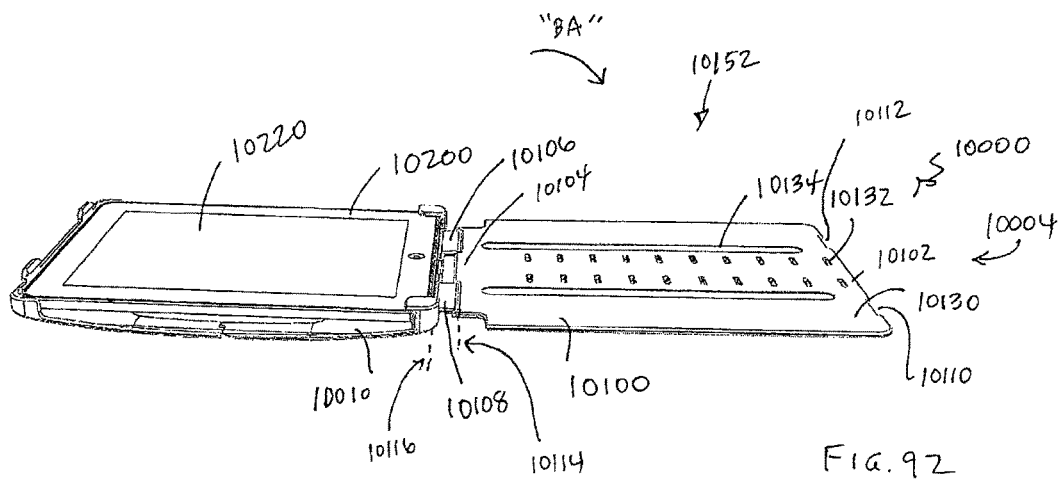
FIG. 92 illustrates a perspective view of the holder illustrated in FIG. 91 with its cover in an opened position.
Figure 93:
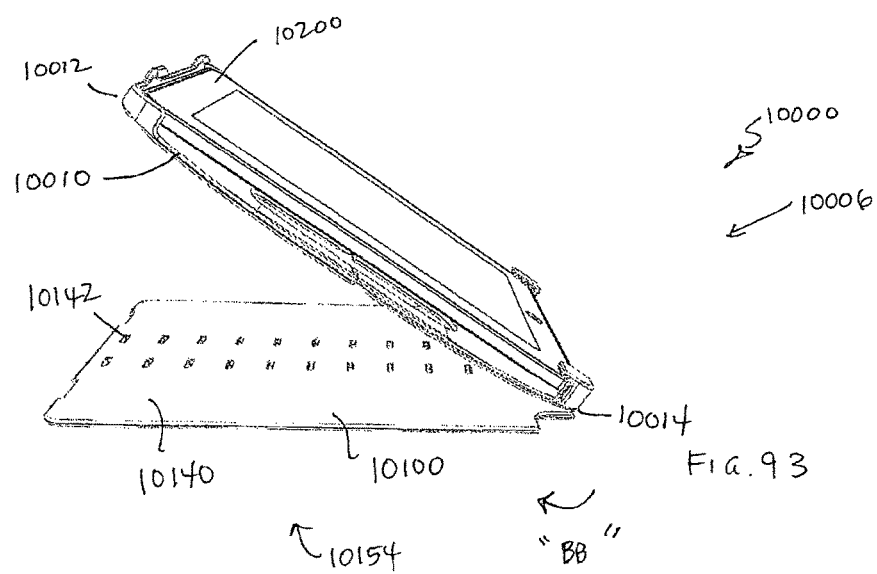

The cover 10100 can be moved between a closed position 10150 (see FIG. 91) along the direction of arrow "BA" to an opened position 10152 (see FIG. 92) and along the direction of arrow "BB" to a deployed position 10154 (see FIG. 93).

Referring to FIG. 92, the cover 10100 has opposite ends 10102 and 10104. Along end 10102 are notches 10110 and 10112 (best illustrated in FIG. 95) that are configured to receive tabs 10032 and 10034 of wall 10030 of body 10010. When the tabs 10032 and 10034 engage notches 10110 and 10112, the cover 10100 is retained in its closed position 10150. Referring to FIGS. 92 and 93, the cover 10100 has a surface 10130 with notches or openings 10132 and grooves 10134 and an opposite surface 10140 with notches or openings 10142. In one embodiment, the grooves 10134 will be filled with rubber. In different embodiments, the rubber will be flush with the surface 10130 or extend outwardly slightly from the surface 10130.

Figure 94:
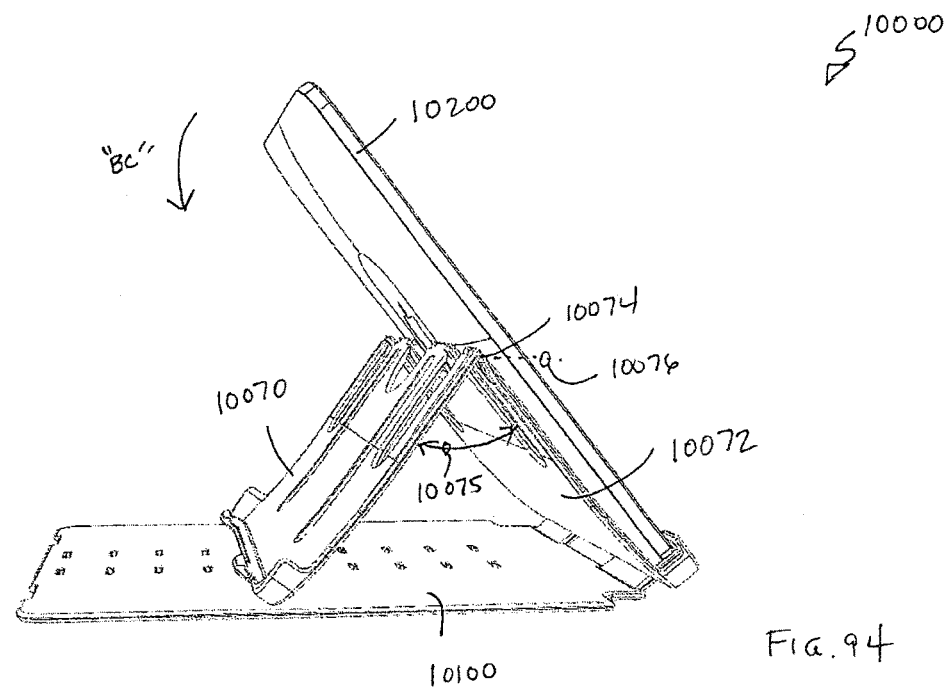
Figure 95:
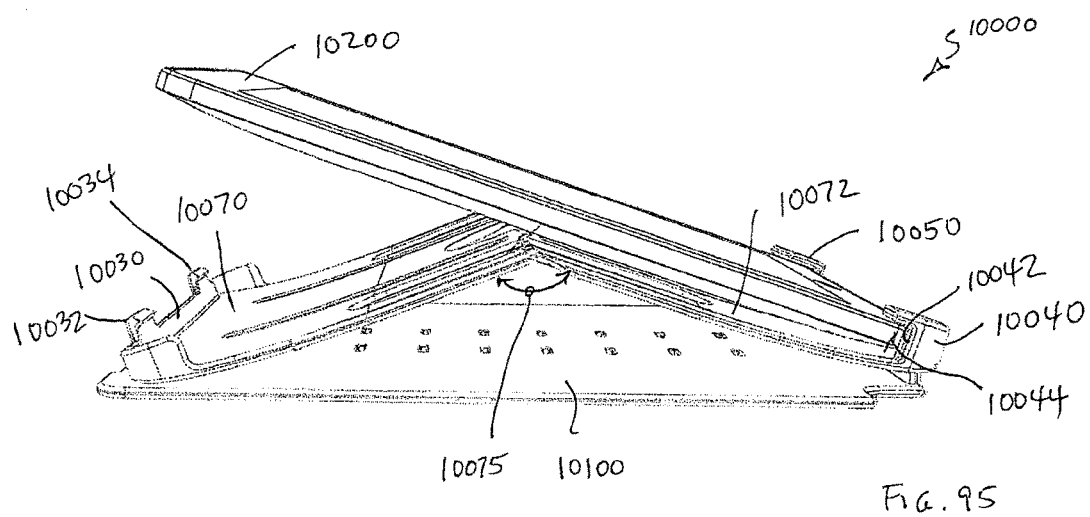
Figure 96:
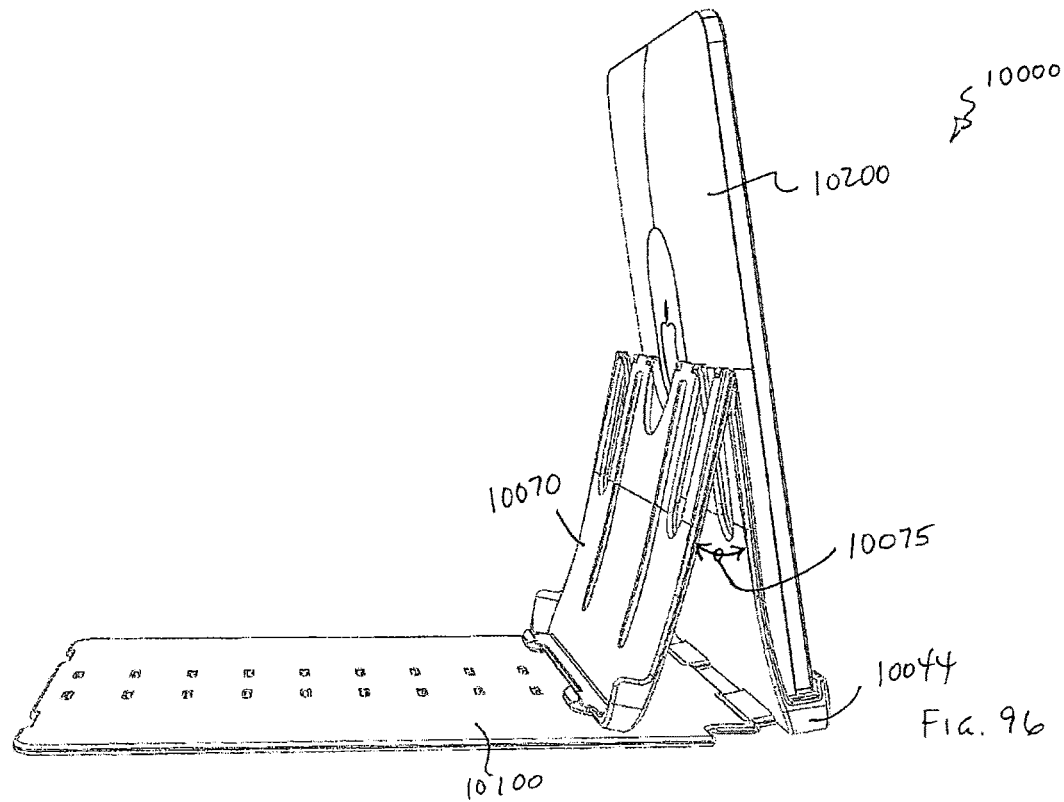
Figure 99:
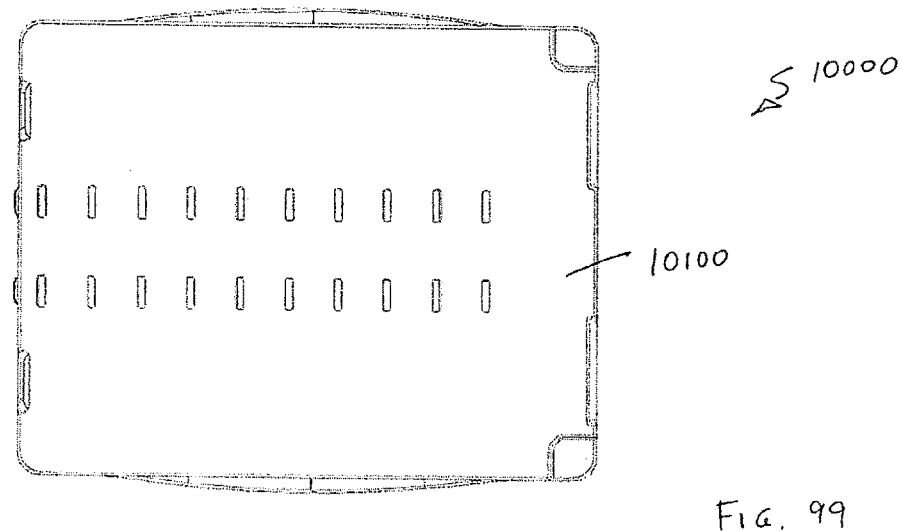

As shown in FIG. 93, the body 10010 has opposite ends 10012 and 10014. In this embodiment, the body 10010 includes two portions 10070 and 10072 that are pivotally coupled to each other as shown in FIGS. 94-96. The body portions 10070 and 10072 are coupled to each other by couplers 10074, such as pins, that define an axis 10076. Thus, body portion 10070 can pivot about axis 10076 along the direction of arrow "BC" and engaged with the cover 10100.

Figure 103:
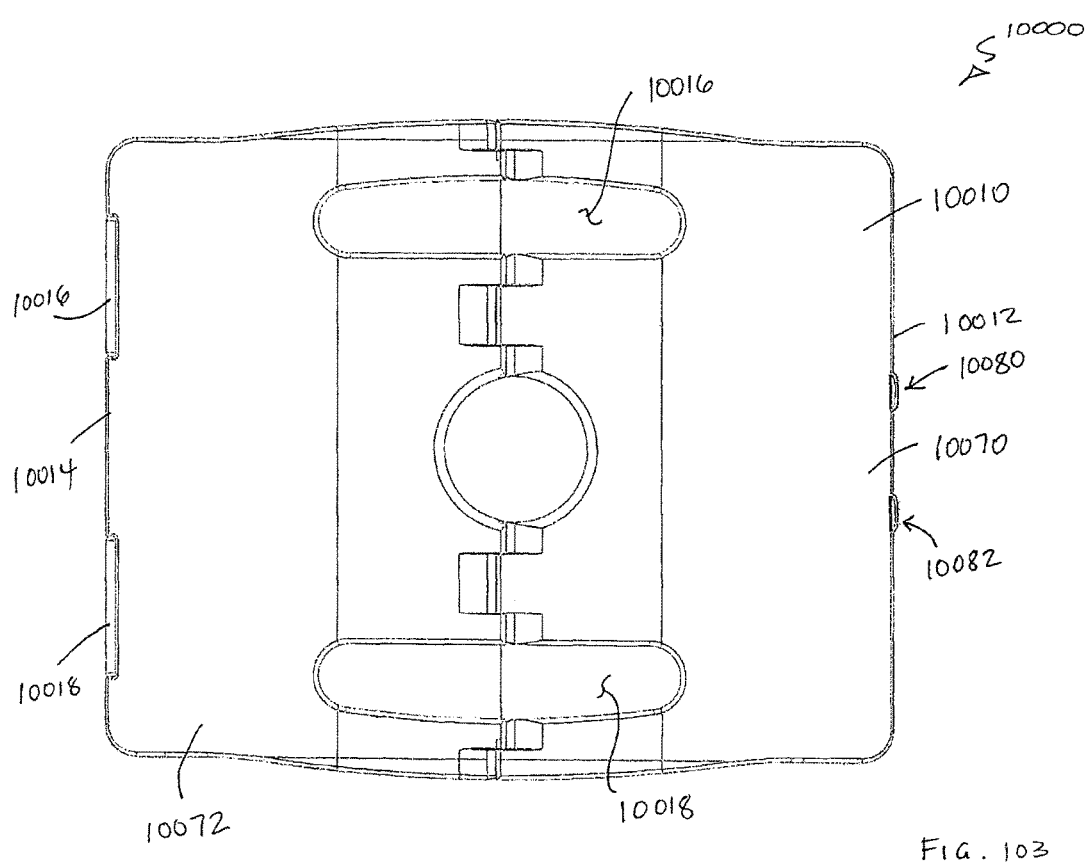

Referring to FIG. 103, a bottom view of the holder 10000 is illustrated. As shown, housing portion 10070 includes projections or engagement members 10080 and 10082 that extend from the housing portion 10070. In one embodiment, the engagement members 10080 and 10082 are integrally formed with the housing portion 10070. The engagement members 10080 and 10082 are sized and configured to engage corresponding ones of the notches 10142 on surface 10140 of cover 10100 to retain housing portion 10070 in a particular position relative to housing portion 10072. As shown in FIGS. 94-96, the angle 10075 between housing portions 10070 and 10072 can vary depending on the particular notches 10142 engaged by members 10080 and 10082. Thus, housing or body portion 10070 engages the cover 10100 in a first location when the cover 10100 is in its closed position and engages the cover 10100 in a second location when the cover 10100 is in its deployed position, the second location being different than the first location. This multiple engagement of housing portion 10070 with covers 10100 facilitates the reconfiguration of the holder 10000.

Figure 97:
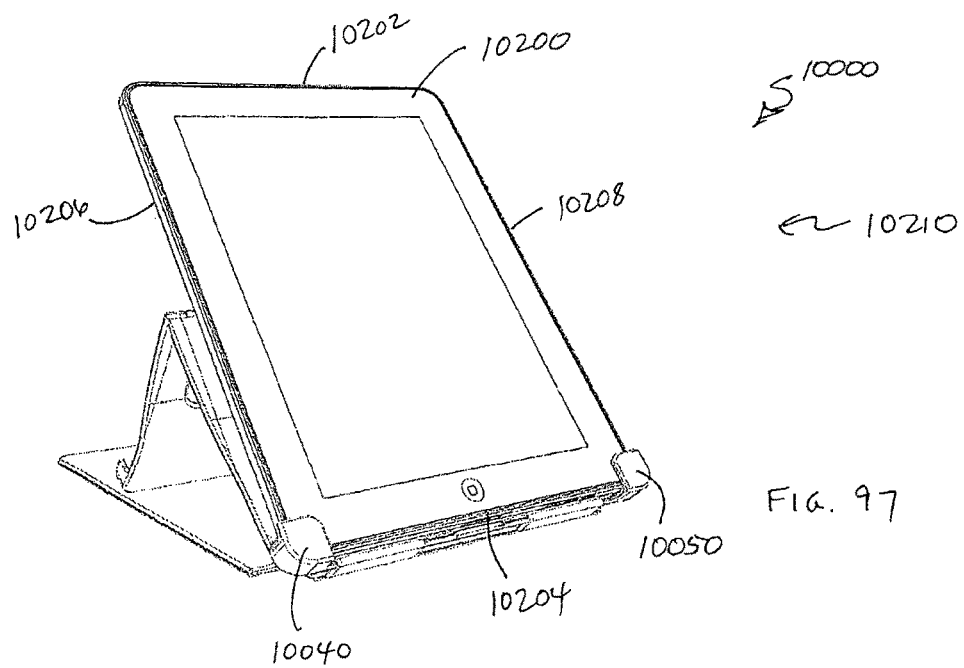
Figure 98:
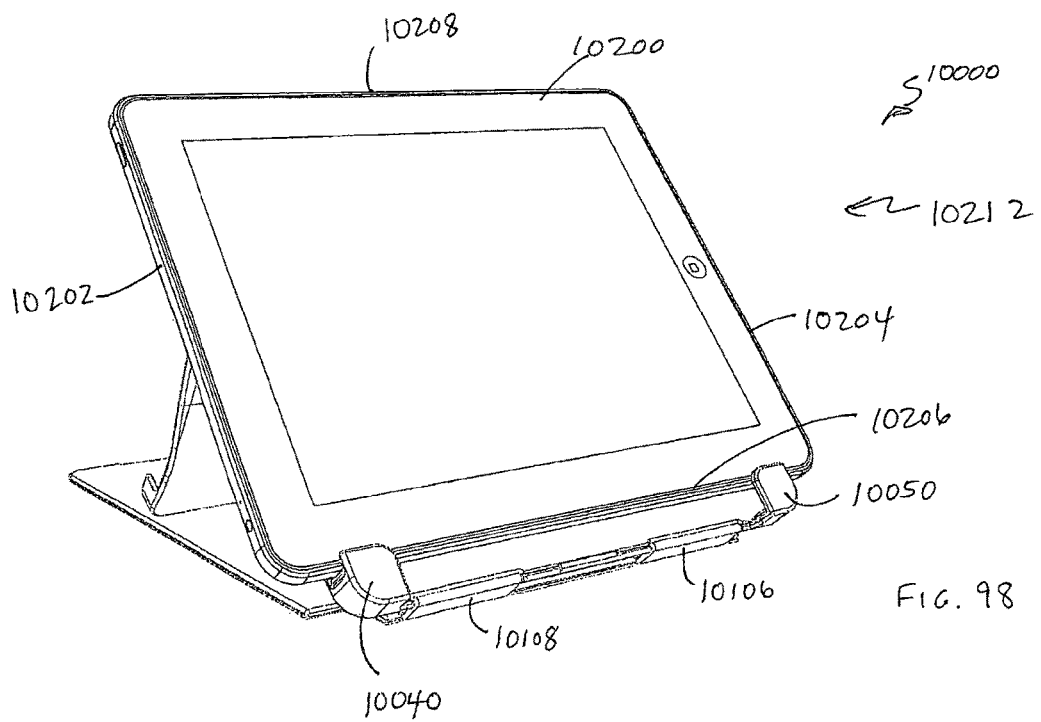
Figure 100:
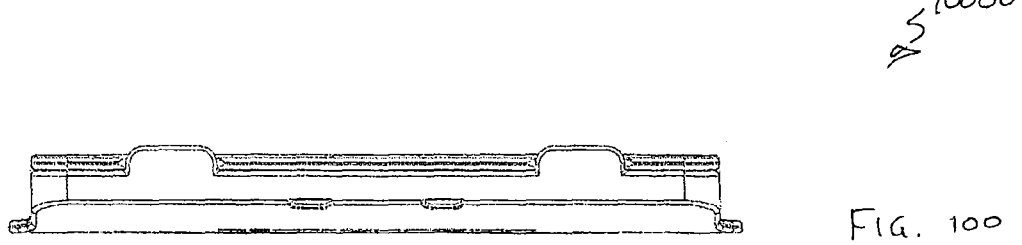
Figure 101:
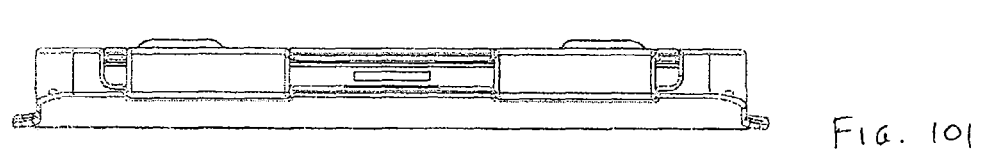
Figure 102:

Referring to FIGS. 97 and 98, the holder 10000 is configured to accommodate and support the electronic device 10200 in a portrait orientation 10210 (see FIG. 97) and in a landscape orientation 10212 (see FIG. 98). The electronic device 10200 has an upper end 10202, a lower end 10204, and opposite sides 10306 and 10208. The body 10010 of the holder 10000 includes coupling portions or members 10040 and 10050 that receive and surround the corners of the electronic device 10200 when the device 10200 is in its portrait configuration. As best illustrated in FIG. 95, coupling member 10040 includes a wall 10042 that defines a notch 10044 that receives the side 10206 of the device 10200 when the device 10200 is placed in its landscape orientation on the holder 10000. Coupling member 10050 has a similar notch formed therein. The ability to support the electronic device 10200 in portrait and landscape orientations facilitates the viewing of the device 10200 at the desired angle with requiring any adjustment of the support or stand. Accordingly, a user can manipulate the stand to a desired support angle and switch back and forth between portrait and landscape viewing of the device 10200, as desired, by sliding the electronic device 10200 into the recesses in the coupling portions 10040 and 10050.

As shown in FIG. 103, the body 10010 also includes openings 10016 and 10018 that are formed therein and that can be used as handles with the portions of the body 10010 that surround the openings 10016 and 10018 that facilitate transportation of and handling of the device.

Figure 104:
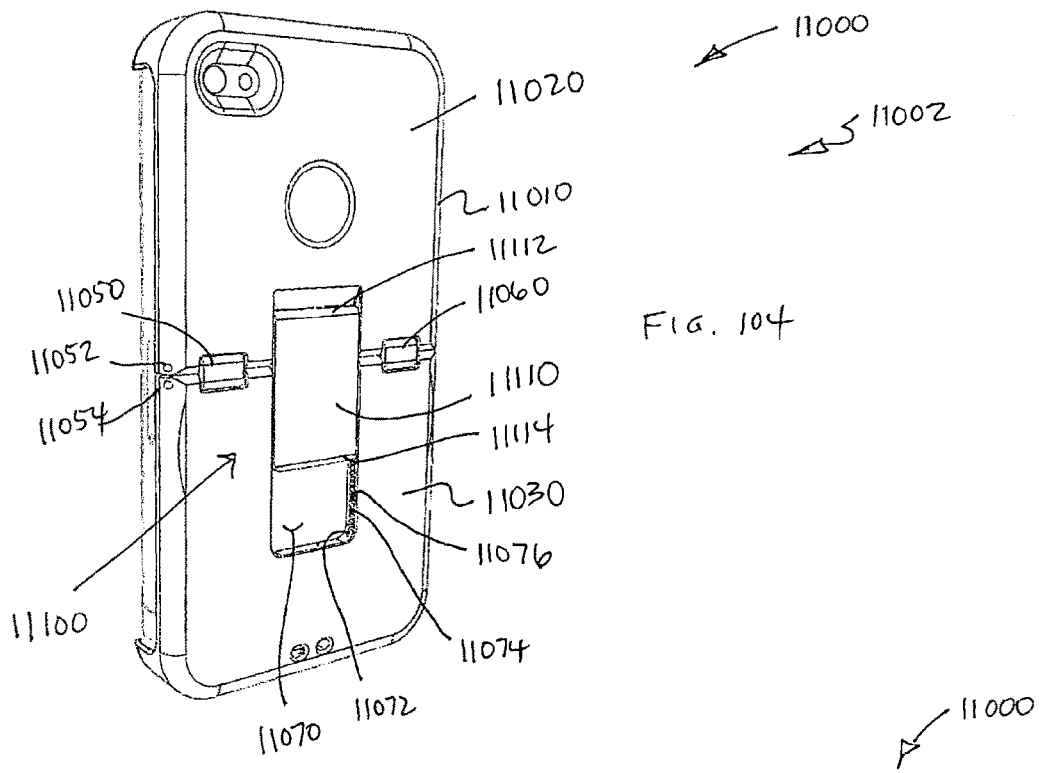
Figure 105:
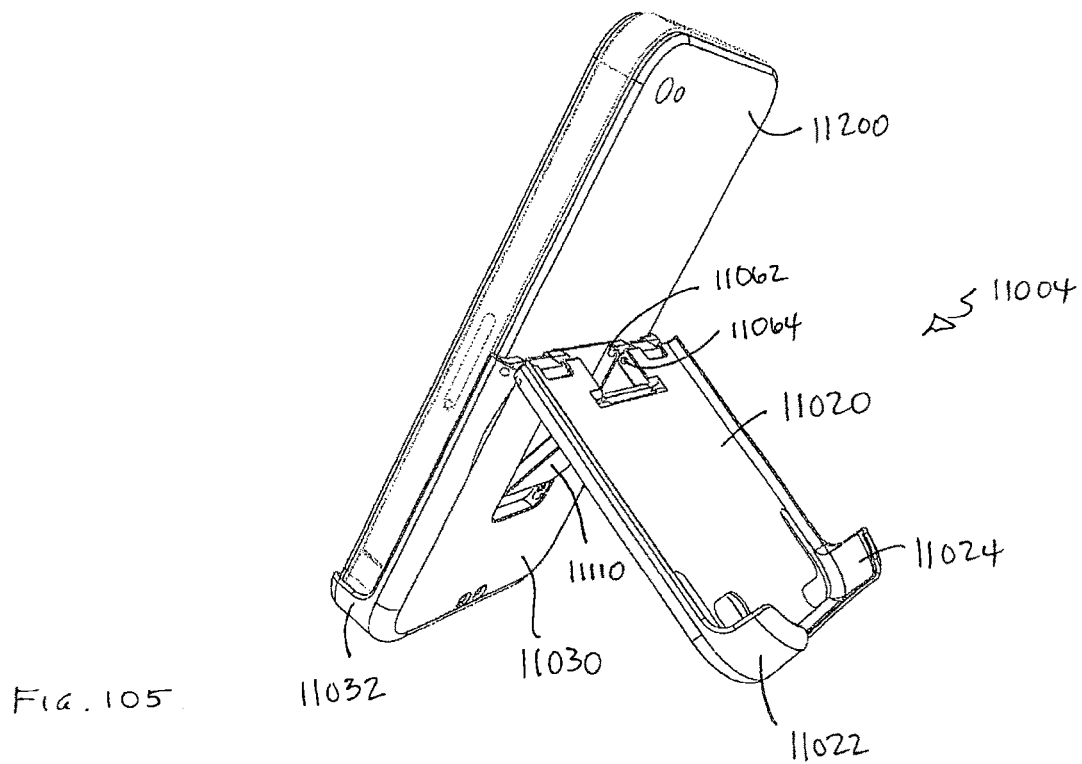

Referring to FIGS. 104 and 105, another embodiment of a holder according to the present invention is illustrated. In this embodiment, the holder 11000 can be disposed or placed in a closed configuration 11002 and in a deployed configuration 11004. Body portions 11020 and 11030 include coupling members (only members 11022, 11024, and 11032 shown in FIG. 105) that engage an electronic device 11200 to couple the device 11200 to the holder 11000. The holder 11000 includes a body 11010 with two body portions 11020 and 11030 that are movably coupled to each other by hinges or links 11050 and 11060. The links 11050 and 11060 allows for a clean rear surface of the body 11010 based on the hinges providing multiple axes of rotation. Several couplers 11052, 11054, 11062, and 11064, such as pins, couple the hinges 11050 and 11060 to the body portions 11020 and 11030.

As shown in FIG. 104, the holder 11000 includes a support 11100 that can be used to retain the body portions 11020 and 11030 in a desired orientation relative to each other. The body 11010 includes an opening 11070 defined by a wall 11072 which includes a slot 11074 formed therein. The slot 11074 includes ridges 11076 that define several positions in which a pin (not shown in FIG. 104) extending from the arm 11110 into the slot 11074 can be placed. Thus, the position of the arm 11110, which is pivotally coupled to body portion 11020 at end 11112 and slidably coupled to body portion 11030 at end 11114, determines the angle between the body portions 11020 and 11030 and the angle at which the electronic device 11200 is viewed.

Figure 106:
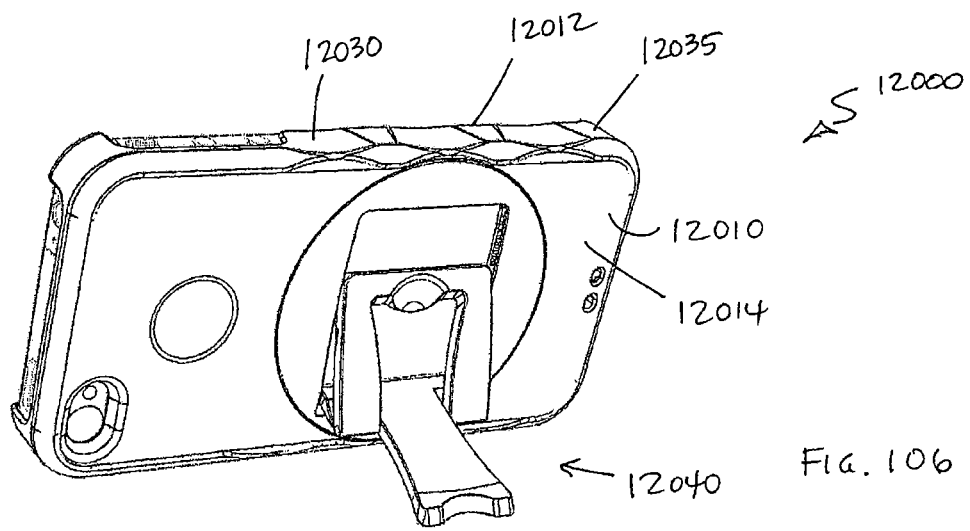
Figure 107:
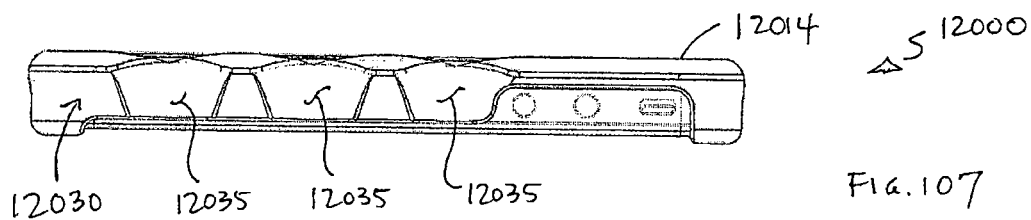

Referring to FIGS. 106 and 107, another embodiment of a holder according to the invention is illustrated. In this embodiment, the holder 12000 includes a body 12010 that has an adjustable support 12040. The body 12010 has sides 12012 and a rear surface 10124. As shown, the body 12010 includes a rubber corner portion 12030 that is co-molded or glued onto the overall plastic body 12010. The rubber corner portion 12030 has dimples 12035 formed therein. The rubber corner portion 12030 provides additional friction and a textured surface to facilitate gripping of the holder 12000 by hand and by a surface. In one embodiment, the rubber 12030 is a rubber edge that runs all of the way around the back edge of the case. In one implementation, the rubber 12030 is approximately ⅛ inch wide and extends around the whole perimeter. The plastic case in that area is slightly thinner than the plastic forming the rear surface of the case. The rubber covers that thinner section of plastic. In one embodiment, the plastic case in that area has little holes extending from an inner surface to an outer surface through which the rubber extends when the rubber is co-molded to the plastic.

Figure 108:
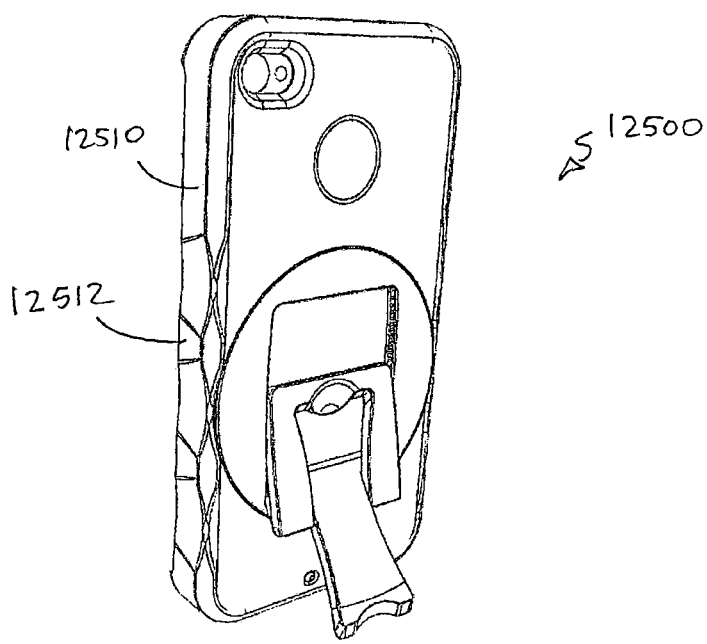

Referring to FIG. 108, another holder 12500 has the same general shape and configuration as holder 12000, but the body 12510 and in particular, the side 12512, does not have any rubber corner portion 12030 formed thereon and/or therein.

Referring to FIGS. 109-112, another embodiment of a holder is illustrated. In this embodiment, the holder 15000 has a body portion 15010 with opposite ends 15012 and 15014 and opposite side walls 15013 and 15015. Proximate to the ends 15012 and 15014 are curved portions 15016 and 15018 that are configured to be snapped over and around an edge of an electronic device 15050. The body 15010 also includes holes 15024 through which audio output from the device 15050 can pass. The body 15010 has an outer surface 15020 and an inner surface 15022. The outer surface 15020 has a tapered rim 15021 that extends slightly outward of the profile of the body 15010. The body 15010 also includes a support portion 15030 that is mounted in the tapered rim 15032. The outer surface of the support portion 15030 extends or is bumped out from the outer surface 15020 by a distance 15031 as shown in FIG. 111. This configuration allows for the body 15020 to be very thin while the rim 15032 facilitates the mounting of the support portion 15030, which has a thickness greater than the body 15020. The support portion 15030 includes a base 15034 that is rotatably mounted in the circular opening defined by rim 15032 and a coupling member 15036 with arm 15038. In this embodiment, the width of the body 15010 between side walls 15013 and 15015 is narrower than the width of the device 15050. This reduces the amount of material used in the holder 15000 while providing sufficient support for support portion 15030.

Referring to FIG. 113, in this embodiment, the holder 15100 includes a body 15110 that covers the full rear surface of the electronic device 15050. As shown, holder 15100 includes a support portion that is bumped out or extends beyond the outer surface of the body 15110.

Figure 114:
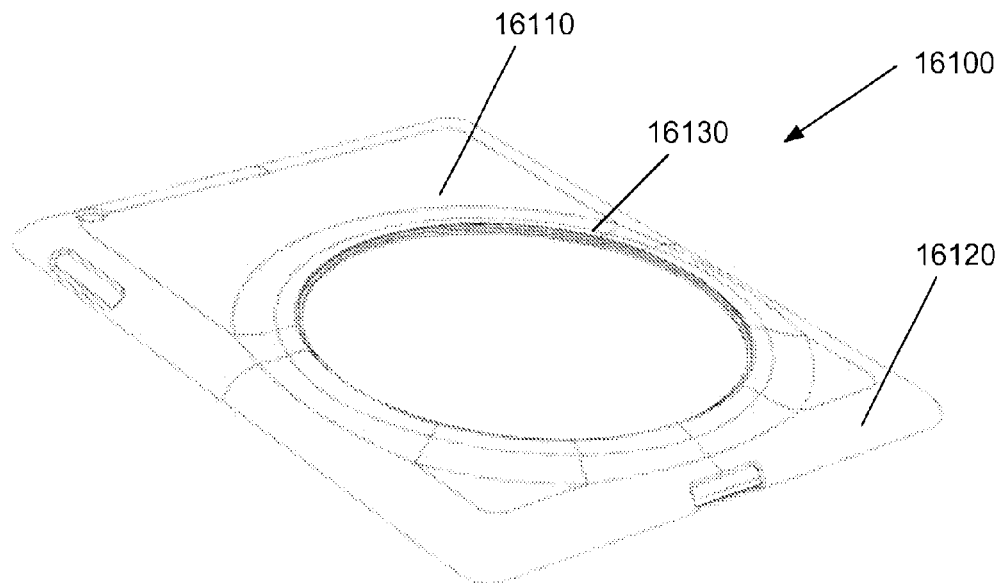

Referring to FIGS. 114-117, an alternative embodiment of a holder according to the present invention is illustrated. As shown in FIG. 114, the holder 16100 includes a body portion 16110, an outer portion 16120, and a mounting portion 16130. In this embodiment, the body portion 16110 is made of a flexible material, such as TPU, rubber, a fabric, or other similar material. The body portion 16110 is pliable and functions in an ornamental manner and provides protection to the electronic device to which holder 16100 is coupled. The outer portion 16120 is made of a material that permits the outer portion 16120 to be placed around the edge of an electronic device (not shown) to couple the holder 16100 to the device. In one implementation, the material of the outer portion 16120 is a molded TPU material.

The mounting portion 16130 is made of a molded material that is coupled to the body portion 16110 by co-molding, welding, an adhesive, or other coupling technique. The mounting portion 16130 is made of a semi-rigid or rigid material that has sufficient rigidity for a support to be rotatably coupled thereto. The support (not shown) is coupled to and rotatable relative to the mounting portion 16130 in a manner similar to those described herein for other embodiments.

Figure 115:
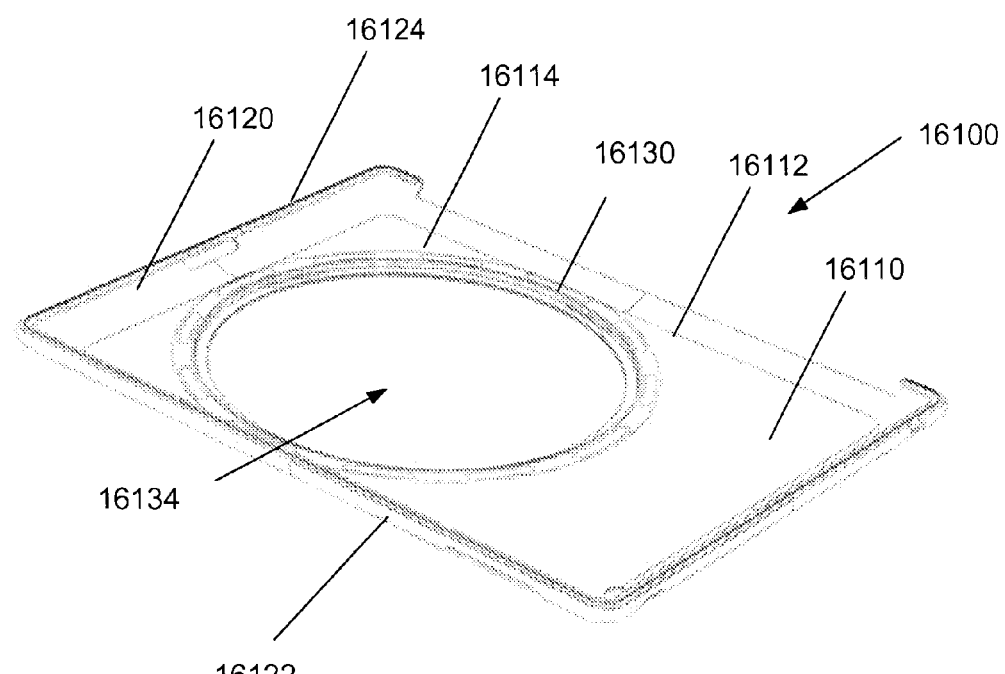

Referring to FIG. 115, a perspective view of the side of the holder 16100 to which an electronic device is coupleable is illustrated. As shown, the body portion 16110 has an outer edge 16112 that defines a perimeter of the body portion 16110 to which the outer portion 16120 is coupled. The outer portion 16120 extends around the perimeter of the body portion 16110. In addition, the outer portion 16120 defines its own outer perimeter 16122 with a lip 16124 that is configured to wrap around an end or edge of an electronic device.

Figure 116:
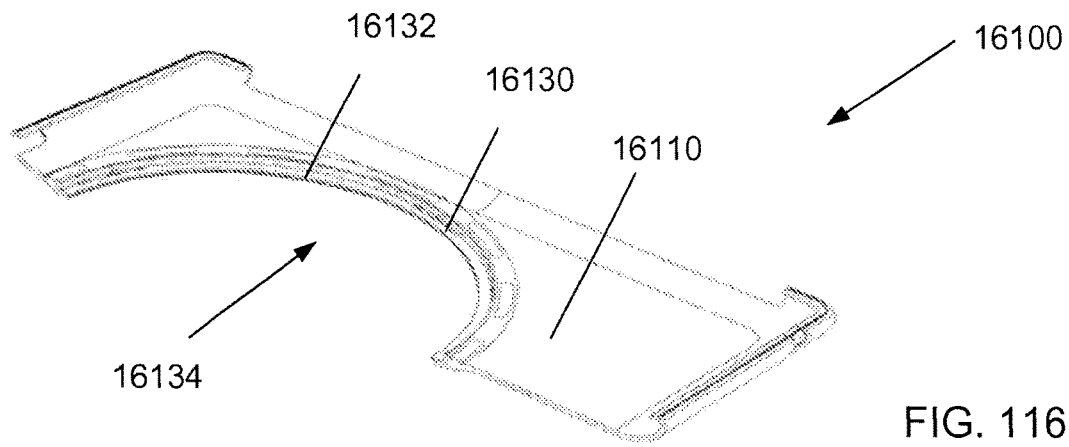
Figure 117:
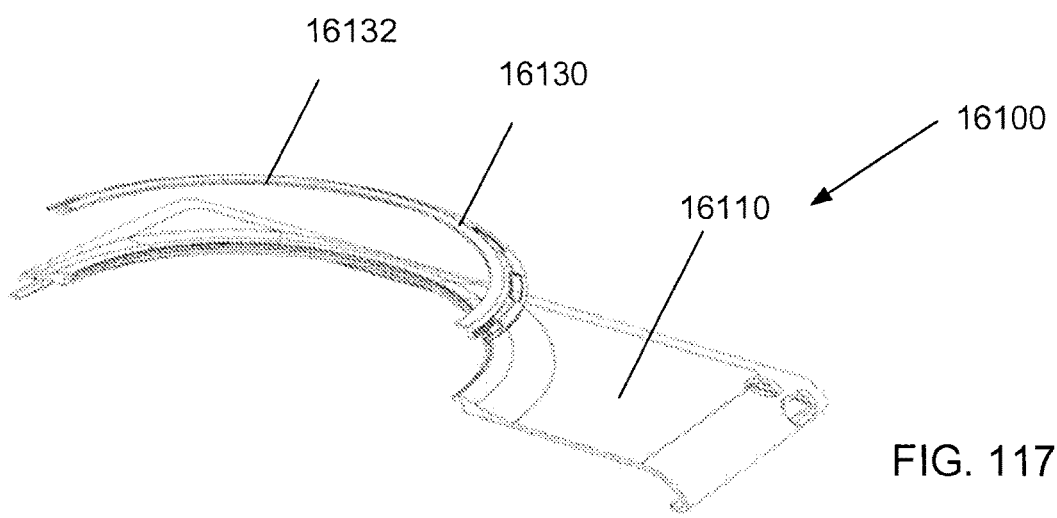

The body portion 16110 also has an inner edge 16114 that defines an opening into which the mounting portion 16130 is inserted and coupled. Referring also to FIGS. 116 and 117, the mounting portion 16130 has an edge 16132 that defines an opening 16134 into which a support (not shown) is inserted. The mounting portion 16130 provides a resilient structure relative to which the support can be rotated and positioned.

Thus, it is intended that the present invention cover the modifications and variations of this invention. For example, it is to be understood that terms such as "left," "right," "top," "bottom," "front," "rear," "side," "height," "length," "width," "upper," "lower," "interior," "exterior," "inner," "outer," and the like as may be used herein, merely describe points of reference and do not limit the present invention to any particular orientation or configuration. Further, terms such as "first," "second," "third," etc., merely identify one of a number of portions, components and/or points of reference as disclosed herein, and likewise do not limit the present invention to any particular configuration or orientation.

While the invention has been described in detail and with references to specific embodiments thereof, it will be apparent to one skilled in the art that various changes and modifications can be made therein without departing from the spirit and scope thereof. Thus, it is intended that the present invention covers the modifications and variations of this invention.

What is claimed is:

1. A support mechanism comprising:
   a body; and
   a support rotatably coupled to the body such that the orientation of the support relative to the body can change to support the body in different orientations relative to a support surface, the support being movable between a retracted position and at least two extended positions relative to the body, the support being engageable with the support surface when the support is in any of its extended positions,
   wherein the support includes a base, a coupler, and an arm directly pivotally coupled to the base about a first axis and to the coupler about at least a second axis, the first axis being different from the second axis, the first axis and the second axis being parallel to each other, and the arm being engageable with the support surface.

2. The support mechanism of claim 1, wherein a force applied to the arm by the support surface is directed so as to cause the arm to move from an extended position in which the arm is set toward its retracted position.

3. The support mechanism of claim 1, wherein the arm includes an engagement surface that engages the support surface, the arm is directly pivotally coupled to the base at a first location and coupled to the coupler at a second location, and the second location is between the engagement surface and the first location.

4. The support mechanism of claim 3, wherein a distance between the second location and the first location is substantially less than a distance between the engagement surface and the first location.

5. The support mechanism of claim 1, wherein the coupler is slidably coupled to the base.

6. The support mechanism of claim 1, wherein the support is rotatable relative to the body when the support is in its retracted position and the at least two extended positions.

7. The support mechanism of claim 1, wherein the support is flush with the body when the support is in its retracted position.

8. The support mechanism of claim 1, wherein the arm is flush with the base when the arm is in its retracted position.

9. The support mechanism of claim 1, wherein the support is engageable with the support surface to support the body in at least two desired angles relative to the support surface.

10. The support mechanism of claim 1, wherein the coupler is slidably coupled to the body.

11. The support mechanism of claim 1, wherein the body is configured to provide protection for a portable device.

12. The support mechanism of claim 1, wherein the body is configured to be removably coupled to a portable device.

13. The support mechanism of claim 1, wherein no portion of the support extends from the body when the support is in its fully retracted position.

14. The support mechanism of claim 1, wherein the arm is flat and without any openings.

15. The support mechanism of claim 1,
    wherein a first end portion of the arm is directly pivotally coupled to the base about the first axis, a second end of the arm is free and rotatable between the retracted position and a fully extended position, and
    wherein in the fully extended position the second end of the arm is outside a circular outer perimeter of the base in a rear plan view of the support mechanism.

16. The support mechanism of claim 15, wherein the second end of the arm is inside the circular outer perimeter of the base in the rear plan view of the support mechanism when the arm is in the retracted position.

17. A support comprising:
    a body; and
    means for supporting the body, said means for supporting the body being rotatably coupled to the body such that the orientation of said means for supporting the body relative to the body can change to support the body in different orientations relative to a support surface, said means for supporting the body being movable between a retracted position and at least two extended positions relative to the body, said means for supporting the body being engageable with the support surface when said means for supporting the body is in any of its extended positions,
    wherein said means for supporting the body includes a base, a coupler, and a leg directly pivotally coupled to the base about a first axis and directly coupled to the coupler about at least a second axis, the first axis being different from the second axis, the first axis and the second axis being parallel to each other, and the leg being engageable with the support surface,
    wherein the leg has a first side that is directly pivotally coupled to the base about the first axis, and the leg has a second side, distal the first side, that is engageable with the support surface to support the body,
    wherein the different orientations include landscape view and portrait view,
    wherein the base has an inner surface, an outer surface, and an opening extending from the inner surface to the outer surface, a portion of the leg being disposed in the opening when in the retracted position.

18. The support of claim 17, wherein the coupler is slidably coupled to the base.

19. The support of claim 17, wherein the coupler is slidably coupled to the body.

20. The support of claim 17, wherein a first of the at least two extended positions forms an acute angle between the body and the leg, and a second of the at least two extended positions forms an obtuse angle between the body and the leg.

21. The support mechanism of claim 1, wherein the body includes:
   a first curved end, and
   a second curved end opposite the first curved end,
   wherein the first and second curved ends are configured to snap over and around first and second edges, respectively, of an electronic device.

22. The support mechanism of claim 21, wherein the first and second curved ends are configured to snap over and around the first and second edges, respectively, of the electronic device so as to be in direct contact with the electronic device.

23. The support mechanism of claim 21, wherein the electronic device has a non-square rectangular shape in a plan view, the first edge defining a first short side of the rectangular device in the plan view and the second edge defining a second short side of the electronic device opposite the first short side, the first curved end being configured to snap over and around the first edge defining the first short side, and the second curved end being configured to snap over and around the second edge defining the second short side.

24. The support mechanism of claim 1, wherein the body includes:
   a first curved end,
   a second curved end opposite the first curved end,
   a first side, and
   a second side opposite the first side,
   wherein, in a plan view, a maximum width of the body at the first curved end and a maximum width of the body at the second curved end are less than a maximum width of the body from the first side to the second side at points of the body adjacent the support.

25. The support mechanism of claim 1, wherein the body includes:
   a first curved end,
   a second curved end opposite the first curved end,
   a first side, and
   a second side opposite the first side,
   wherein the support mechanism is configured to be removably coupled to an electronic device such that the first and second curved ends are removably coupled to respective opposite first and second side edges of the electronic device and such that the first and second sides do not contact respective opposite third and fourth side edges of the electronic device.

* * * * *